US010665140B1

(12) United States Patent
Ahn et al.

(10) Patent No.: US 10,665,140 B1
(45) Date of Patent: May 26, 2020

(54) VARIOUS INTERIOR AND EXTERIOR FEATURES FOR AUTONOMOUS VEHICLES

(71) Applicant: Waymo LLC, Mountain View, CA (US)

(72) Inventors: YooJung Ahn, Mountain View, CA (US); Jared S. Gross, Belmont, CA (US); Xintao Chen, Shanghai (CN)

(73) Assignee: Waymo LLC, Mountain View, CA (US)

( * ) Notice: Subject to any disclaimer, the term of this patent is extended or adjusted under 35 U.S.C. 154(b) by 250 days.

(21) Appl. No.: 15/628,789

(22) Filed: Jun. 21, 2017

Related U.S. Application Data

(60) Provisional application No. 62/353,329, filed on Jun. 22, 2016.

(51) Int. Cl.
| | | |
|---|---|---|
| *G09F 21/04* | (2006.01) | |
| *B60K 35/00* | (2006.01) | |
| *G08G 1/00* | (2006.01) | |
| *B60Q 1/50* | (2006.01) | |
| *B60L 58/12* | (2019.01) | |
| *H02J 7/00* | (2006.01) | |
| *G01R 31/371* | (2019.01) | |
| *B60L 15/40* | (2006.01) | |

(52) U.S. Cl.
CPC ............ *G09F 21/04* (2013.01); *B60K 35/00* (2013.01); *B60L 15/40* (2013.01); *B60L 58/12* (2019.02); *B60L 2250/16* (2013.01); *B60Q 1/50* (2013.01); *G01R 31/371* (2019.01); *G08G 1/202* (2013.01); *H02J 7/0047* (2013.01)

(58) Field of Classification Search
CPC ...... B60L 15/40; B60L 58/12; B60L 2250/16; B60Q 1/50; G01R 31/371; H02J 7/0047; G09F 21/04; G08G 1/202; B60K 35/00
See application file for complete search history.

(56) References Cited

U.S. PATENT DOCUMENTS

| | | | | |
|---|---|---|---|---|
| 6,711,856 | B1 * | 3/2004 | Hoffman | E05F 1/105 |
| | | | | 296/207 |
| 8,801,245 | B2 * | 8/2014 | De Wind | B60Q 1/2619 |
| | | | | 362/511 |
| 9,196,164 | B1 * | 11/2015 | Urmson | G08G 1/166 |
| 9,429,947 | B1 * | 8/2016 | Wengreen | B60W 30/06 |
| 9,487,140 | B2 * | 11/2016 | Linden | E05B 81/72 |
| 9,494,938 | B1 * | 11/2016 | Kemler | G05D 1/0088 |
| 9,499,127 | B2 * | 11/2016 | Pribisic | B60R 25/2045 |

(Continued)

FOREIGN PATENT DOCUMENTS

DE 102010017759 A1 * 1/2012 ............. B60L 15/40

OTHER PUBLICATIONS

Yanfeng Automotive Interiors, http://www.yfai.com/yanfeng-automotive-interiors-reveals-xim-autonomous-vehicle-interior-2017-north-american (2017).

(Continued)

*Primary Examiner* — Jonathan M Dunlap

(74) *Attorney, Agent, or Firm* — Botos Churchill IP Law

(57) ABSTRACT

Because of the nature of autonomous vehicles, and in particular that they do not require manual inputs from a driver or passenger to control braking and steering, autonomous vehicle can include features that may not necessarily be useful or practical in a typical non-autonomous (or semi-autonomous vehicle) that would require such manual input.

19 Claims, 48 Drawing Sheets

(56) References Cited

U.S. PATENT DOCUMENTS

| | | | | |
|---|---|---|---|---|
| 9,802,656 | B1* | 10/2017 | Williams | G01S 13/89 |
| 9,804,599 | B2* | 10/2017 | Kentley-Klay | B60Q 1/26 |
| 9,855,890 | B2* | 1/2018 | James | B60Q 1/503 |
| 9,902,311 | B2* | 2/2018 | Sweeney | B60Q 1/2611 |
| 9,969,326 | B2* | 5/2018 | Ross | B60Q 1/50 |
| 10,077,576 | B1* | 9/2018 | Salter | E05B 17/10 |
| 10,087,671 | B2* | 10/2018 | Linden | E05F 15/616 |
| 10,272,827 | B1* | 4/2019 | Kemler | G05D 1/0088 |
| 10,311,770 | B2* | 6/2019 | Ishizuka | B60Q 1/24 |
| 10,329,118 | B2* | 6/2019 | Pasini | B66B 3/006 |
| 10,384,597 | B1* | 8/2019 | Kemler | G01C 21/3438 |
| 10,392,011 | B2* | 8/2019 | Nagraj Rao | B60W 50/14 |
| 2004/0055221 | A1* | 3/2004 | Hoffman | E05F 1/105 |
| | | | | 49/386 |
| 2009/0149894 | A1* | 6/2009 | Merry | A61N 1/39 |
| | | | | 607/2 |
| 2010/0253516 | A1* | 10/2010 | Lemerand | E05F 15/70 |
| | | | | 340/545.1 |
| 2014/0000165 | A1* | 1/2014 | Patel | E05B 81/76 |
| | | | | 49/31 |
| 2015/0032328 | A1* | 1/2015 | Healey | B60Q 1/503 |
| | | | | 701/36 |
| 2015/0258928 | A1* | 9/2015 | Goto | B60Q 1/085 |
| | | | | 701/49 |
| 2016/0167648 | A1* | 6/2016 | James | B60Q 1/503 |
| | | | | 701/28 |
| 2017/0058588 | A1* | 3/2017 | Wheeler | B60R 16/037 |
| 2017/0072903 | A1* | 3/2017 | Farshchi | B60R 22/48 |
| 2017/0192428 | A1* | 7/2017 | Vogt | G05D 1/0038 |
| 2017/0213165 | A1* | 7/2017 | Stauffer | G06Q 10/02 |
| 2017/0240096 | A1* | 8/2017 | Ross | B60Q 1/50 |
| 2017/0240098 | A1* | 8/2017 | Sweeney | B60Q 1/2611 |
| 2017/0267487 | A1* | 9/2017 | Pasini | B66B 3/006 |
| 2017/0329438 | A1* | 11/2017 | Kobel | B60J 5/0497 |
| 2017/0369106 | A1* | 12/2017 | Williams | B62D 35/00 |
| 2018/0038147 | A1* | 2/2018 | Linden | E05F 15/616 |
| 2018/0073287 | A1* | 3/2018 | Reddmann | E05F 15/627 |
| 2018/0290627 | A1* | 10/2018 | Hariri | B60R 25/245 |
| 2019/0078359 | A1* | 3/2019 | Zhang | E05B 81/77 |
| 2019/0080637 | A1* | 3/2019 | Kanaguchi | G09F 21/048 |
| 2019/0090472 | A1* | 3/2019 | Crinklaw | A01B 69/008 |
| 2019/0171207 | A1* | 6/2019 | Hanson | G05D 1/0274 |
| 2019/0172170 | A1* | 6/2019 | Jabour | G06Q 50/30 |
| 2019/0248623 | A1* | 8/2019 | Yoshizawa | B66B 1/28 |

OTHER PUBLICATIONS

Rinspeed Budii 2015 Self-Driving SUV Concept Car, https://www.youtube.com/watch?v=Bii-17BQPkA (2015).

Rinspeed, "Rinspeed Budii Galery", 3 pgs. (2015).

Autoblog, "Rinspeed Budii Concept Is a Rolling Smorgasbord of Future Tech", http://www.autoblog.com/2015/03/04/rinspeed-budii-concept-geneva-2015/ , 7 pgs. (2015).

Kiekert Ag, "Kiekert Offers a Glimpse of the Future at the 2015 Geneva Motor Show: New Door Opening Concept Based on the E-Latch in the "Budii" by Rinspeed", 4 pgs. (2015).

\* cited by examiner

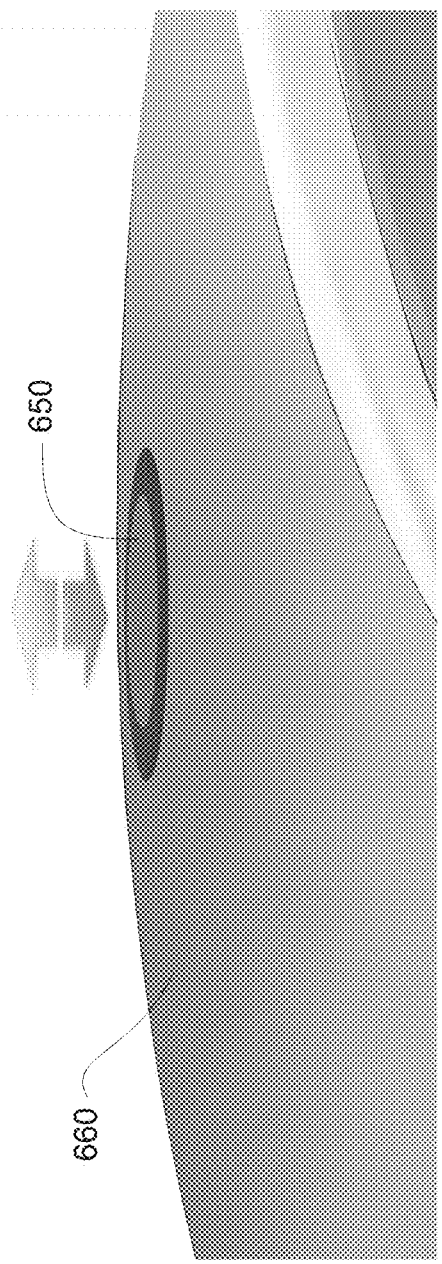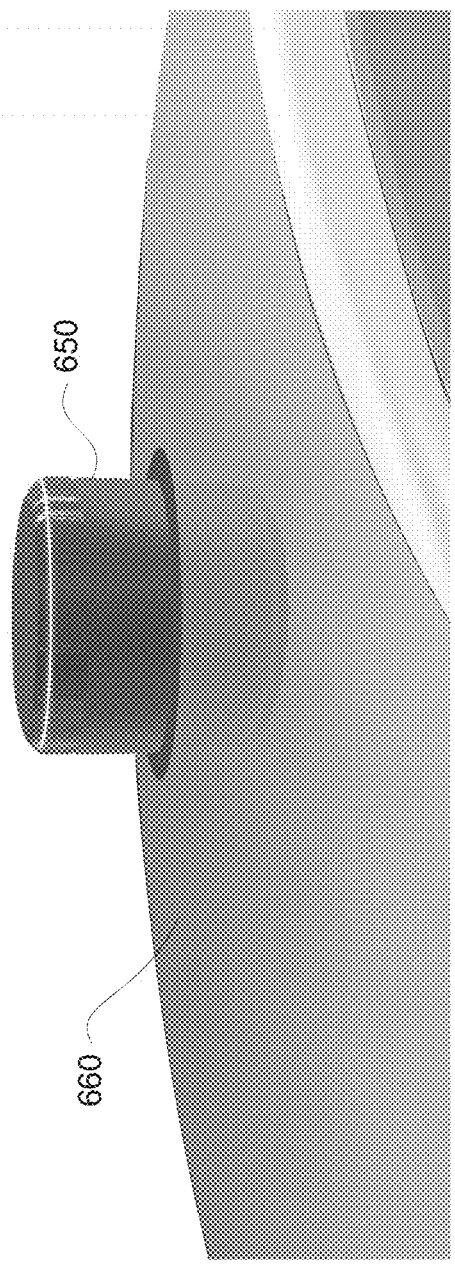
FIGURE 6B
FIGURE 6C

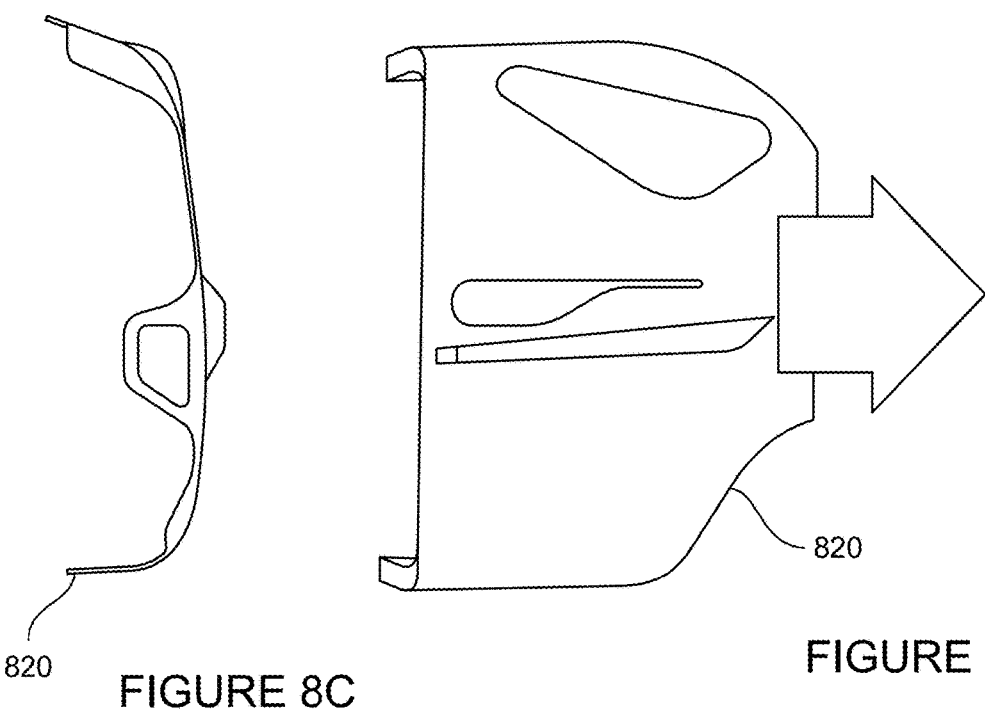
FIGURE 8C
FIGURE 8D
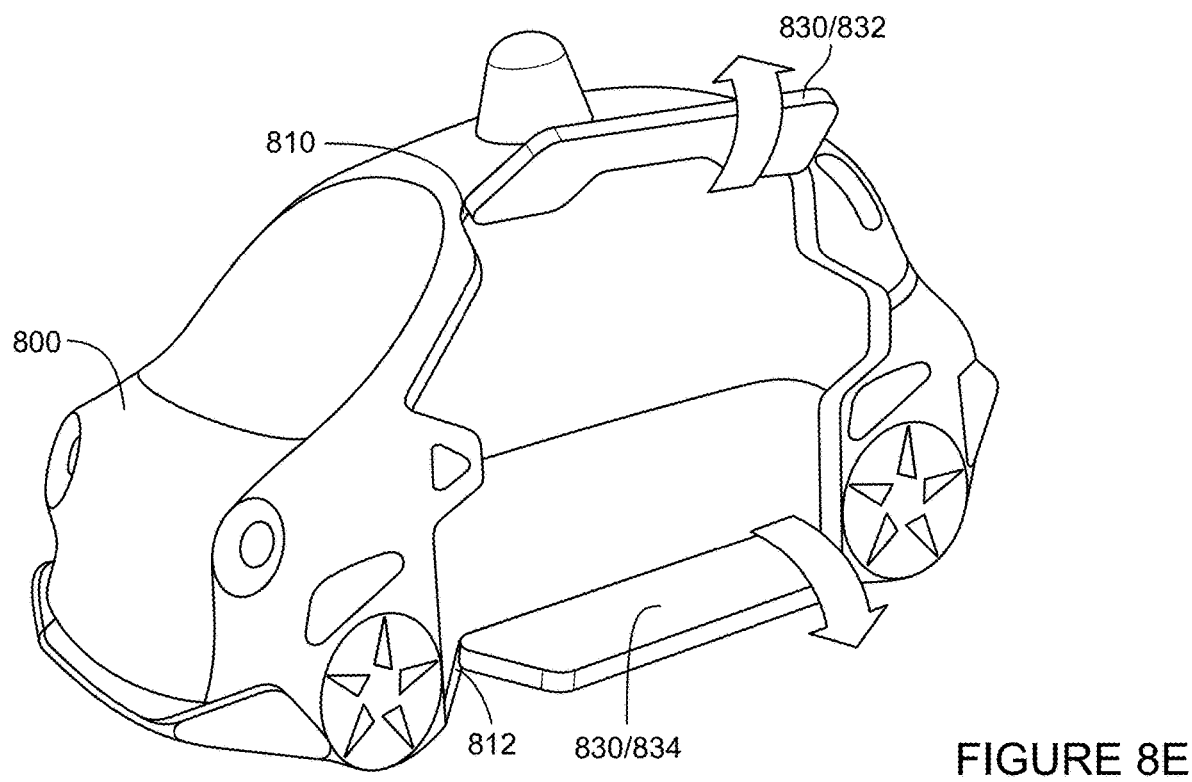
FIGURE 8E

900

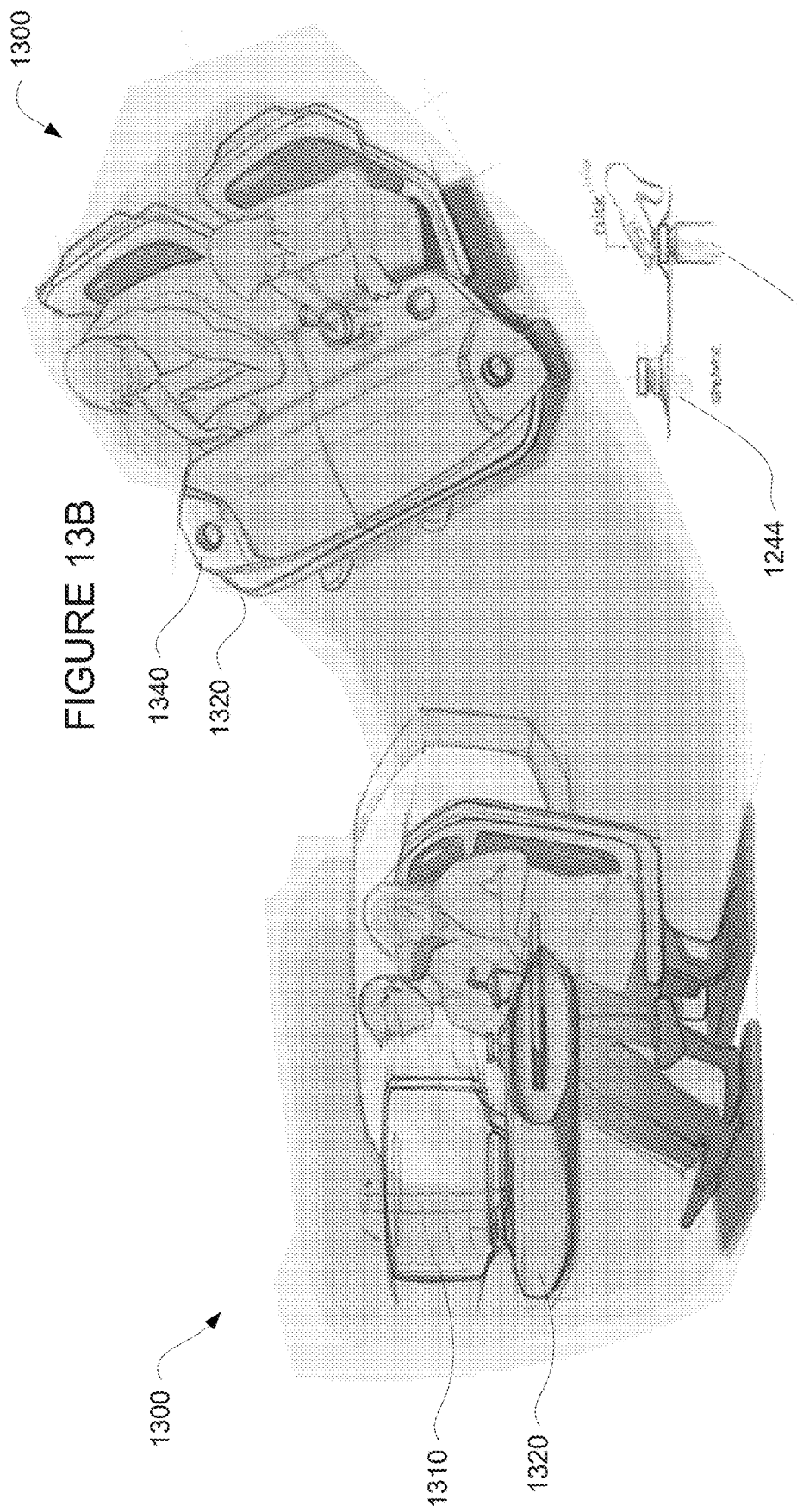

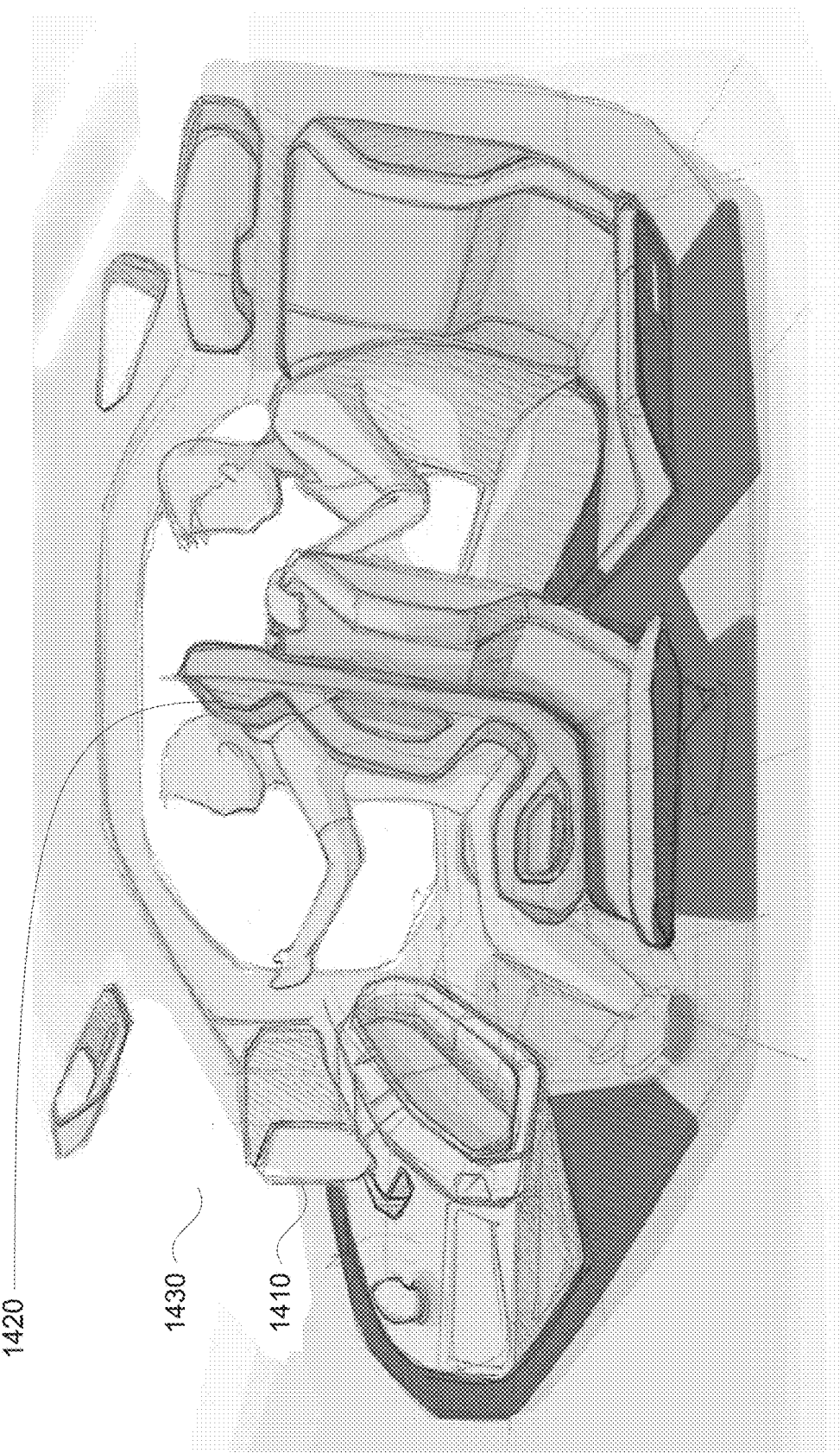

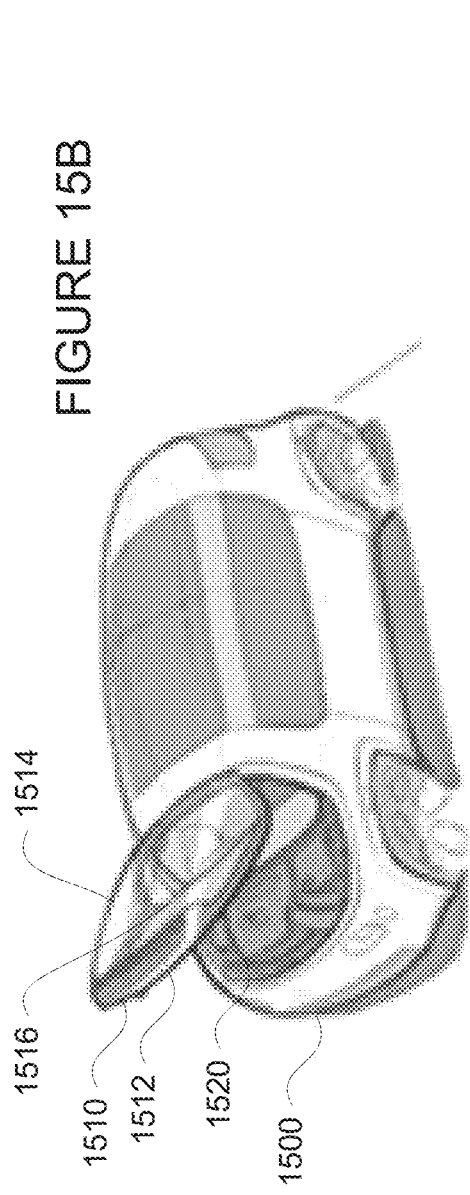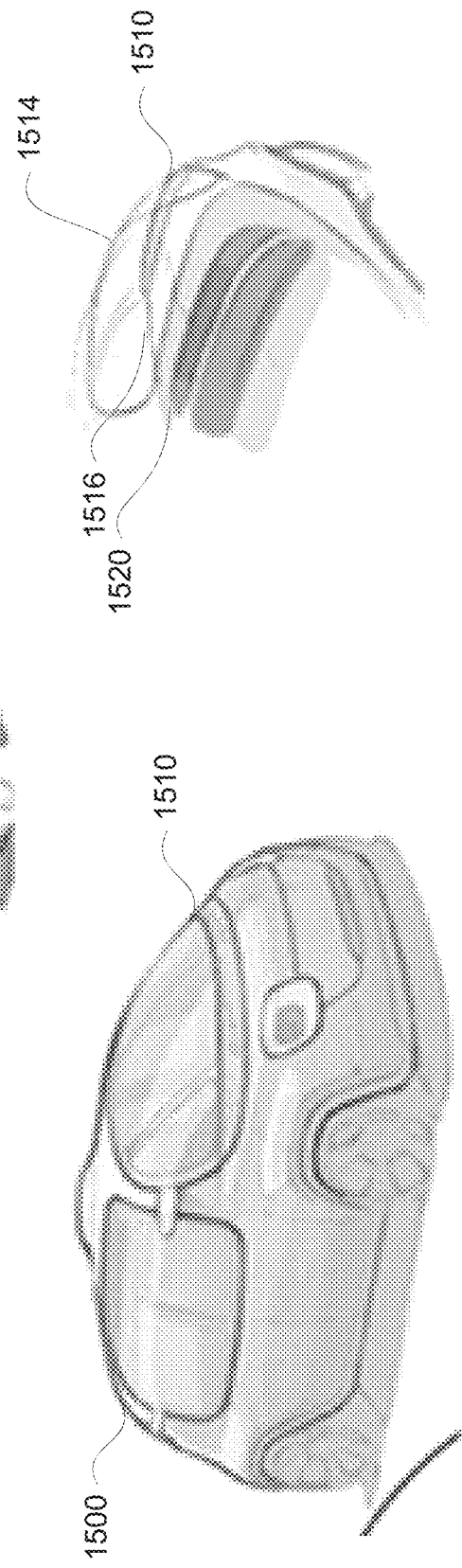
FIGURE 15A
FIGURE 15B
FIGURE 15C

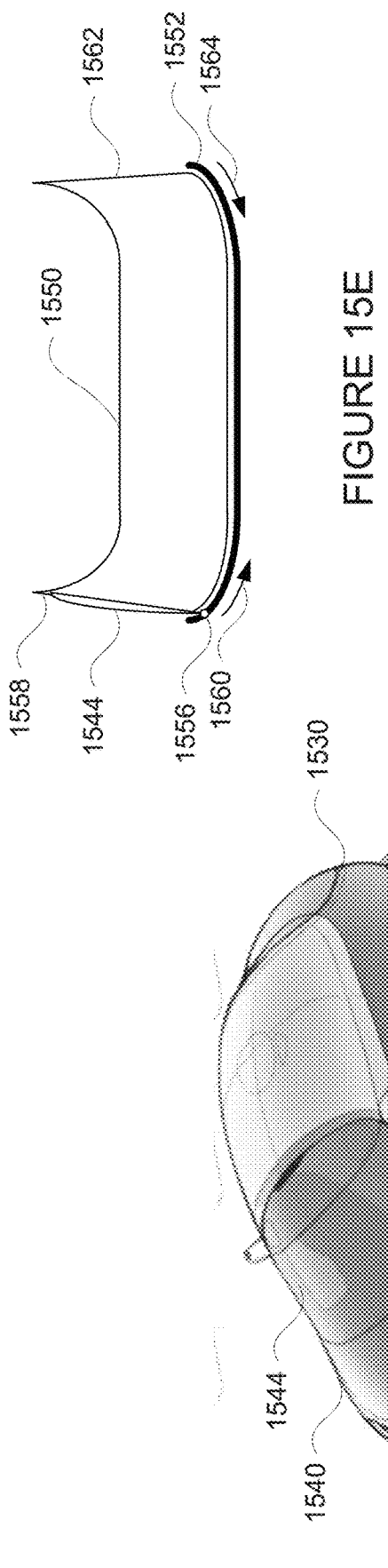
FIGURE 15E
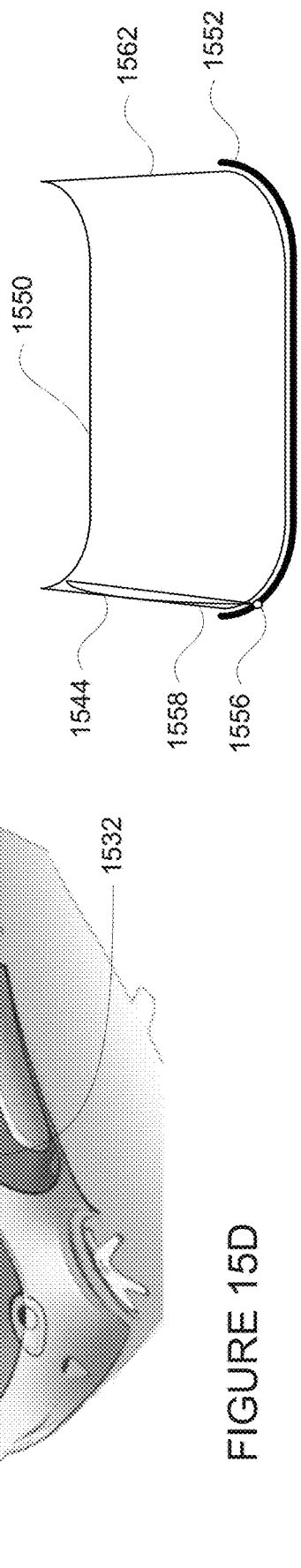
FIGURE 15F
FIGURE 15D

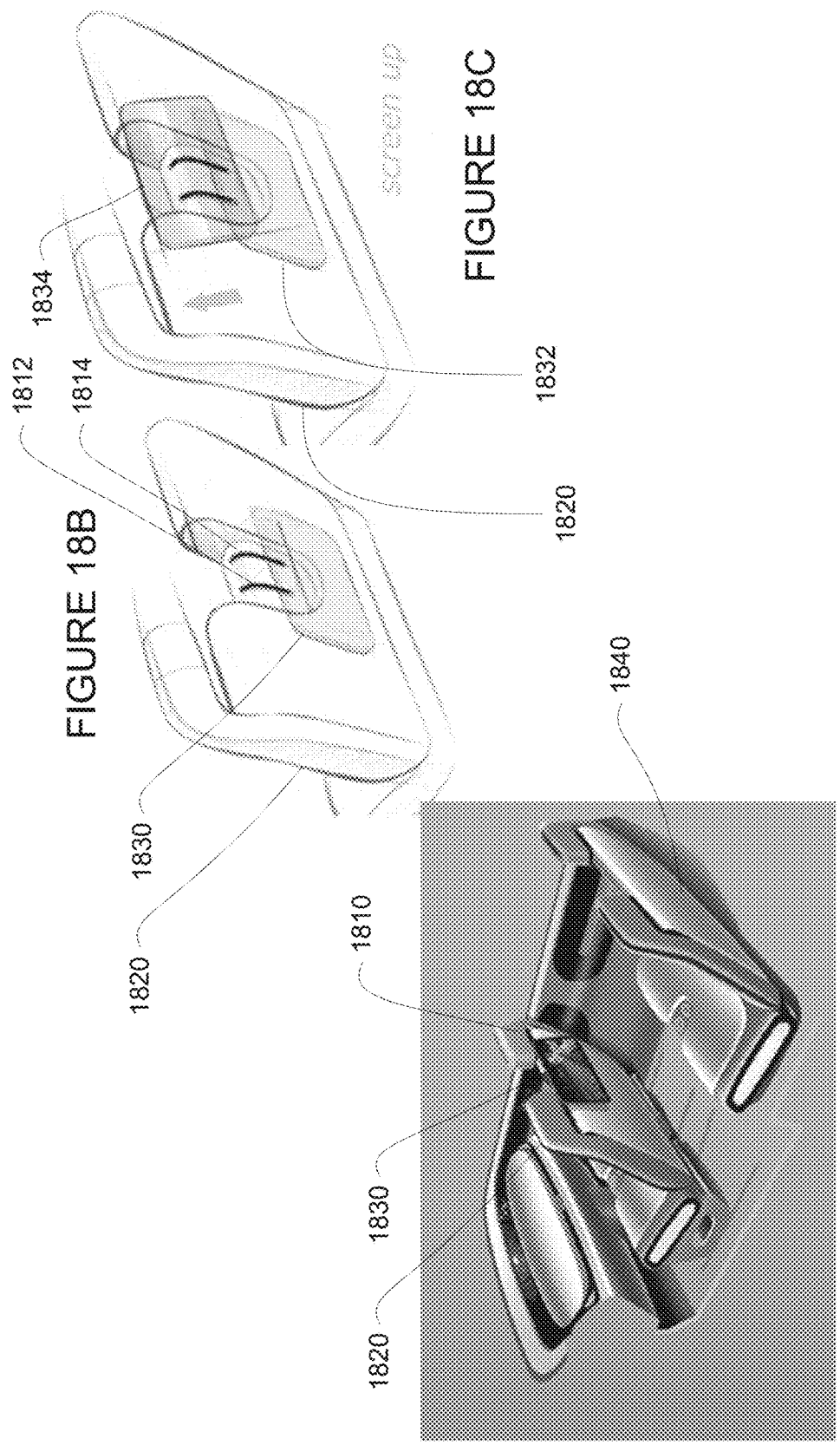

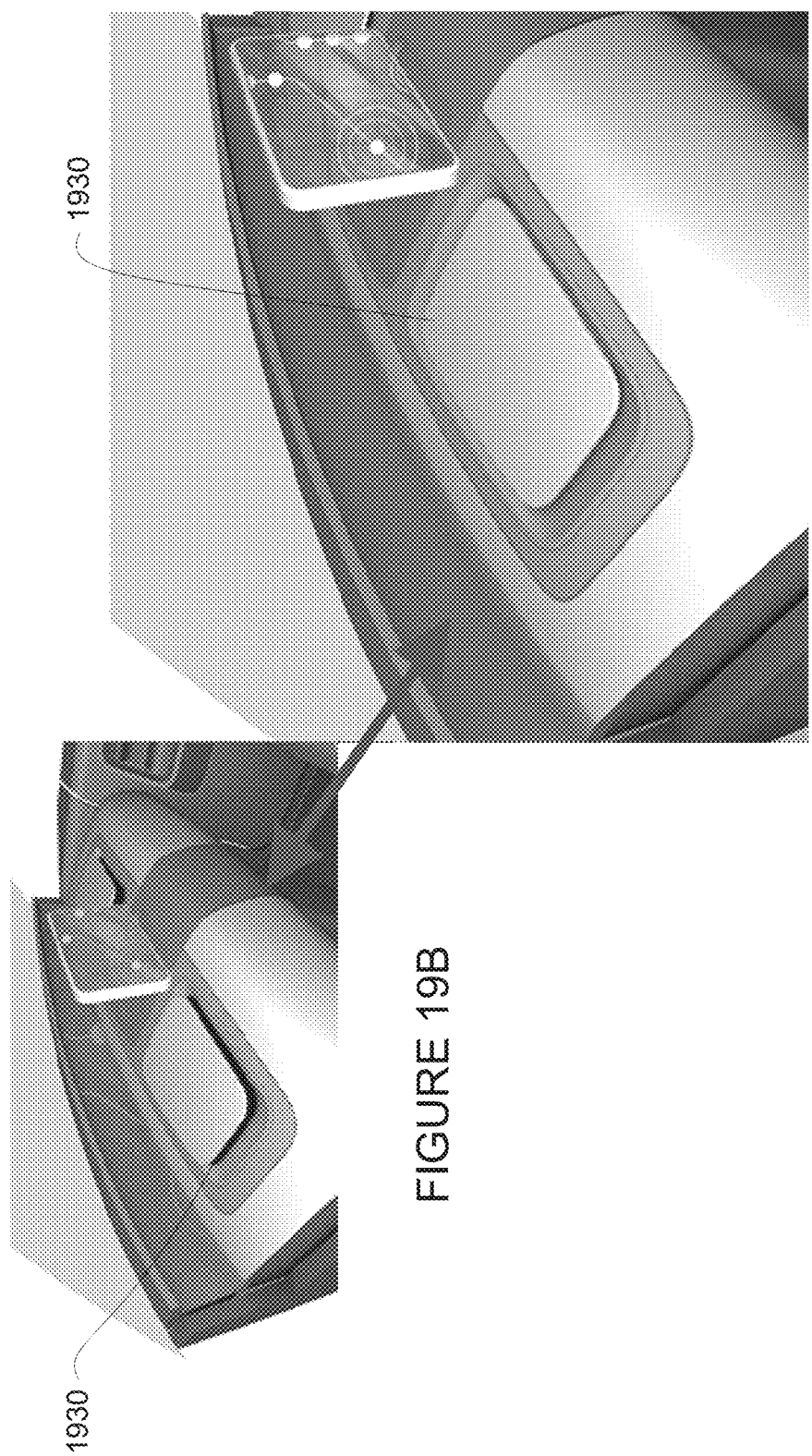

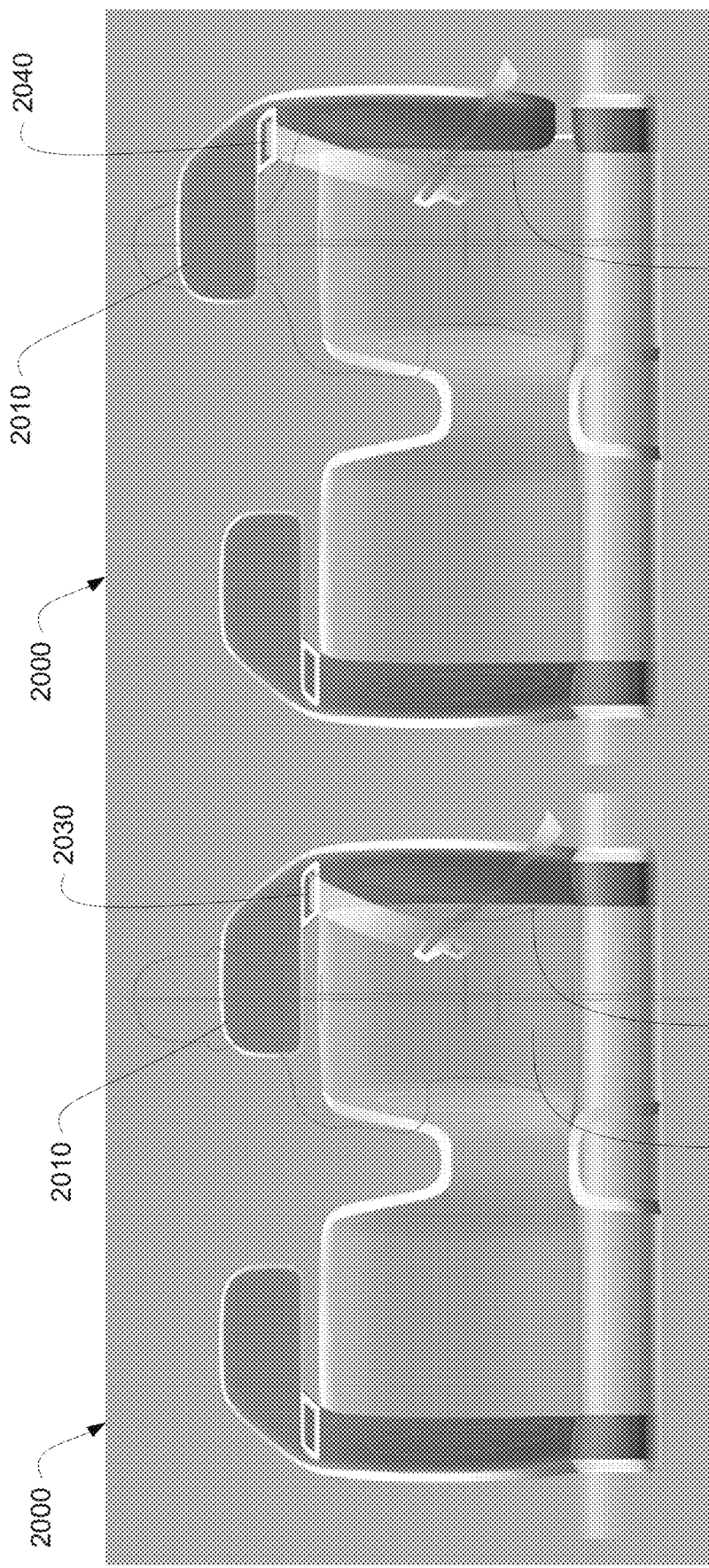

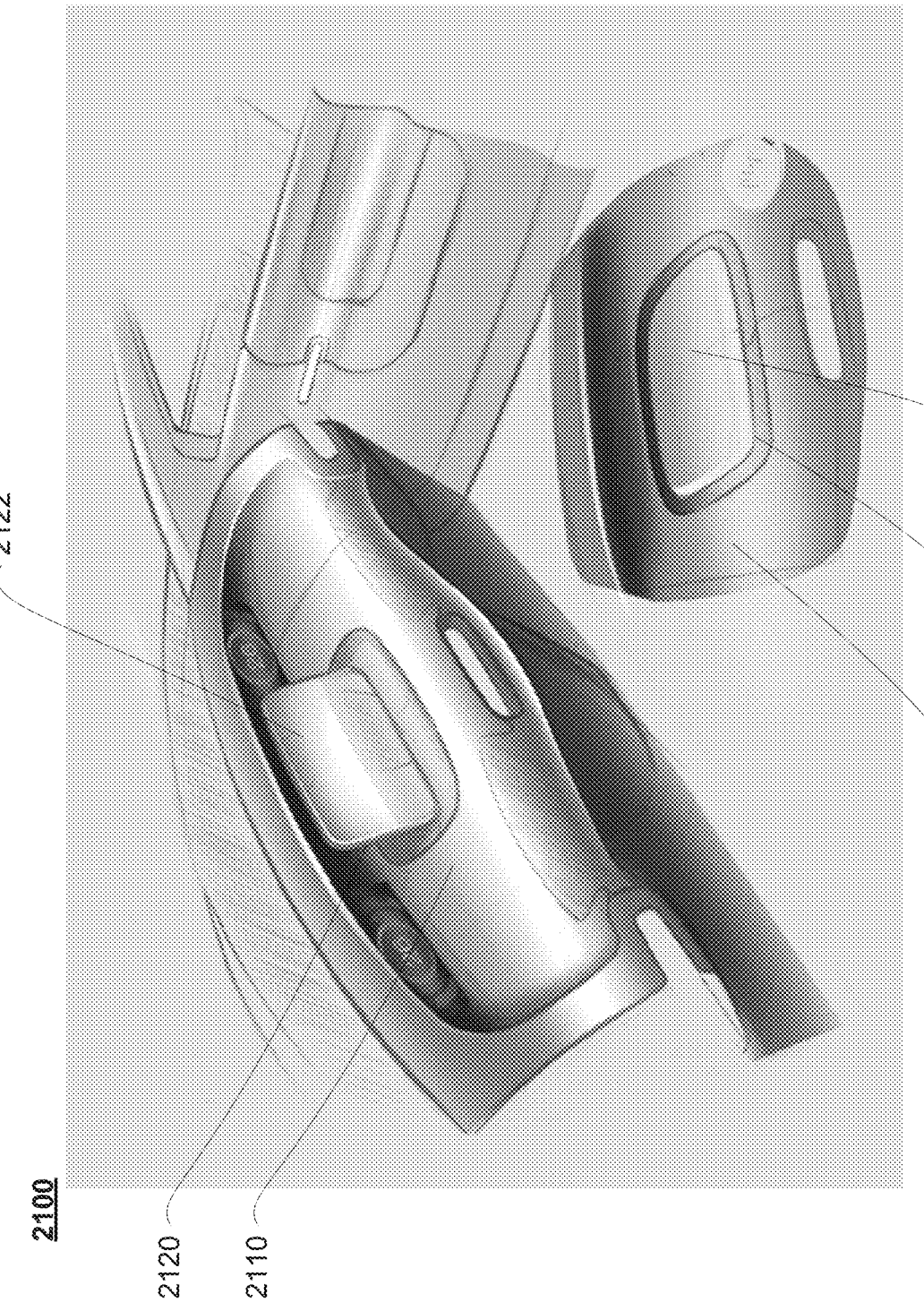

3300

TABLE OF DISPLAY CONFIGURATIONS

A — driving / in use

B — arriving / showing available seats

C — arrived / welcome or vehicle identifier

D — idle / touch or slide to open screen

3400

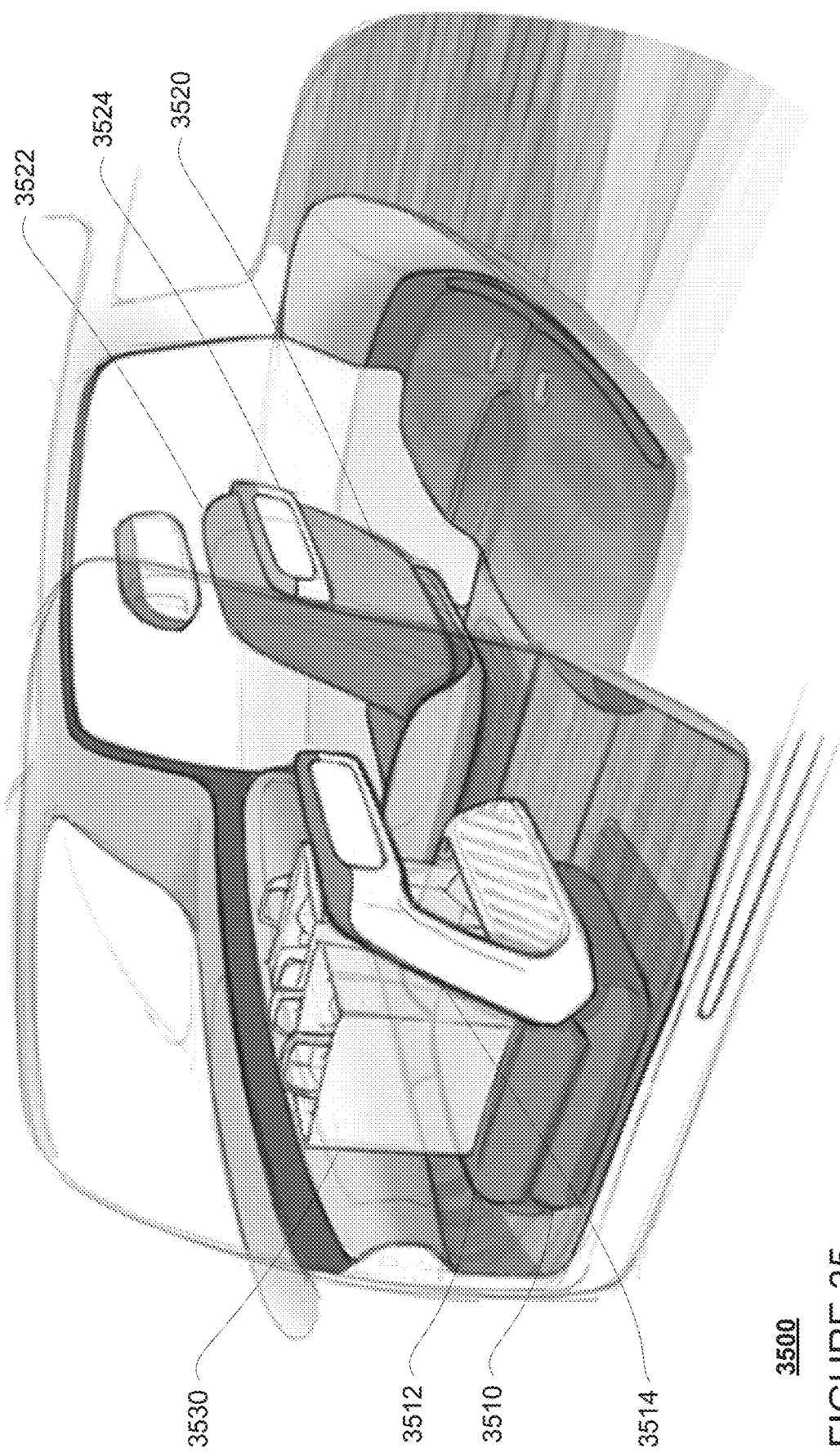

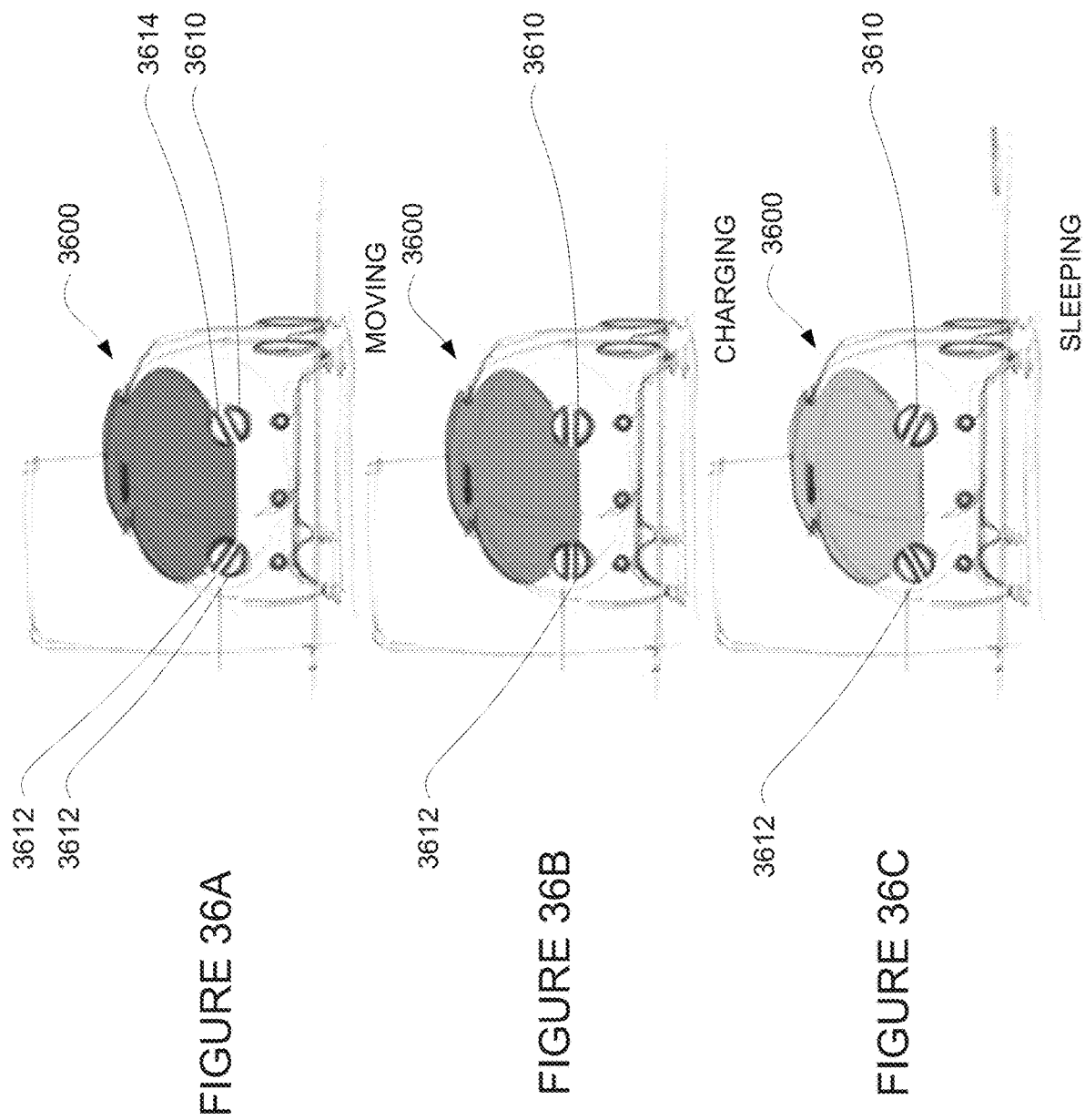

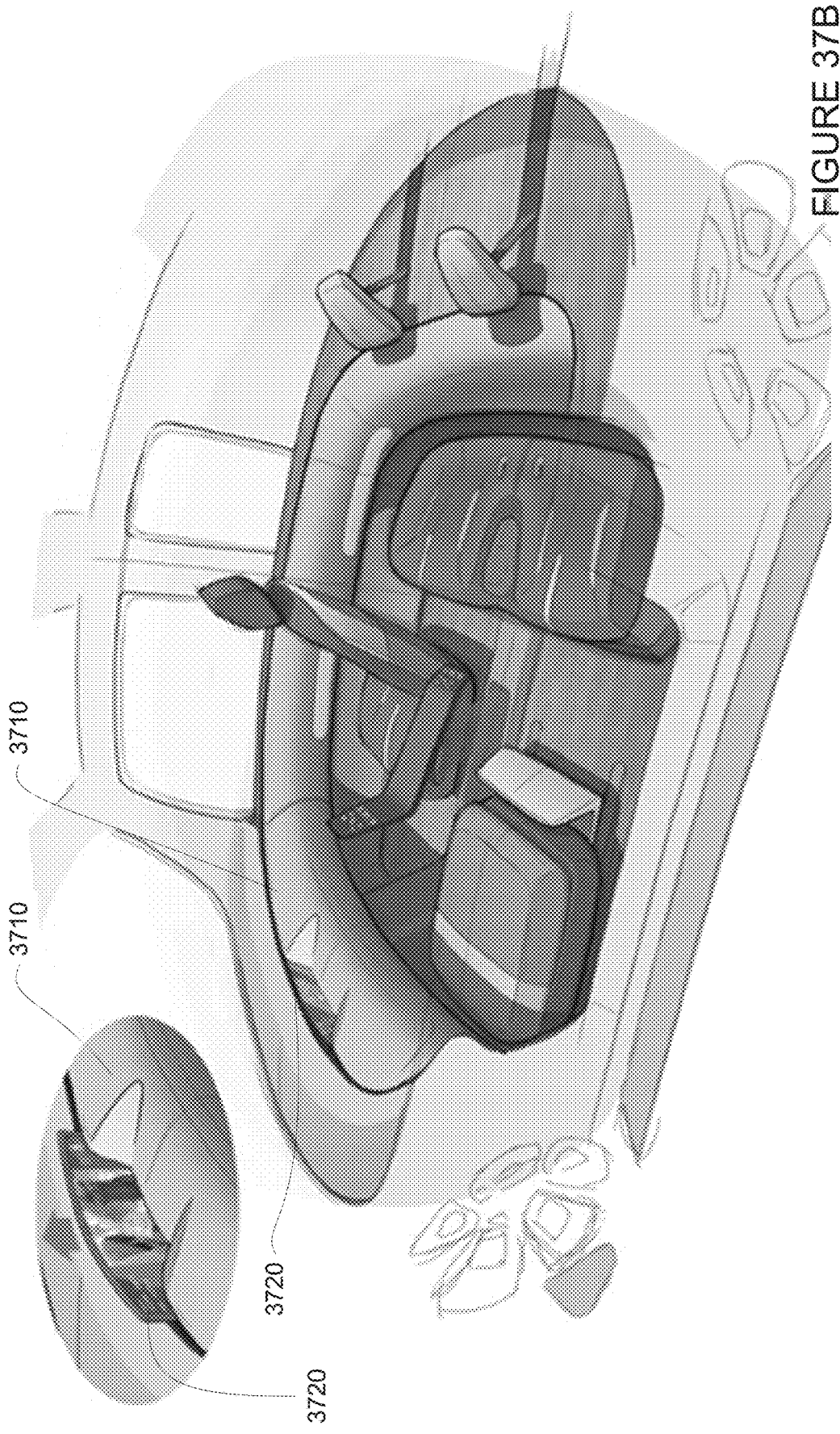

VARIOUS INTERIOR AND EXTERIOR FEATURES FOR AUTONOMOUS VEHICLES

CROSS-REFERENCE TO RELATED APPLICATIONS

The present application claims the benefit of the filing date of U.S. Provisional Patent Application No. 62/353,329 filed Jun. 22, 2016, the disclosure of which is hereby incorporated herein by reference.

BACKGROUND

Autonomous vehicles, such as vehicles that do not require a human driver, can be used to aid in the transport of passengers or items from one location to another. Such vehicles may operate in a fully autonomous mode where passengers may provide some initial input, such as a pickup or destination location, and the vehicle maneuvers itself to that location.

BRIEF DESCRIPTION OF THE DRAWINGS

FIGS. 6B-6C are example exterior views of a vehicle in accordance with aspects of the disclosure.

FIGS. 8B-8D are examples of a first door configuration in accordance with aspects of the disclosure.

FIG. 8E is an example of a second door configuration in accordance with aspects of the disclosure.

FIGS. 13A and 13B are example views of an interior of a vehicle in accordance with aspects of the disclosure.

FIG. 13C is a detail view of a pop-up speaker in accordance with aspects of the disclosure.

FIG. 14 is an example view of an interior of a vehicle in accordance with aspects of the disclosure.

FIGS. 15A and 15B are example external views of a vehicle in accordance with aspects of the disclosure.

FIG. 15C is example view of an interior of vehicle in accordance with aspects of the disclosure.

FIG. 15D is an example external view of a vehicle in accordance with aspects of the disclosure.

FIGS. 15E and 15F are example views of a windshield and wiper system in accordance with aspects of the disclosure.

FIG. 18A is an example view of an interior of a vehicle in accordance with aspects of the disclosure.

FIGS. 18B and 18C are example views of a seat back display in accordance with aspects of the disclosure.

FIGS. 19B and 19C are example configurations of a hidden air vent in accordance with aspects of the disclosure.

FIGS. 20A and 20B are an example seating configuration in accordance with aspects of the disclosure.

FIGS. 21A and 21B are example views of an interior of a vehicle in accordance with aspects of the disclosure.

FIG. 35 is an example view of an interior of a vehicle in accordance with aspects of the disclosure.

FIGS. 36A-36C are example external views of a vehicle in accordance with aspects of the disclosure.

FIGS. 37A and 37B are example views of an interior of a vehicle in accordance with aspects of the disclosure.

DETAILED DESCRIPTION

Overview

Figure 1:
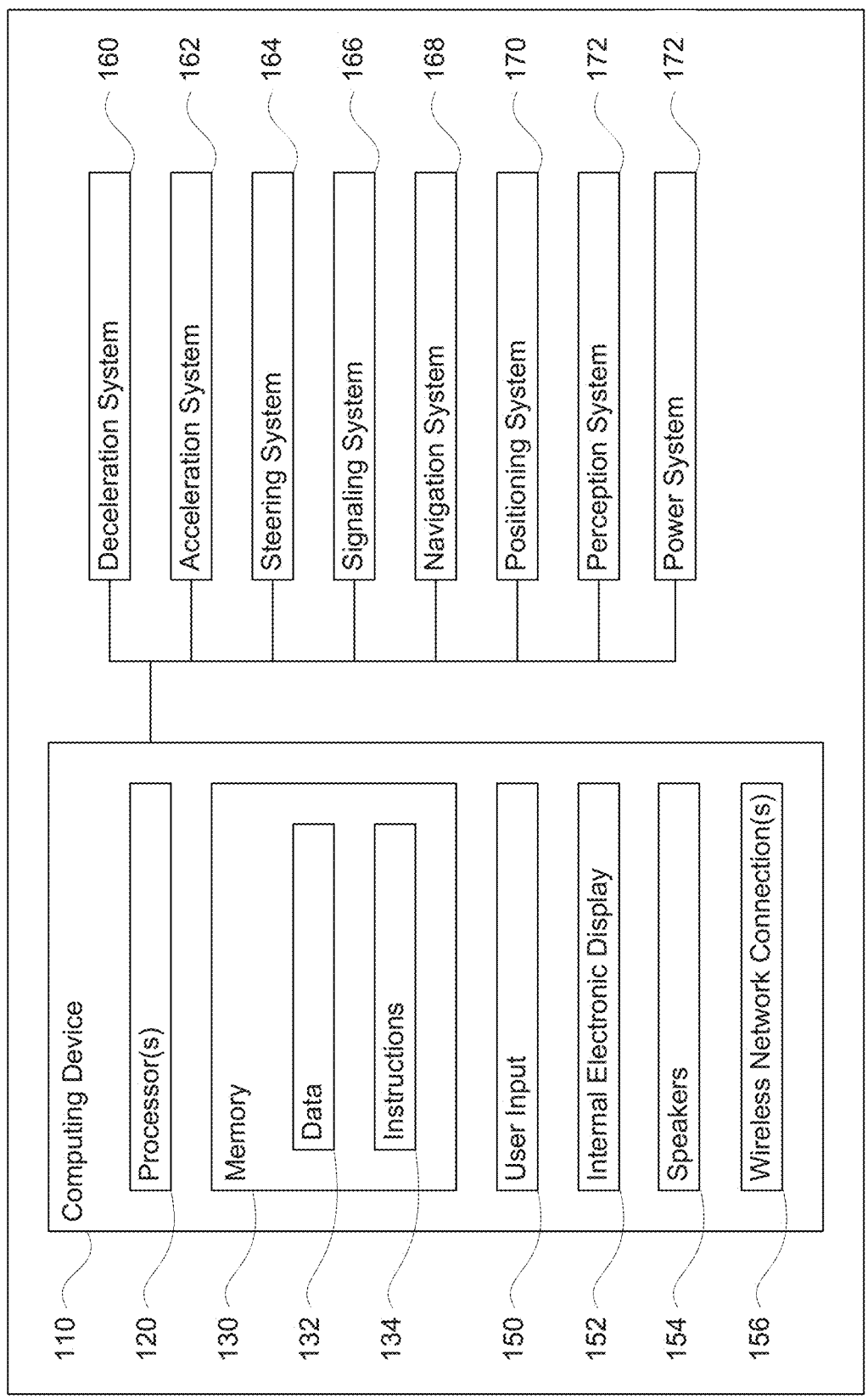
FIG. 1 is a functional diagram of an example vehicle in accordance with an exemplary embodiment.

Because of the nature of autonomous vehicles, and in particular that they do not require manual inputs from a driver or passenger to control braking and steering, autonomous vehicle can include features that may not necessarily be useful or practical in a typical non-autonomous (or semi-autonomous vehicle) that would require such manual input. For instance, an autonomous vehicle may include a floating sensor box that utilizes magnets, a drone, or some other flying machine. In addition or alternatively, the vehicle may include a sensor box that "pops up" out of a roof of the vehicle when needed and recedes back into the roof when not needed. The vehicle may include sensor housings fixed proximate to each of the four corners of the roof of the vehicle. The vehicle may also include notched sides to allow for better ingress and egress for a passenger. In other examples, the vehicle may include a patterned sunroof. The vehicle may include a bench seat with integrated speakers and inductive charging surfaces. The vehicle may include modular interiors that can be configured to slide into and out of a body of the vehicle 100. The vehicle may also include an a "periscope" feature that descends towards the head of a passenger and can provide an immersive augmented reality display. The vehicle may also include a table component that extends away from the dashboard of the vehicle to allow passengers to work or play while riding in the vehicle. The vehicle may also include a "floating" display 1410 positioned in front of the windshield to provide information and interact with the passengers.

The vehicle may also include a front hatch that incorporates the vehicle's hood (or engine compartment cover), the vehicle's windshield, and at least a portion of the interior dashboard of the vehicle. The vehicle may also include a space between seats of the first row of seating of the vehicle that is wide enough to allow a passenger to pass between the seats and towards a second row of seating. The vehicle may also include a dashboard with a charging surface to allow a passenger to easily charge his or her devices. The vehicle may also include an adjustable display connected to the backside of a seat. The vehicle may also include pop-up air vent and/or speakers. The vehicle may also include a headrest that includes an arm portion configured to house a seatbelt where the arm portions moves with the headrest in order to change the position of the seatbelt.

The vehicle may also include a flip-up and flip-down display and/or a pop-up and pop-down display. The vehicle may also include a rotating a connector panel for charging or data exchange integrated into the dashboard. The vehicle may include seats with removable cushions to allow for easy replacement of worn, damaged or dirty seat cushions. The vehicle may also include a hybrid bench seat that includes first and second seat backs connected to a single seat cushion which allows for independent adjustment of the seat backs relative to the base. The vehicle may also include front and rear modular panoramic displays. The vehicle may also include a light up indicator that indicates the state of a door of the vehicle, such as locked or unlocked. The vehicle may include one or more cup holders having a recess and a strap that can accommodate an infinite number of cup configurations. The vehicle may also include a center console may having a receptacle configured to slide from a closed configuration to an open configuration. The vehicle may also include a center console with an touch-sensitive display. The vehicle may also include connector panels integrated into the door panels of the vehicle. The vehicle may also include one or more external displays that may communicate information about the state of the vehicle. These displays may be integrated into one or more of the door panels and/or windows of the vehicle.

The vehicle may also include a conductive fabric on several of the surfaces of the interior of the vehicle in order to provide for one or more user inputs in order to control various aspects of the vehicle. The vehicle may include seats having a movable seat back in order to accommodate more or larger items when a seat is not being used for a passenger. The vehicle may include headlights that can be rotated into different orientations in order to indicate a status of the vehicle. The vehicle may also include a display having multiple positions, each of the positions being configured for a particular use.

Example Systems

As shown in FIG. 1, a vehicle 100 in accordance with one aspect of the disclosure includes various components. While certain aspects of the disclosure are particularly useful in connection with specific types of vehicles, the vehicle may be any type of vehicle including, but not limited to, cars, trucks, motorcycles, busses, recreational vehicles, etc. The vehicle may have one or more computing devices, such as computing device 110 containing one or more processors 120, memory 130 and other components typically present in general purpose computing devices.

The memory 130 stores information accessible by the one or more processors 120, including instructions 132 and data 134 that may be executed or otherwise used by the processor 120. The memory 130 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 132 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 134 may be retrieved, stored or modified by processor 120 in accordance with the instructions 132. For instance, although the claimed subject matter is not limited by any particular data structure, the data may be stored in computing device registers, in a relational database as a table having a plurality of different fields and records, XML documents or flat files. The data may also be formatted in any computing device-readable format.

The one or more processor 120 may be any conventional processors, such as commercially available CPUs. Alternatively, the one or more processors may be a dedicated device such as an ASIC or other hardware-based processor. Although FIG. 1 functionally illustrates the processor, memory, and other elements of computing device 110 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing device 110. Accordingly, references to a processor or computing device will be understood to include references to a collection of processors or computing devices or memories that may or may not operate in parallel.

Computing device 110 may all of the components normally used in connection with a computing device such as the processor and memory described above as well as a user input 150 (e.g., a mouse, keyboard, touch screen and/or microphone) and various electronic displays (e.g., a monitor having a screen or any other electrical device that is operable to display information). In this example, the vehicle includes an internal electronic display 152 as well as one or more speakers 154 to provide information or audio visual experiences. In this regard, internal electronic display 152 may be located within a cabin of vehicle 100 and may be used by computing device 110 to provide information to passengers within the vehicle 100.

Computing device 110 may also include one or more wireless network connections 154 to facilitate communication with other computing devices, such as the client computing devices and server computing devices described in detail below. The wireless network connections may include short range communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

In one example, computing device 110 may be an autonomous driving computing system incorporated into vehicle 100. The autonomous driving computing system may capable of communicating with various components of the vehicle. For example, returning to FIG. 1, computing device 110 may be in communication with various systems of vehicle 100, such as deceleration system 160, acceleration system 162, steering system 164, signaling system 166, navigation system 168, positioning system 170, detection system 172, and power system 174 (such as an electric motor, gas engine, combination of both, etc.) in order to control the movement, speed, etc. of vehicle 100 in accordance with the instructions 134 of memory 130. Again, although these systems are shown as external to computing device 110, in actuality, these systems may also be incorporated into computing device 110, again as an autonomous driving computing system for controlling vehicle 100.

As an example, computing device 110 may interact with deceleration system 160 and acceleration system 162 in order to control the speed of the vehicle. Similarly, steering system 164 may be used by computer 110 in order to control the direction of vehicle 100. For example, if vehicle 100 is configured for use on a road, such as a car or truck, the steering system may include components to control the angle of wheels to turn the vehicle. Signaling system 166 may be used by computing device 110 in order to signal the vehicle's intent to other drivers or vehicles, for example, by lighting turn signals or brake lights when needed.

Navigation system 168 may be used by computing device 110 in order to determine and follow a route to a location. In this regard, the navigation system 168 and/or data 134 may store detailed map information, e.g., highly detailed maps identifying the shape and elevation of roadways, lane lines, intersections, crosswalks, speed limits, traffic signals, buildings, signs, real time traffic information, vegetation, or other such objects and information.

Positioning system 170 may be used by computing device 110 in order to determine the vehicle's relative or absolute position on a map or on the earth. For example, the position system 170 may include a GPS receiver to determine the device's latitude, longitude and/or altitude position. Other location systems such as laser-based localization systems, inertial-aided GPS, or camera-based localization may also be used to identify the location of the vehicle. The location of the vehicle may include an absolute geographical location, such as latitude, longitude, and altitude as well as relative location information, such as location relative to other cars immediately around it which can often be determined with less noise that absolute geographical location.

The positioning system 170 may also include other devices in communication with computing device 110, such as an accelerometer, gyroscope or another direction/speed detection device to determine the direction and speed of the vehicle or changes thereto. By way of example only, an acceleration device may determine its pitch, yaw or roll (or changes thereto) relative to the direction of gravity or a plane perpendicular thereto. The device may also track increases or decreases in speed and the direction of such changes. The device's provision of location and orientation data as set forth herein may be provided automatically to the computing device 110, other computing devices and combinations of the foregoing.

The detection system 172 also includes one or more components for detecting objects external to the vehicle such as other vehicles, obstacles in the roadway, traffic signals, signs, trees, etc. For example, the detection system 170 may include lasers, sonar, radar, cameras and/or any other detection devices that record data which may be processed by computing device 110. In the case where the vehicle is a small passenger vehicle such as a car, the car may include a laser or other sensors mounted on the roof or other convenient location.

The computing device 110 may control the direction and speed of the vehicle by controlling various components. By way of example, computing device 110 may navigate the vehicle to a destination location completely autonomously using data from the detailed map information and navigation system 168. Computing device 110 may use the positioning system 170 to determine the vehicle's location and detection system 172 to detect and respond to objects when needed to reach the location safely. In order to do so, computing device 110 may cause the vehicle to accelerate (e.g., by increasing fuel or other energy provided to the engine by acceleration system 162), decelerate (e.g., by decreasing the fuel supplied to the engine, changing gears, and/or by applying brakes by deceleration system 160), change direction (e.g., by turning the front or rear wheels of vehicle 100 by steering system 164), and signal such changes (e.g., by lighting turn signals of signaling system 166). Thus, the acceleration system 162 and deceleration system 162 may be a part of a drivetrain that includes various components between an engine of the vehicle and the wheels of the vehicle. Again, by controlling these systems, computing device 110 may also control the drivetrain of the vehicle in order to maneuver the vehicle autonomously. In addition, the computing devices 110, by way of processors 120, may control various aspects of the vehicle in order to achieve the functionality of the various features described further below.

Figure 2:
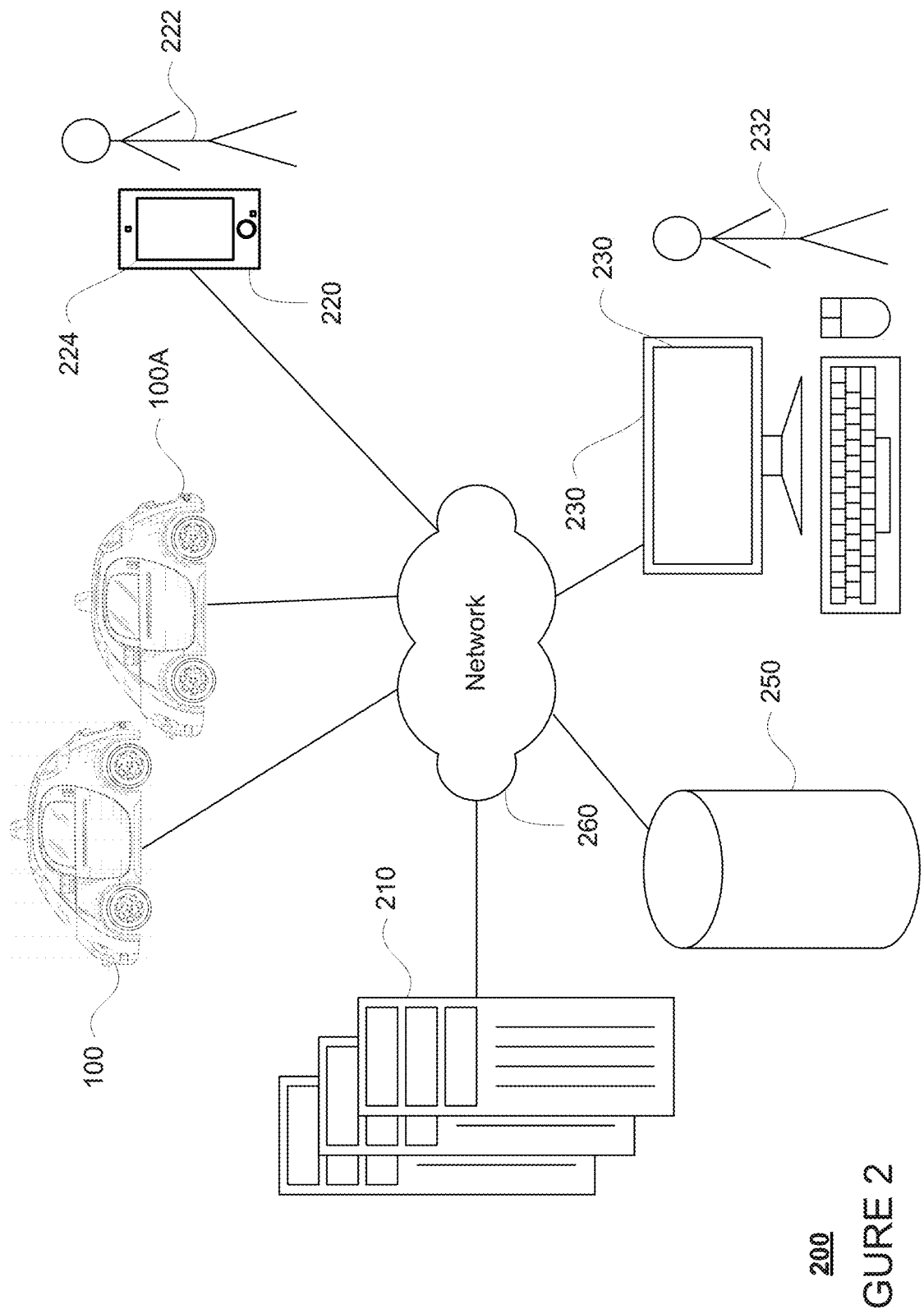
FIG. 2 is a functional diagram of an example system in accordance with an exemplary embodiment.
Figure 3:
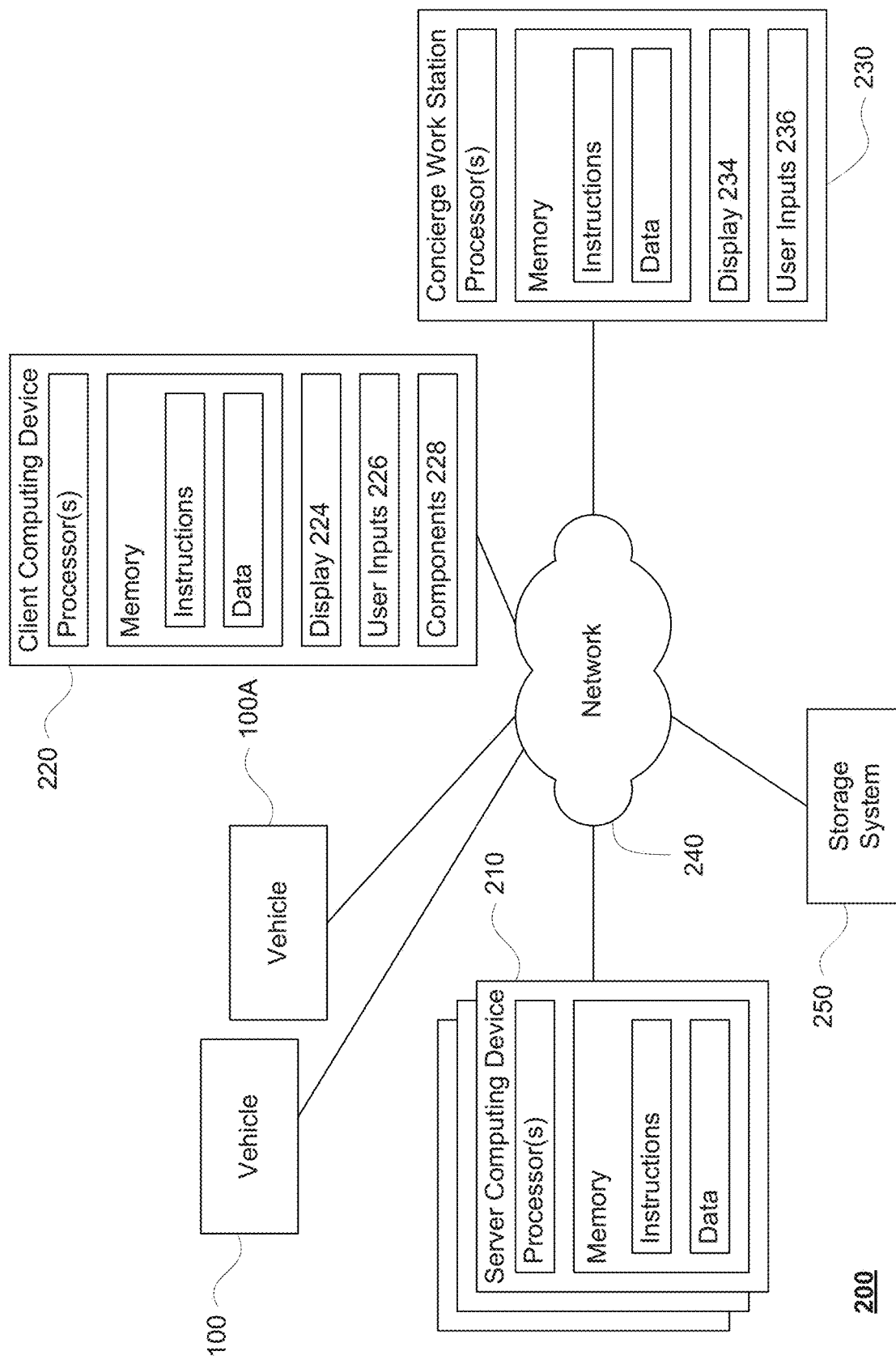
FIG. 3 is a pictorial diagram of the system of FIG. 2 in accordance with aspects of the disclosure.
Figure 4A:
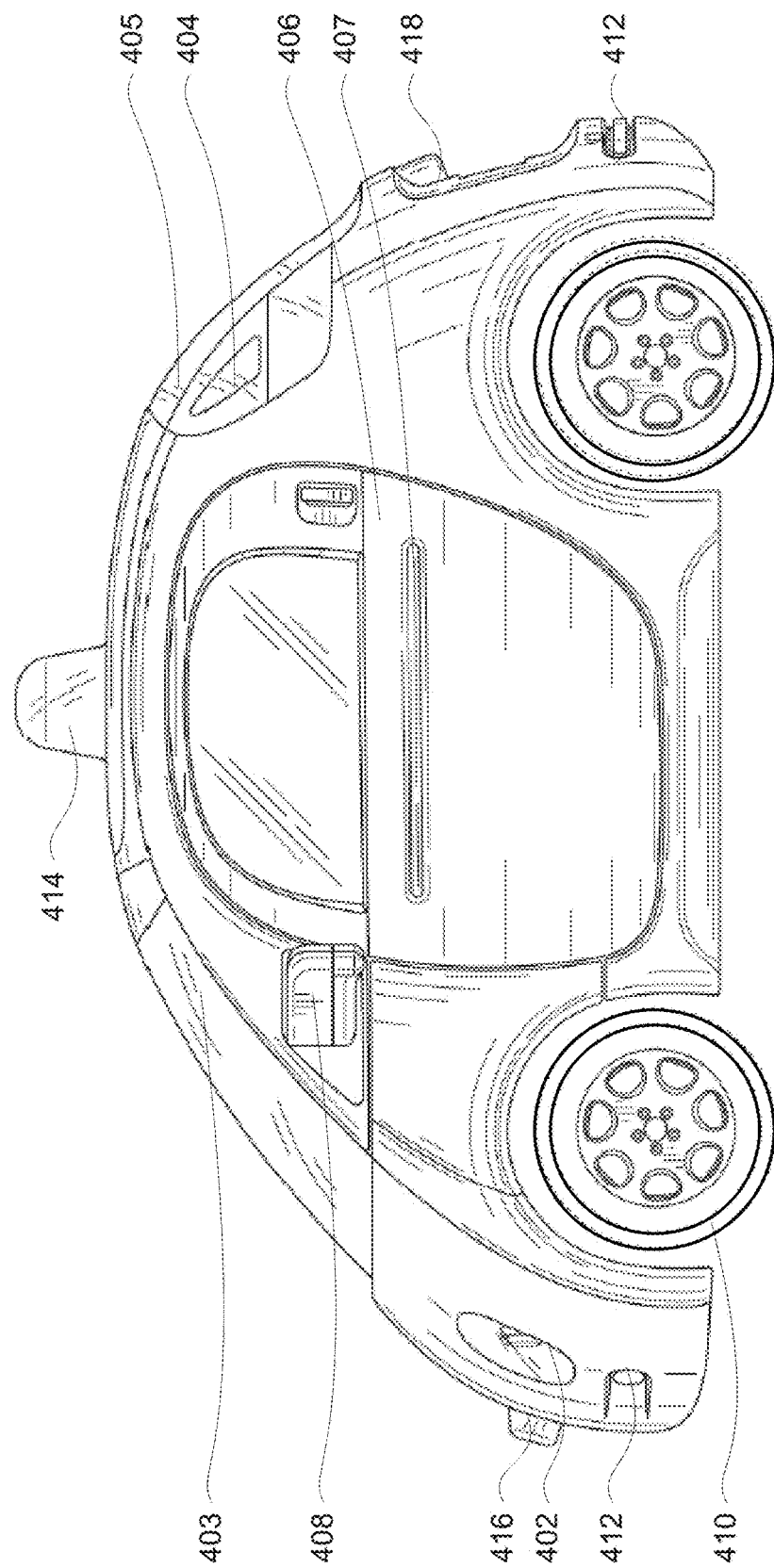
FIGS. 4A-4D are example external views of a vehicle in accordance with aspects of the disclosure.
Figure 4C:
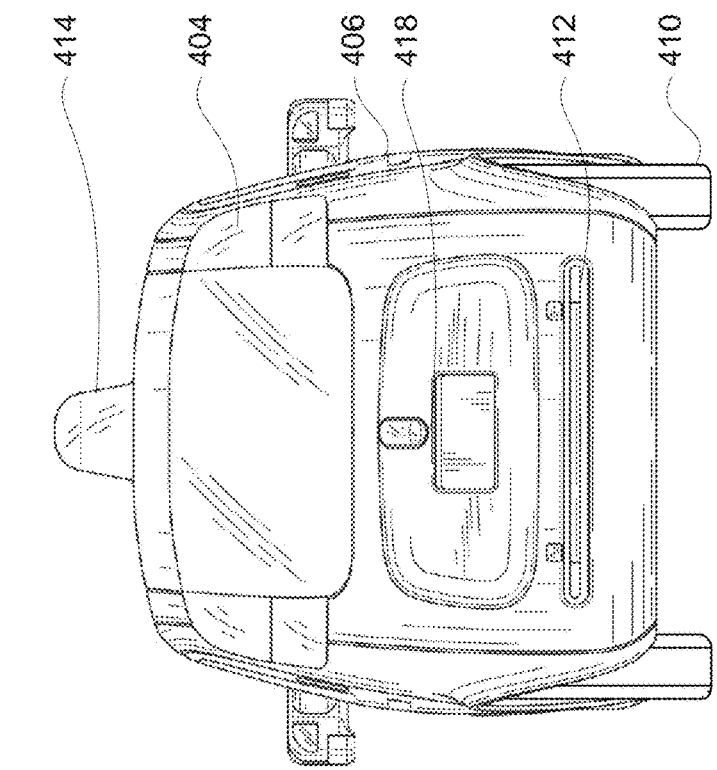
Figure 4B:
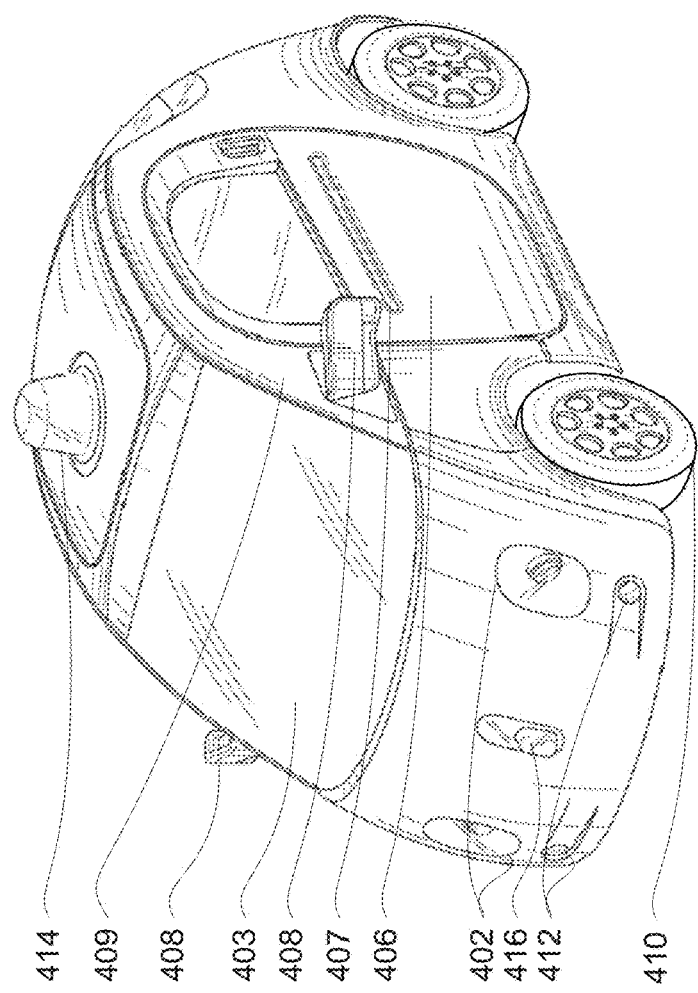
Figure 4D:
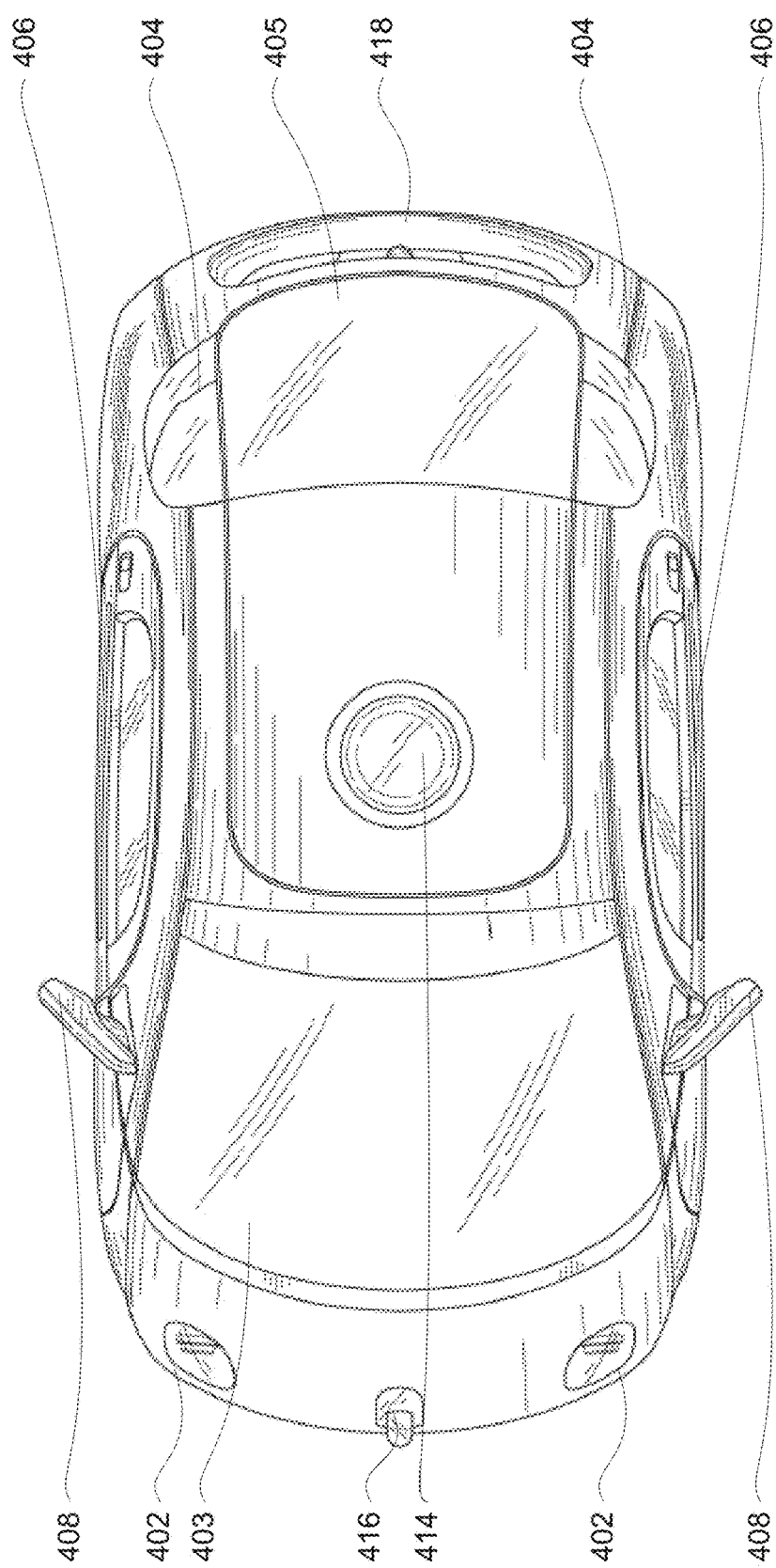

Computing device 110 of vehicle 100 may also receive or transfer information to and from other computing devices. FIGS. 2 and 3 are pictorial and functional diagrams, respectively, of an example system 200 that includes a plurality of computing devices 210, 220, 230 and a storage system 250 connected via a network 260. System 200 also includes vehicle 100, and vehicle 100A which may be configured similarly to vehicle 100. Although only a few vehicles and computing devices are depicted for simplicity, a typical system may include significantly more.

As shown in FIG. 3, each of computing devices 210, 220, 230 may include one or more processors, memory, data and instructions. Such processors, memories, data and instructions may be configured similarly to one or more processors 120, memory 130, data 132, and instructions 134 of computing device 110.

The network 260, and intervening nodes, may include various configurations and protocols including short range communication protocols such as Bluetooth, Bluetooth LE, the Internet, World Wide Web, intranets, virtual private networks, wide area networks, local networks, private networks using communication protocols proprietary to one or more companies, Ethernet, WiFi and HTTP, and various combinations of the foregoing. Such communication may be facilitated by any device capable of transmitting data to and from other computing devices, such as modems and wireless interfaces.

In one example, one or more computing devices 110 may include a server having a plurality of computing devices, e.g., a load balanced server farm, that exchange information with different nodes of a network for the purpose of receiving, processing and transmitting the data to and from other computing devices. For instance, one or more computing devices 210 may include one or more server computing devices that are capable of communicating with computing device 110 of vehicle 100 or a similar computing device of vehicle 100A as well as computing devices 220, 230 via the network 260. For example, vehicles 100 and 100A may be a part of a fleet of vehicles that can be dispatched by server computing devices to various locations. In this regard, the vehicles of the fleet may periodically send the server computing devices location information provided by the vehicle's respective positioning systems and the one or more server computing devices may track the locations of the vehicles.

In addition, server computing devices 210 may use network 260 to transmit and present information to a user, such as user 222, 232 on a display, such as displays 224, 234 of computing devices 220, 230. In this regard, computing devices 220, 230 may be considered client computing devices.

As shown in FIG. 3, each client computing device 220, 230, may be a personal computing device intended for use by a user 222, 232, and have all of the components normally used in connection with a personal computing device including a one or more processors (e.g., a central processing unit (CPU)), memory (e.g., RAM and internal hard drives) storing data and instructions, a display such as displays 224, 234 (e.g., a monitor having a screen, a touch-screen, a projector, a television, or other device that is operable to display information), and user input devices 226, 236 (e.g., a mouse, keyboard, touch-screen or microphone). The client computing devices may also include a camera for recording video streams, speakers, a network interface device, and all of the components used for connecting these elements to one another.

In addition, the client computing device 220 may also include components 228 for determining the position and orientation of client computing devices. For example, these components may include a GPS receiver to determine the device's latitude, longitude and/or altitude as well as an accelerometer, gyroscope or another direction/speed detection device as described above with regard to positioning system 170 of vehicle 100.

Although the client computing devices 220, 230 may each comprise a full-sized personal computing device, they may alternatively comprise mobile computing devices capable of wirelessly exchanging data with a server over a network such as the Internet. By way of example only, client computing device 220 may be a mobile phone or a device such as a wireless-enabled PDA, a tablet PC, a wearable computing device or system, or a netbook that is capable of obtaining information via the Internet or other networks. As an example the user may input information using a small keyboard, a keypad, microphone, using visual signals with a camera, or a touch screen.

In some examples, client computing device 230 may be a concierge work station used by an administrator or customer support representative (concierge) to provide concierge services to users such as user 222. For example, a concierge 232 may use the concierge work station 230 to communicate via a telephone call or audio connection with users through their respective client computing devices or vehicles 100 or 100A in order to facilitate the safe operation of vehicles 100 and 100A and the safety of the users as described in further detail below. Although only a single concierge work station 230 is shown in FIGS. 2 and 3, any number of such work stations may be included in a typical system.

Storage system 250 may store various types of information as described in more detail below. This information may be retrieved or otherwise accessed by a server computing device, such as one or more server computing devices 210, in order to perform some or all of the features described herein. For example, the information may include user account information such as credentials (e.g., a user name and password as in the case of a traditional single-factor authentication as well as other types of credentials typically used in multi-factor authentications such as random identifiers, biometrics, etc.) that can be used to identify a user to the one or more server computing devices. The user account information may also include personal information such as the user's name, contact information, identifying information of the user's client computing device (or devices if multiple devices are used with the same user account), as well as one or more unique signals for the user.

The storage system 250 may also store routing data for generating and evaluating routes between locations. For example, the routing information may be used to estimate how long it would take a vehicle at a first location to reach a second location. In this regard, the routing information may include map information, not necessarily as particular as the detailed map information described above, but including roads, as well as information about those road such as direction (one way, two way, etc.), orientation (North, South, etc.), speed limits, as well as traffic information identifying expected traffic conditions, etc.

As with memory 130, storage system 250 can be of any type of computerized storage capable of storing information accessible by the server computing devices 210, such as a hard-drive, memory card, ROM, RAM, DVD, CD-ROM, write-capable, and read-only memories. In addition, storage system 250 may include a distributed storage system where data is stored on a plurality of different storage devices which may be physically located at the same or different geographic locations. Storage system 150 may be connected to the computing devices via the network 260 as shown in FIG. 2 and/or may be directly connected to or incorporated into any of the computing devices 110, 210, 220, 230, etc.

FIGS. 4A-4D are examples of external views of vehicle 100. As can be seen, vehicle 100 includes many features of a typical vehicle such as headlights 402, windshield 403, taillights/turn signal lights 404, rear windshield 405, doors 406, side view mirrors 408, tires and wheels 410, and turn signal/parking lights 412. Headlights 402, taillights/turn signal lights 404, and turn signal/parking lights 412 may be associated the signaling system 166. Light bar 407 may also be associated with the signaling system 166.

Vehicle 100 also includes sensors of the detection system 172. For example, housing 414 may include one or more laser devices for having 360 degree or narrower fields of view and one or more camera devices. Housings 416 and 418 may include, for example, one or more radar and/or sonar devices. The devices of the detection system may also be incorporated into the typical vehicle components, such as taillights 404 and/or side view mirrors 408. Each of these radar, camera, and lasers devices may be associated with processing components which process data from these devices as part of the detection system 172 and provide sensor data to the computing device 110.

Figure 5:
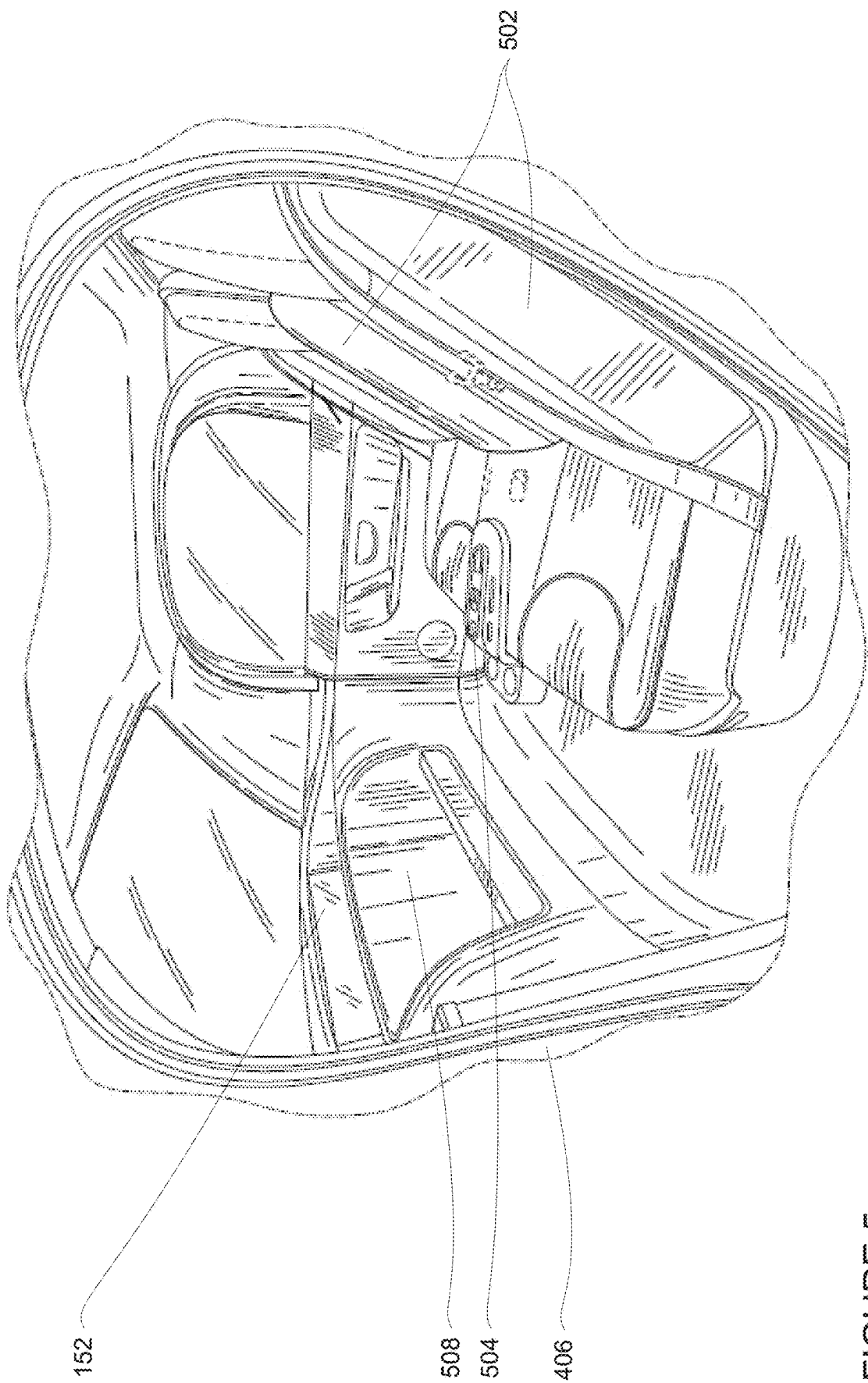
FIG. 5 is an example internal view of a vehicle in accordance with aspects of the disclosure.

Because of the nature of autonomous vehicles, or rather that autonomous vehicles do not need constant inputs from a human driver, the interior of the vehicle need not include fixed steering, brake and acceleration controls, but rather, may be configured to promote the comfort and convenience of the passengers. FIG. 5 is an example internal view of vehicle through the opening of door 406. In this example, there is of a row of two seats 502 for passengers with a console 504 between them. Directly in ahead of seats 502 is a dashboard configuration 506 having a storage bin area 508 and the internal electronic display 152. As can be readily seen, the vehicle does not include a steering wheel, gas (acceleration) pedal, or brake (deceleration) pedal which would allow for a semiautonomous or manual driving mode where a passenger would directly control the steering, acceleration and/or deceleration of the vehicle via the drivetrain. Rather, user input is limited to a microphone of the user input 150 (not shown), features of the console 504, and wireless network connections 156. In this regard, internal electronic display 152 merely provides information to the passenger and need not include a touch screen or other interface for user input. In other embodiments, the internal electronic display 152 may include a touch screen or other user input device for entering information by a passenger such as a destination, etc.

Figure 6A:
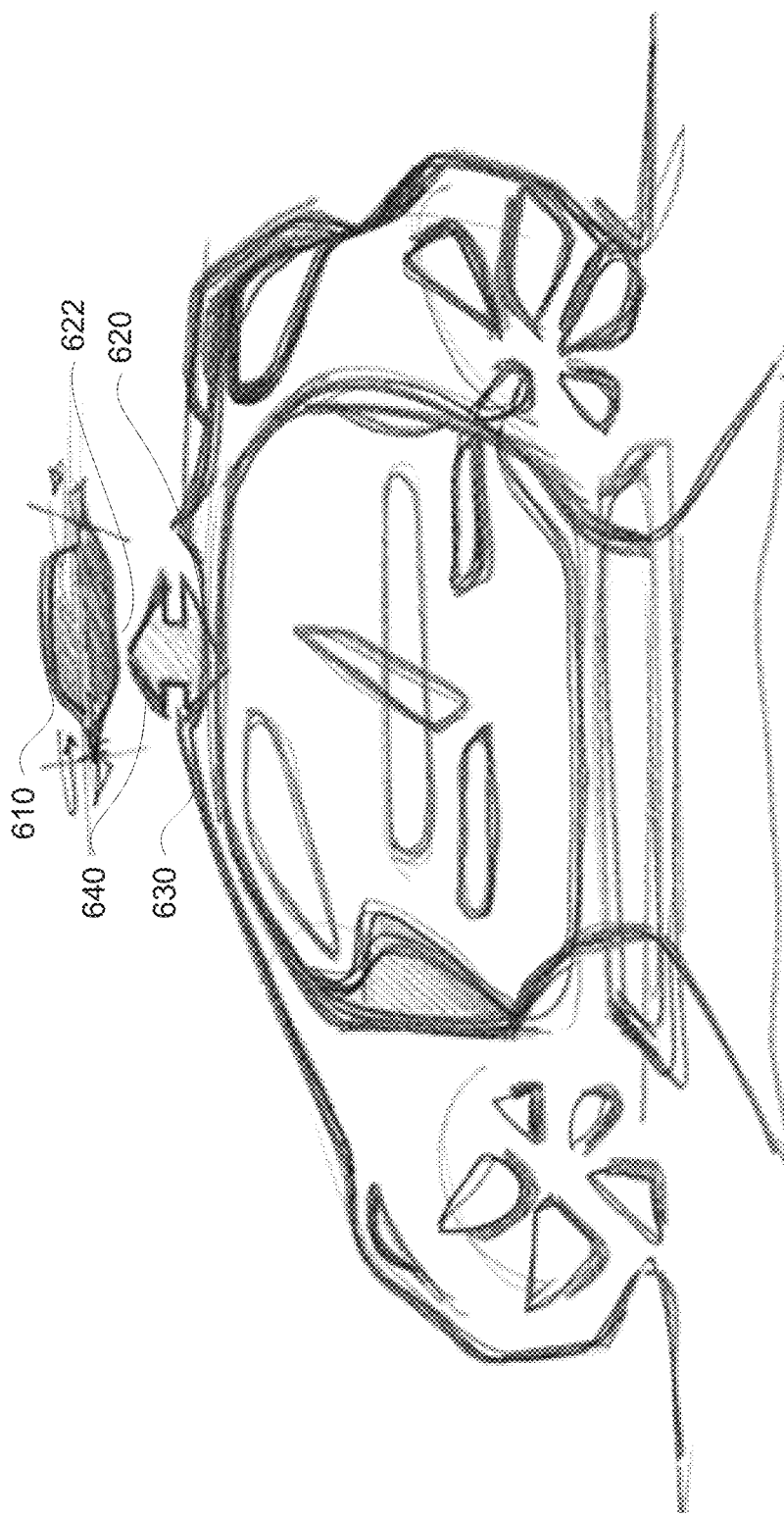
FIG. 6A is an example exterior view of a vehicle in accordance with aspects of the disclosure.

FIG. 6 is an example exterior view of a vehicle 600 that may be configured similarly to vehicle 100. In this example however, rather than a fixed housing 414 arranged on the roof as with vehicle 100, vehicle 600 includes a floating sensor box 610. As with housing 414, the floating sensor box 610 may include one or more lidar sensors, cameras, radars, sonars, etc. of the perception system 172. The sensor box 610 may float, for instance using electromagnet 620, 622 in each of the sensor box 610 and roof 630 of the vehicle. The electromagnets may be configured to allow the vehicle's computing devices 110 to adjust the polarity of the magnets to maintain the position of the sensor box 610 relative to the roof 630 while the vehicle 600 is moving as indicated by arrow 640. In addition, the sensor box 610 may include a transmitter and receiver in order to communicate wirelessly with the vehicle's computing devices, for instance to send information processed by the sensors and also receive instructions from the computing devices. In this regard, the electromagnets may be controlled be controlled by the vehicle's computing devices which are also maneuvering the vehicle.

Alternatively, rather than using a floating sensor box with magnets, the sensor box may be a flying machine or drone capable of hovering above the vehicle as the vehicle maneuvers itself. In this regard, the drone may be controlled by the vehicle's computing devices which are also maneuvering the vehicle.

In addition or alternatively, the vehicle may include a sensor box that "pops up" out of a roof of the vehicle when needed and recedes back into the roof when not needed. For instance, as shown in FIG. 6B, when the vehicle is parked or the vehicle's power system 174 is charging, the computing device may retract a sensor box 650 into the roof panel 660 of the vehicle. When needed, for instance to detect the state of objects in the vehicle's environment, the computing devices 110 may extend the sensor box above the roof panel 660 as shown in FIG. 6C. As with housing 414, the sensor box 650 may include one or more lidar sensors, cameras, radars, sonars, etc. of the perception system 172. Thus, by extending the sensor box 650, the aforementioned sensors within the sensor box may be positioned to detect the state of objects in the vehicle's environment.

Figure 7A:
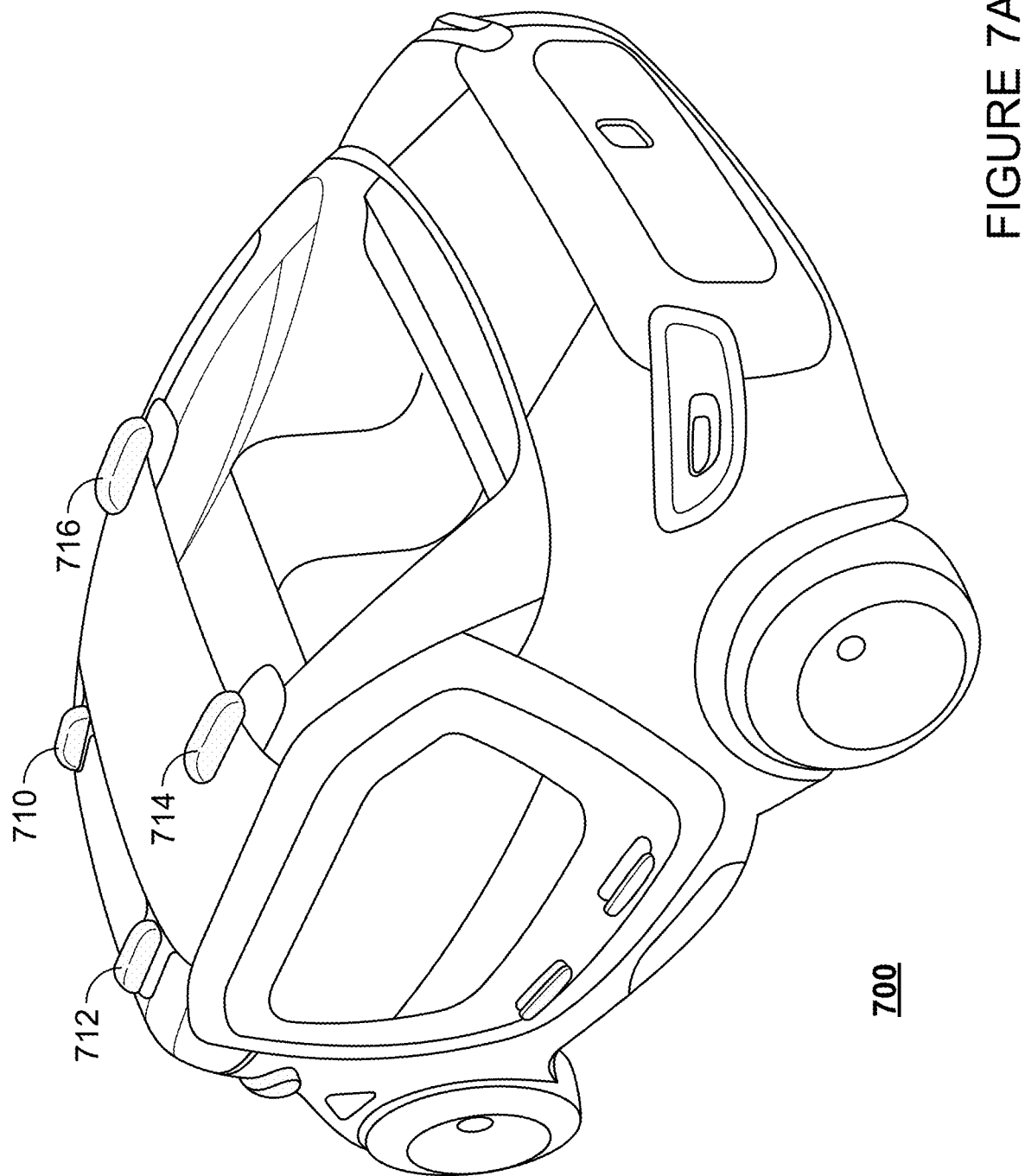
FIG. 7A is an example exterior view of a vehicle in accordance with aspects of the disclosure.
Figure 7B:
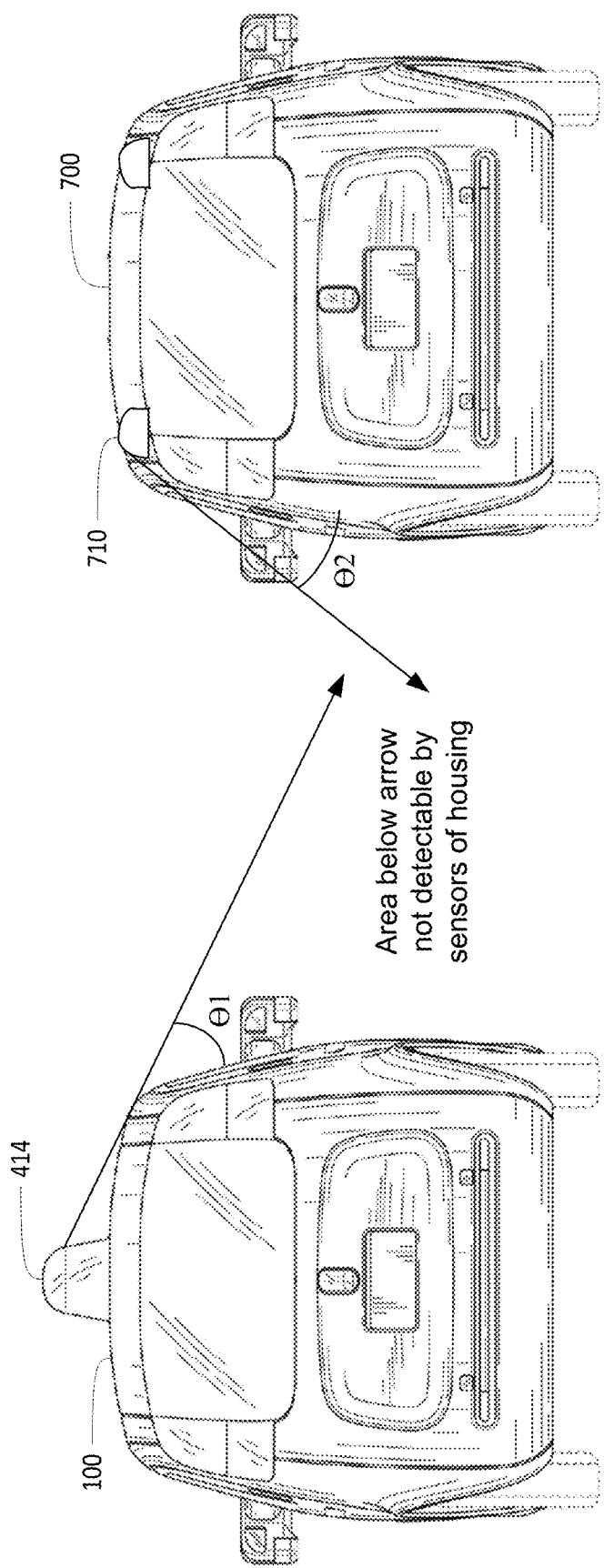
FIG. 7B is example exterior views of vehicles in accordance with aspects of the disclosure.

FIG. 7A is an example exterior view of a vehicle 700 that may be configured similarly to vehicle 100. In this example however, rather than a housing 414 arranged approximately at the center of the roof as with vehicle 100, vehicle 700 includes 4 housings 710-716 fixed proximate to the edges, here the four corners, of the roof 730. By moving the sensors to the corners of the roof, this increases the field of view of the sensors below the roof. In other words the area below the roof of the vehicle which the sensors of the housing are unable to view because of the angle of the limits of the sensor field relative to the roof line is narrower as can be seen in FIG. 7B. In this example, ⊖1, corresponding to the angle between housing 414 and the side of vehicle 100 is greater than ⊖2, corresponding to the angle between one of the housings 710 of vehicle 700. This also means that the housings 710-716 need not be as tall as the housing 414 which can have an impact on the aerodynamics as well as the aesthetic appeal of the vehicle. This type of configuration is even more useful for wider and/or longer vehicles, where the housing for the sensors would have to be even higher in order to have an acceptable angle ⊖1.

Figure 8A:
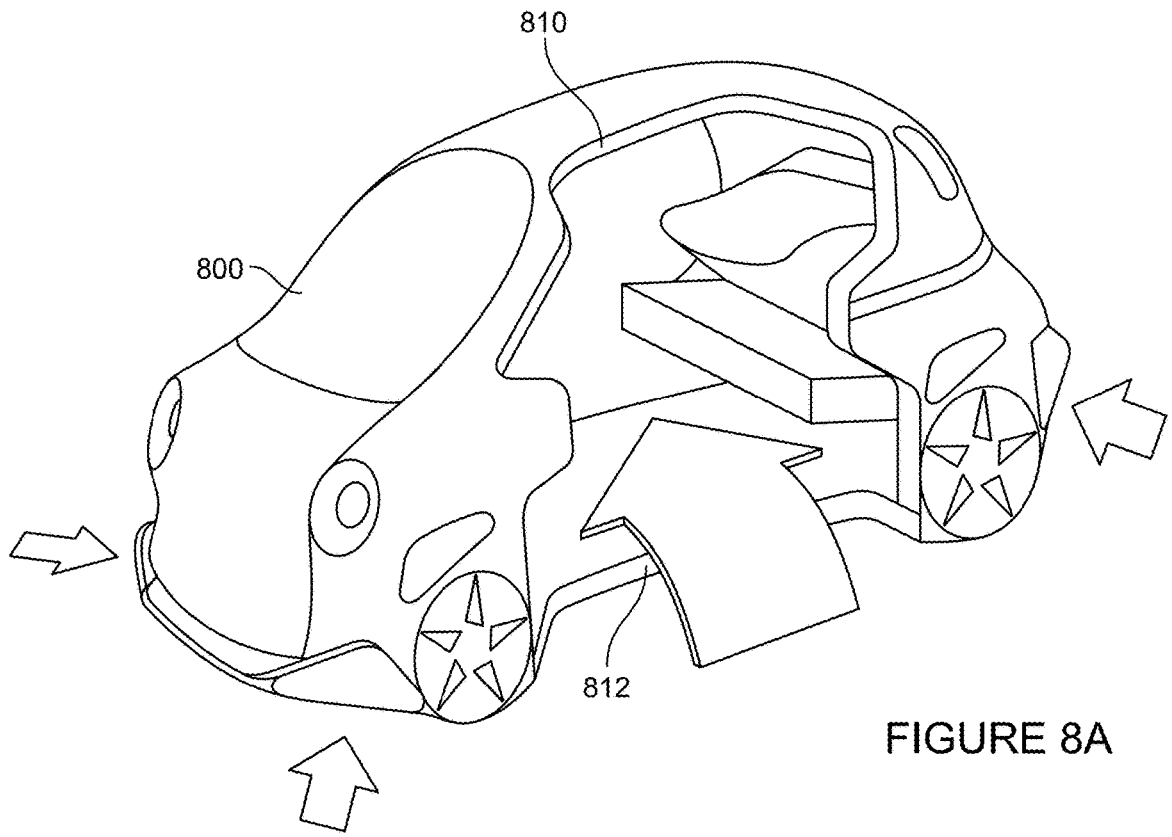
FIG. 8A is an example exterior view of a vehicle
Figure 8B:
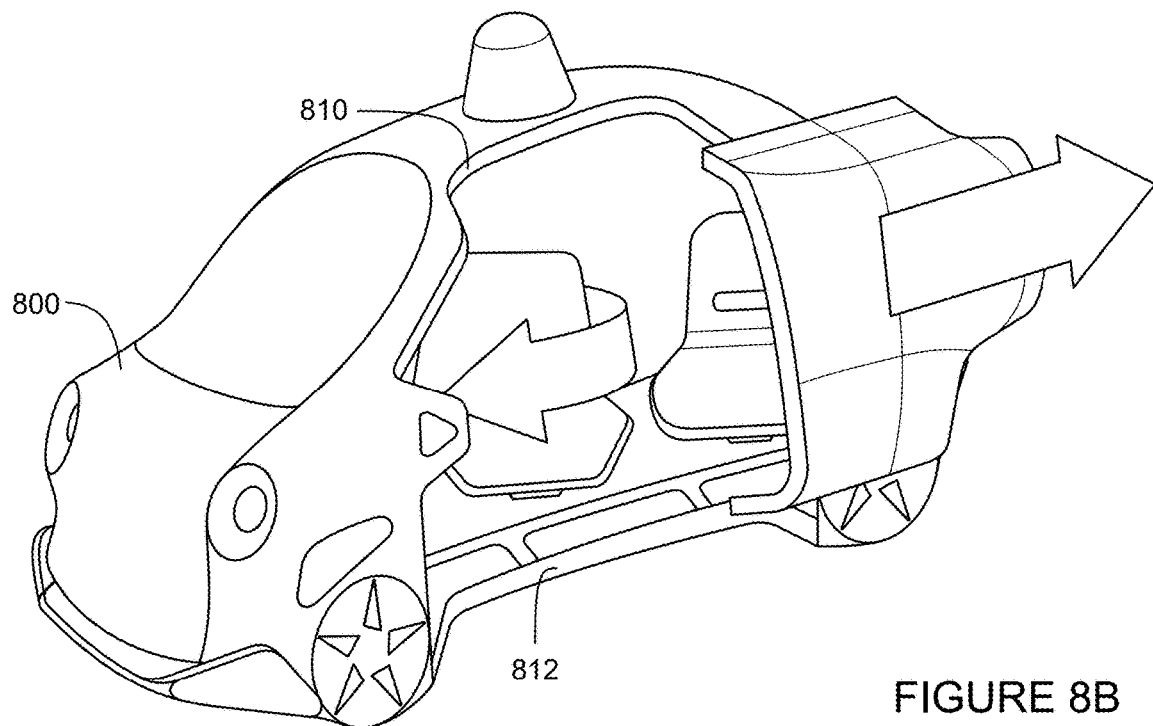
Figure 8F:
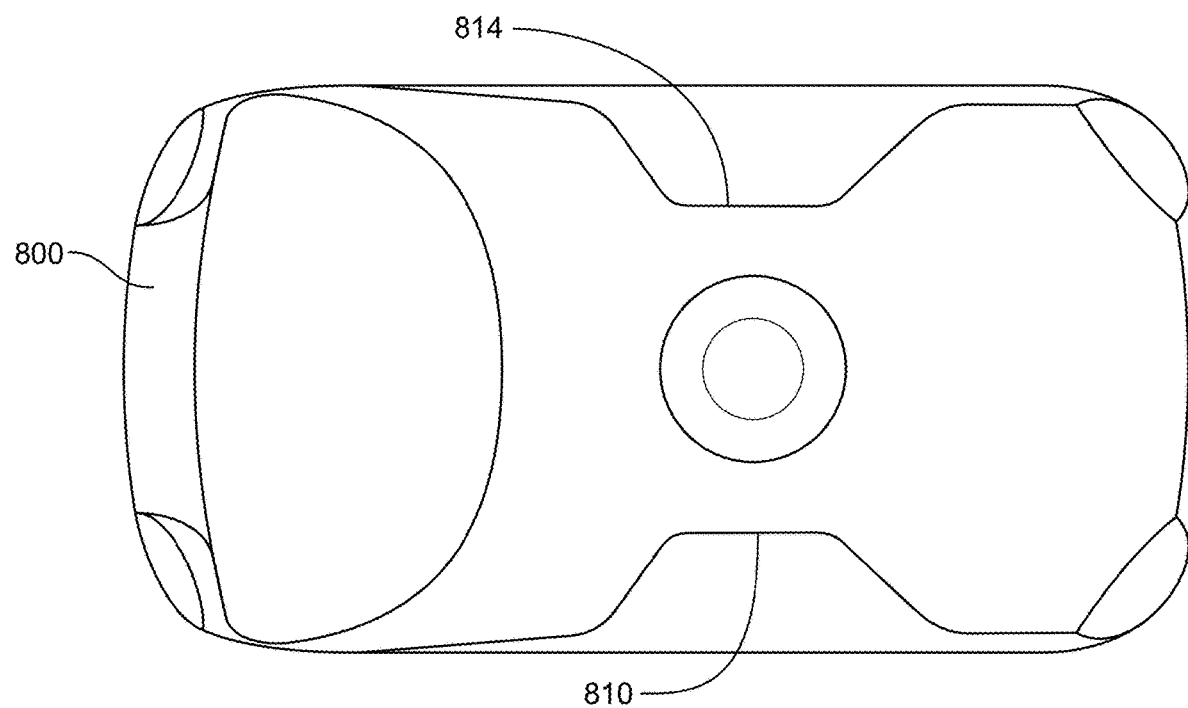
FIG. 8F is a top-down view of vehicle in accordance with aspects of the disclosure.
Figure 8G:
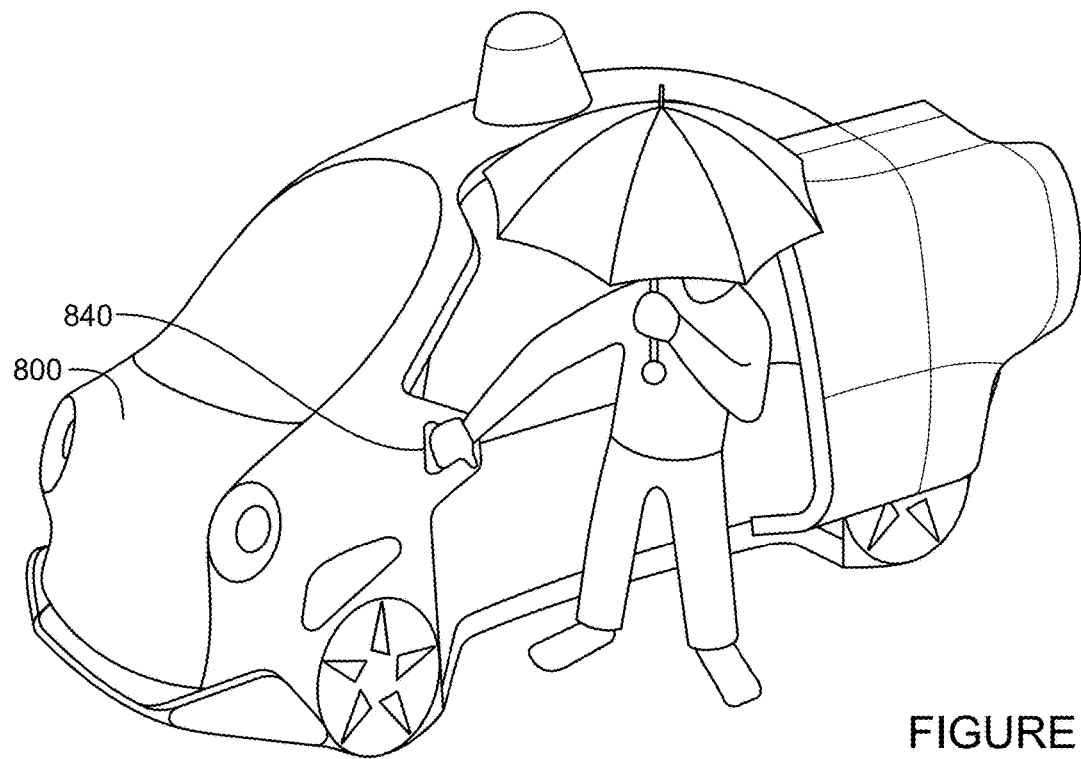
FIG. 8G is an example external view of a vehicle in accordance with aspects of the disclosure.

FIG. 8A is an example external view of a vehicle 800 that may be configured similarly to vehicle 100. In this example however, the roof and the floor of the vehicle 800 include notches 810 and 812, respectively. These notches allow for better ingress and egress for a passenger and may be arranged to avoid extending into the frame structure of the vehicle (to maintain the structural integrity of the vehicle) and also the battery and electrical configuration of the vehicle. FIGS. 8B-8D are examples of a first door configuration, where door 820 is shaped to complement the notches, and opens by pulling away from the notches 810, 812 and subsequently sliding along the outside of vehicle 800. FIG. 8E is an example of a second door configuration, where door 830 opens by splitting into two sections, section 832 and 834, and pivoting with respect to the notches 810, 812. FIG. 8F is a top-down view of vehicle 800 depicting the notch 810 as well as a second notch in the roof of the vehicle 814 that corresponds to an opposing side of vehicle 800. In this regard, vehicle 800 may have at least two openings for ingress and egress. As shown in FIG. 8G, vehicle 800 may also include features to assist the passenger in entering and exiting the vehicle such as handle bars 840 which, as shown in this example, may be integral to the side of the vehicle 800 and may appear only when the door or doors of the vehicle 800 are open.

Figure 9:
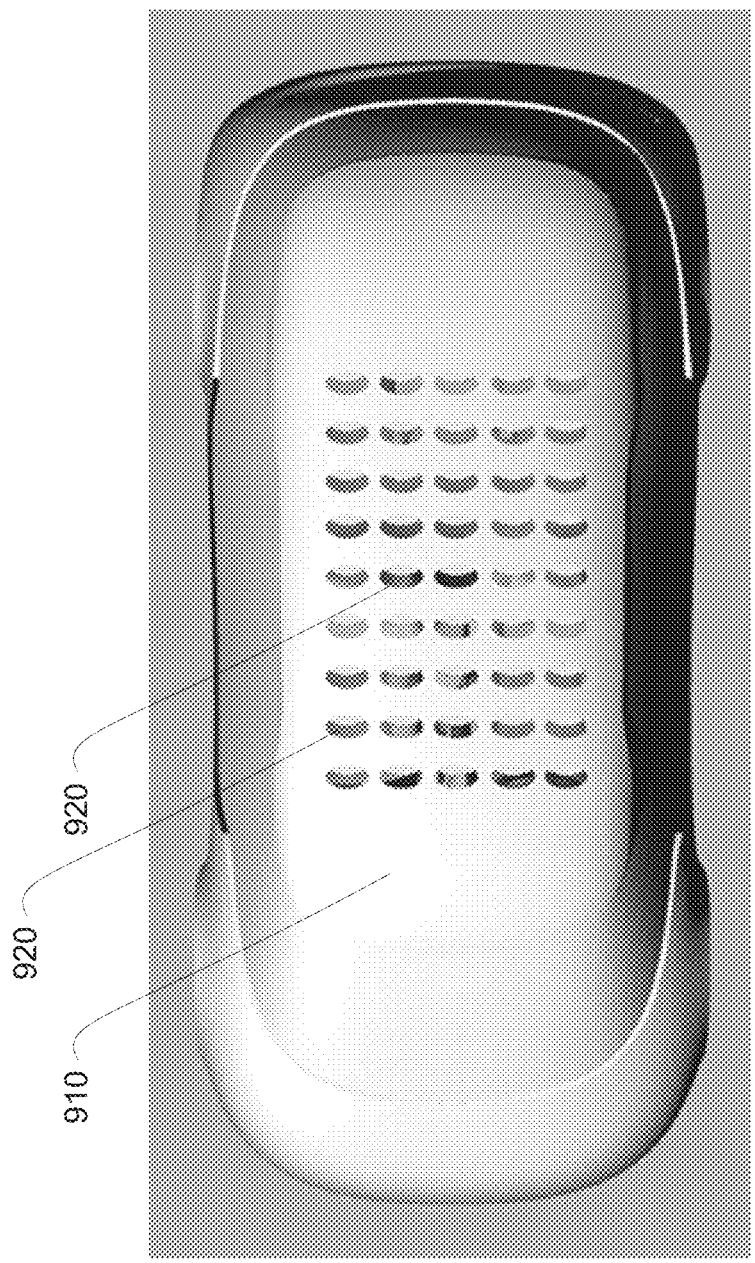
FIG. 9 is an example external top-down view of a vehicle in accordance with aspects of the disclosure.

FIG. 9 is an example view of a vehicle 900 that may be configured similarly to vehicle 100. In this example however, the roof 910 of vehicle 900 is configured to include a patterned sun roof. In this example, the patterned sunroof may include a plurality of openings 920, here 40 openings in total, in order to allow light into the vehicle. The openings may be configured as small open vents or small glass or plastic sheets arranged within a support structure and may each include its own shade (to reduce sun glare, etc. when needed). This configuration may allow for various aesthetically pleasing arrangements for a passenger riding within the vehicle. By using many smaller openings as opposed to a single larger opening in the roof, this configuration may be a structural improvement over a typical sun roof and because it does not require a huge hole, it may also be more cost effective. Alternatively, the roof may be one larger sheet of glass or plastic with an opaque cover that includes a plurality of openings in order to allow light to pass through the openings.

Figure 10:
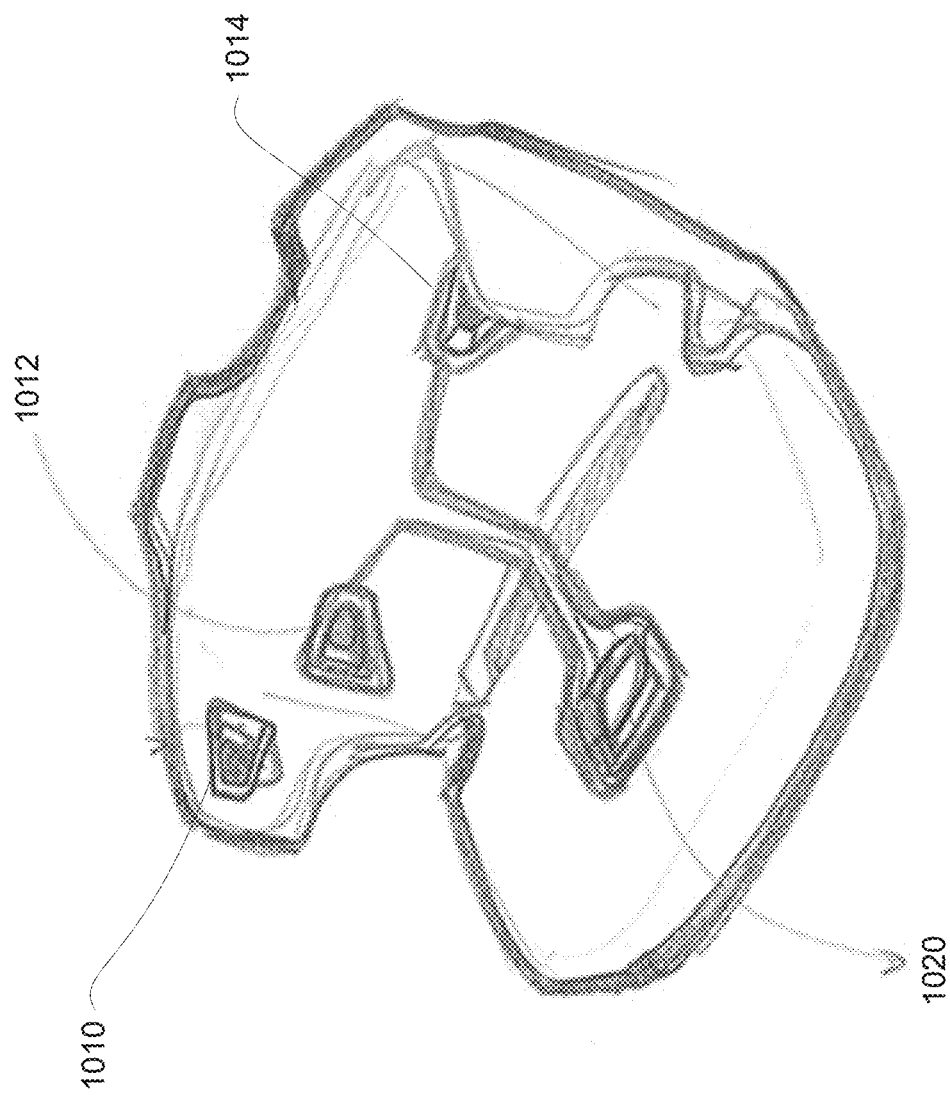
FIG. 10 is an example of a bench seat for passengers of a vehicle in accordance with aspects of the disclosure.

FIG. 10 is an example of a bench seat 1000 for passengers of a vehicle such as vehicle 100. In this example, the bench seat 1000 includes integrated speakers 1010-1014 positioned to be proximate to at least one of a passenger's ears and back. In addition, the bench seat includes an inductive charging surface 1020 also integrated into the bench seat 100 to allow for convenient charging of a passenger's devices. Alternatively or in addition, the inductive charging surface may include an additional speaker.

Figure 11A:
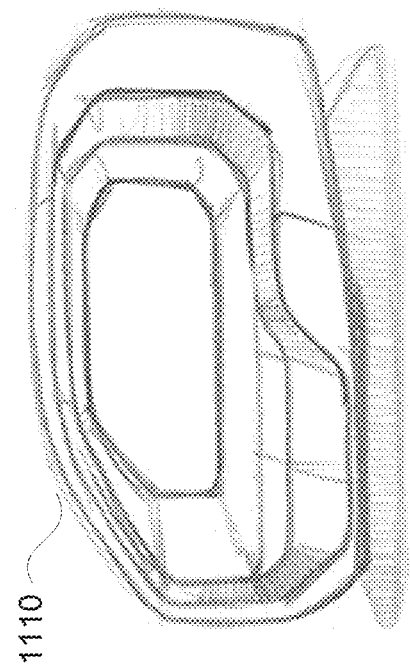
FIGS. 11A and 11B are example views of a modular interior for a vehicle in accordance with aspects of the disclosure.
Figure 11B:
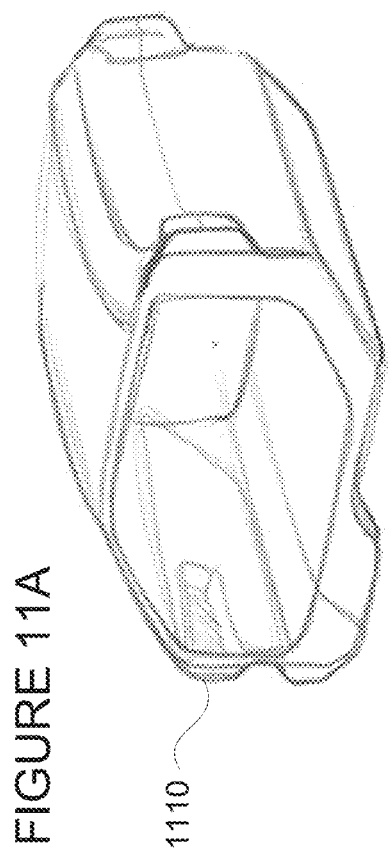
Figure 11C:
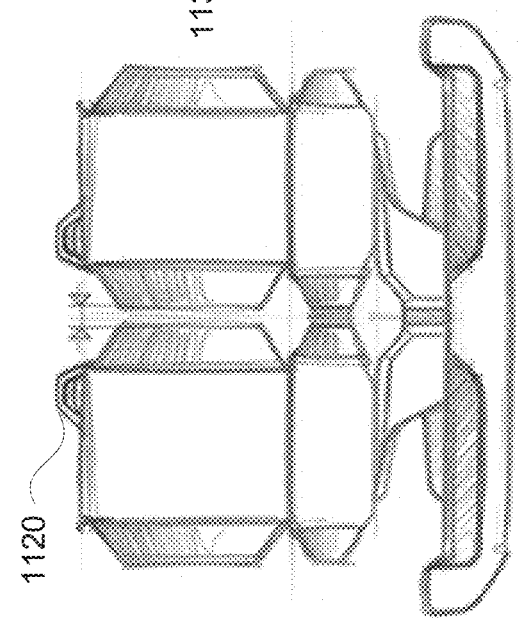
FIG. 11C is an example of a second modular interior for a vehicle in accordance with aspects of the disclosure.
Figure 11D:
FIG. 11D depicts a third modular interior for a vehicle in accordance with aspects of the disclosure.

FIGS. 11A and 11B are example views of a modular interior 1110 for a vehicle such as vehicle 100. The modular interior may be configured to slide into and out of a body of vehicle 100 (not shown) and connect with the computing devices of the vehicle 100. FIG. 11C is an example of a second modular interior 1120 and FIG. 11D depicts a third modular interior 1130. These modular configurations allows for easy cleaning and reconfiguration of the interior of the vehicle, without rendering the vehicle completely out of commission for too long. For instance, if a cleaning is needed, the modular interior 1110, 1120, or 1130 may be unlocked, slid transversely relative to the vehicle, and removed. In addition, a new or different modular interior may be slid transversely relative to the vehicle into position and locked in place.

Figure 12A:
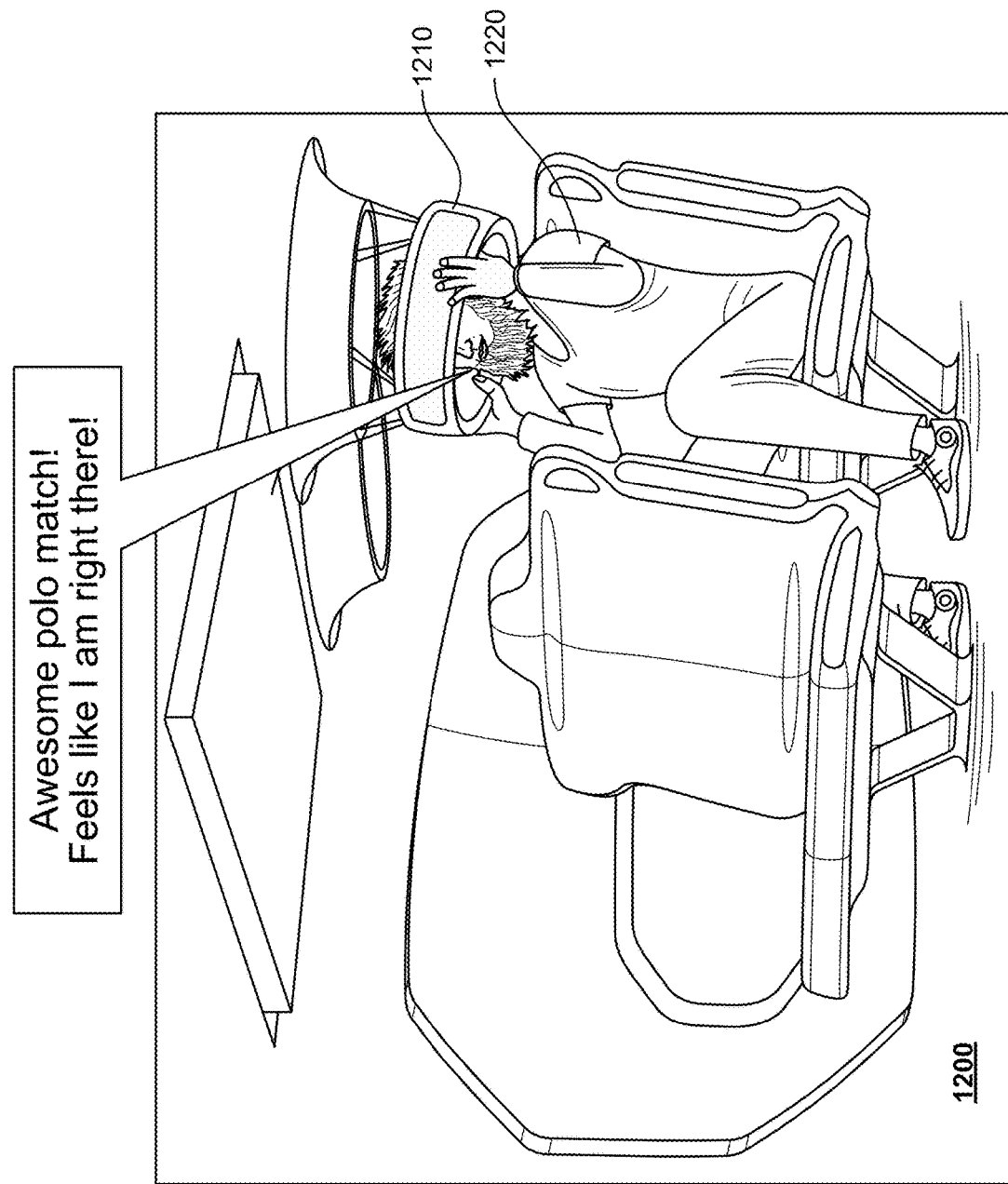
FIGS. 12A and 12B are example views of an interior a vehicle in accordance with aspects of the disclosure.
Figure 12B:
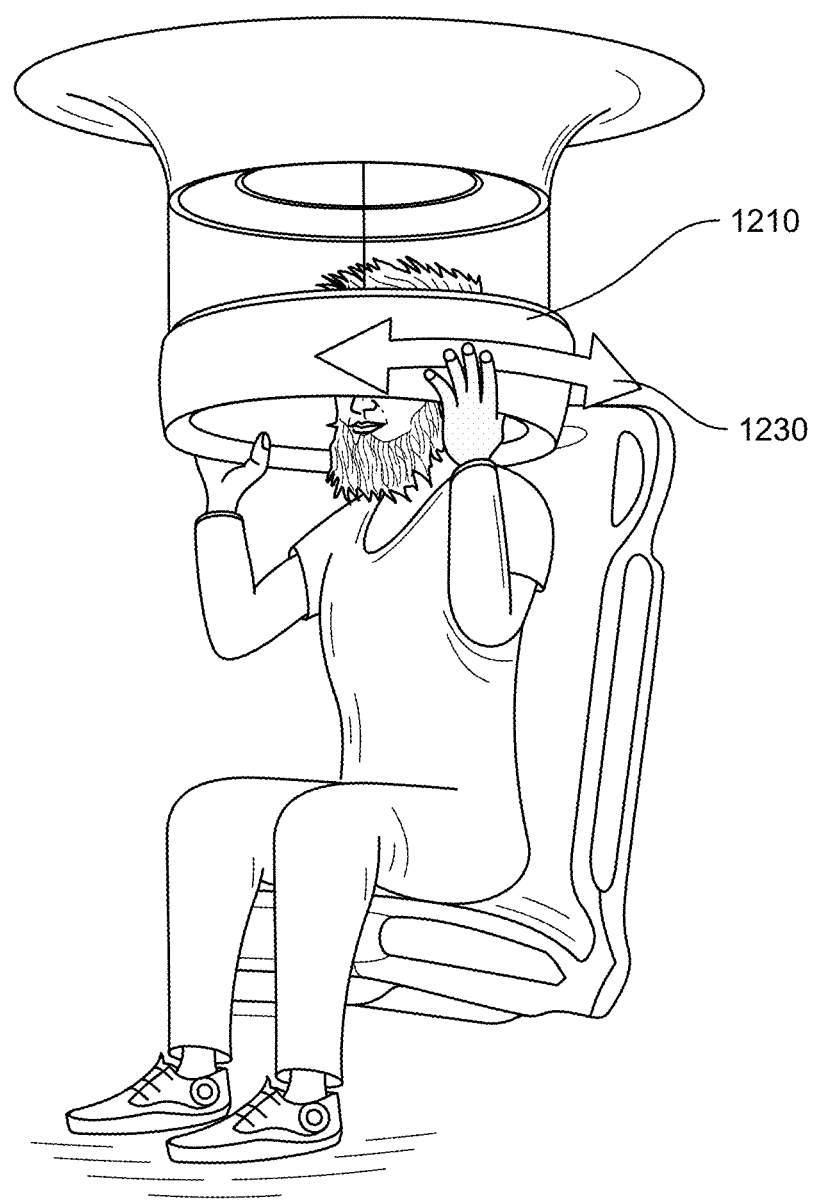

FIG. 12A is an example view of an interior a vehicle 1200 that may be configured similarly to vehicle 100. In this example, the vehicle 1200 includes a "periscope" feature 1210 that descends towards the head of a passenger, such as passenger 1220. The periscope feature 1210 may provide an immersive augmented reality display. As indicated by arrow 1230 of FIG. 12B, the passenger may be afforded 360 degree views by simply rotating the periscope. The display may provide information about the vehicle or what the vehicle's perception system detects around the vehicle or other information such as 360 degree views of landscapes, gaming, or movie experiences as provided by the computing devices 110.

FIGS. 13A and 13B are example views of an interior of a vehicle 1300 that may be configured similarly to vehicle 100. In this example, a table component 1320 may extend away from the dashboard of the vehicle to allow passengers to work or play, for instance using a display 1310, while riding in the vehicle. The display 1310 may be an electronic display, projection screen, or other type of display. This functionality may be controlled manually by a passenger pushing down on the display or automatically by the computing devices 110 based on whether or not the display is currently needed. The table component may also include one or more pop-up speakers 1340. As shown in FIG. 13C, the pop-up speaker 1340 may be configured to change from an extended state 1342 to a compacted state 1344 and back again by a passenger pushing down on the speaker 1340.

FIG. 14 is an example view of an interior of a vehicle 1400 that may be configured similarly to vehicle 100. In this example, the vehicle includes a "floating" display 1410 positioned adjacent to the windshield 1430 and/or on the dashboard to provide information and interact with the passengers. The floating display 1410 may be an electronic display, projection screen, or other type of display. As shown in the example view, the floating display provides the passenger 1420 with information about what the vehicle's perception system is currently detecting in the environment as provided by the computing devices 110 based on information from the perception system 172. Such a configuration may be especially useful when teaching a passenger how to drive a vehicle, but can also provide augmented reality gaming and other viewing services.

FIGS. 15A and 15B are example views of a vehicle 1500 that may be configured similarly to vehicle 100. In this example, the vehicle includes a front hatch 1510 that includes the vehicle's hood (or engine compartment cover) 1512, the vehicle's windshield 1514, and at least a portion 1516 of the interior dashboard 1520 of the vehicle. FIG. 15A depicts the front hatch in the "closed" position, FIG. 15B depicts the front hatch in the "open" position, and FIG. 15C is a partial interior view of the vehicle 1500 depicting the interior configuration of the front hatch 1510. As can be seen, by including the windshield 1512 and also the portion 1514, the access to the vehicle's engine compartment 1530 is significantly greater than with typical hood configurations.

In addition, this configuration also allows for a larger, wider windshield with greater curvature than with typical vehicle windshields. For instance, FIG. 15D depicts a vehicle 1530 having a front hatch 1540 that includes the vehicle's hood (or engine compartment cover) 1542, windshield 1544, and at least a portion of the interior dashboard of the vehicle (not readily visible in FIG. 15D). Again, vehicle 1530 may be configured similarly to vehicle 100. FIG. 15D depicts the front hatch in the "closed" position. A view of the front hatch in the "open" position would appear similar to that depicted in FIG. 15B. As shown in FIG. 15D, the vehicle's windshield 1542 wraps further around the front end of the vehicle than typical vehicle windshields. In order to allow a greater width of the windshield relative to the width of the vehicle, A-pillar 1532 of vehicle 1530 has a smaller angle relative to the ground as compared to A-pillar 409 of vehicle 100 (depicted in FIG. 4B). This also changes the shape of the windshield and gives it much greater curvature or rather, a more arced cross-section in the horizontal direction than conventional windshield shapes such as windshield of FIG. 403 of FIGS. 4A and 4B.

When the shape of the windshield is changed in the aforementioned way, it becomes difficult or even impossible to use conventional pivoting windshield wipers to clear the windshield of water or debris. In other words, the degree of curvature of the windshield may make conventional pivoting windshield wipers unable to reach a sufficient area of the windshield which may be a safety or legal requirement in various locations. Accordingly, a track based wiper system may be employed.

FIG. 15E is a top down view of a windshield 1550, and FIG. 15F is a front three-quarter view of the windshield 1550. In this example, windshield which may be configured similarly to windshield 1544. That is, windshield 1550 may be incorporated into a front hatch, such as front hatch 1540. Alternatively, windshield 1550 may not be incorporated into a front hatch, or rather, may be separate from the hood of the vehicle.

In the example of FIGS. 15E and 15F, track 1552 is located below the windshield 1544 and extends along the entire length of the windshield to maximize the area cleared by wiper blade 1554. Although not shown, when windshield 1550 is incorporated into a front hatch, the track 1552 may actually be incorporated into the vehicle's hood as opposed to an area between the windshield and the hood as with conventional wiper blade configurations.

Wiper blade 1554 may be connected to connector 1556 which moves along the track 1552 from edge 1558 of the windshield in the direction of arrow 1560 and towards edge 1562. Once edge 1562 is reached, the connector 1556 reverses direction and moves along the track 1552 in the direction of arrow 1564 back towards edge 1558. The movement of the connector 1556 may be controlled by an electric motor or an engine that rotates a belt (not shown) within the track. The motor or engine may be controlled by the computing devices 110 according to whether debris or water is detected in the vehicle's environment, for instance by the perception system or a rain sensor, such as infrared sensors typically used on rain sensing windshield. The connector 1556 may be connected to the belt such that movement of the belt in the direction of arrow 1560 within the track moves the connector 1556 away from edge 1558 and towards edge 1562. Thus, reversal of the motor reverses the movement of the belt in a direction of arrow 1564 moves the connected 1556 towards edge 1558 and away from edge 1562. Alternatively, rather than a belt, a rack and pinion gear may be used by the motor or engine to control movement of the connector within the track. Although FIGS. 15E and 15F depict a single track below the windshield, a second track may also be positioned above the windshield. In this configuration, an additional motor or engine may be used to move a second connector within the second track using the belt or rack and pinion examples above. Alternatively, only one of the connectors at the track below the windshield or the second track may be controlled by a motor or engine such that the connector on the other track is pulled along by movement of the other.

Figure 16:
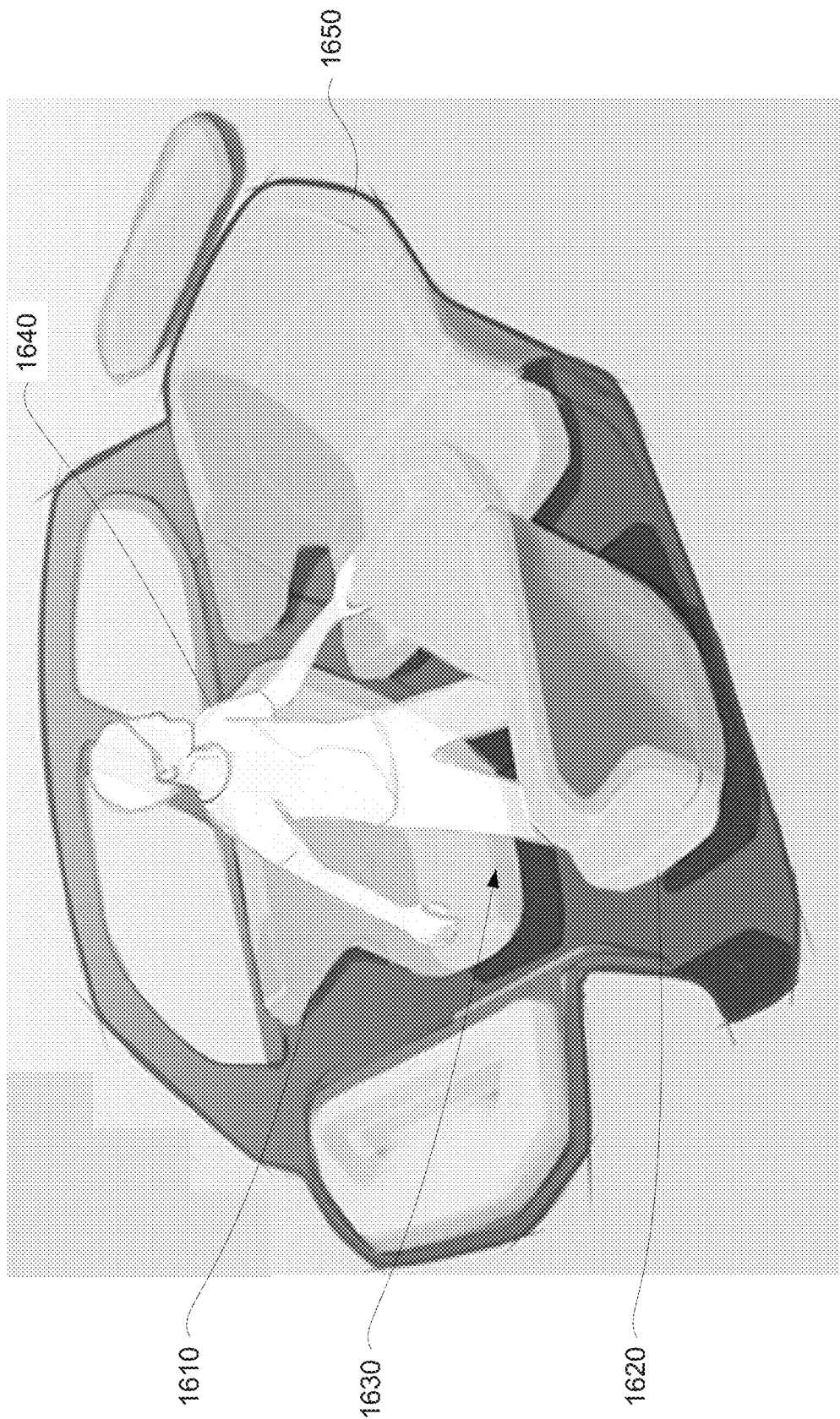
FIG. 16 is an example view of an interior of a vehicle in accordance with aspects of the disclosure.

FIG. 16 is an example view of an interior of a vehicle 1600 that may be configured similarly to vehicle 100. In this example, the configuration of the first or front row of seating, including seats 1610 and 1620 provides a space 1630. As shown in the view 1600, the space 1630 is wide enough to allow a passenger 1640 to pass between seats 1610 and 1620 of the front row and walk towards (and reach) the second or back row of seating that includes bench seat 1650.

Figure 17:
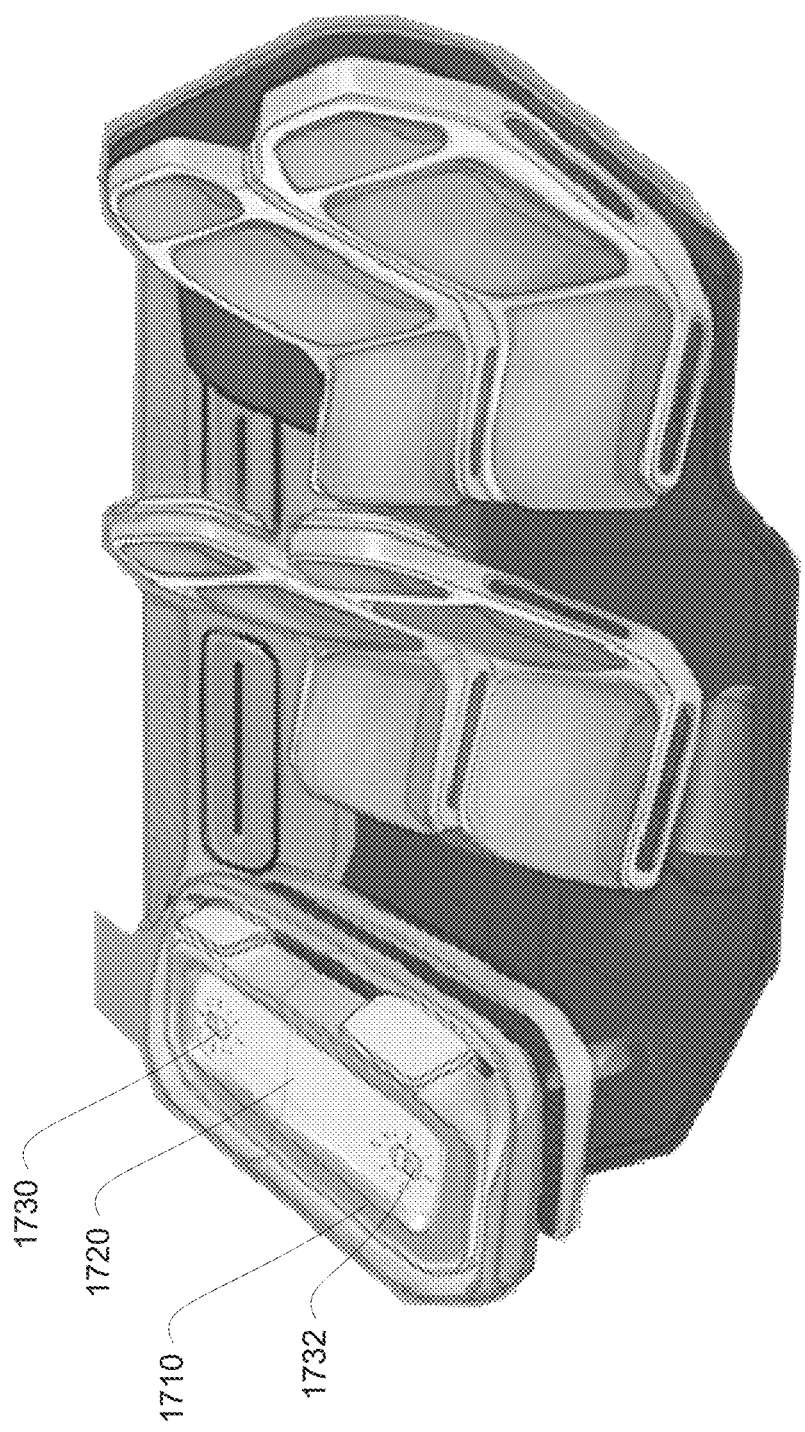
FIG. 17 is an example view of an interior of a vehicle in accordance with aspects of the disclosure.

FIG. 17 is an example view of an interior of a vehicle 1700 that may be configured similarly to vehicle 100. In this example, the dashboard 1710 includes a charging surface 1720 that may be an inductive charging surface that allows a passenger to easily charge his or her devices, for instance, devices 1730 and 1732. In addition, the charging surface 1720 may include (and be powered by) one or more solar panels (not shown).

FIG. 18A is an example view of an interior of a vehicle 1800 that may be configured similarly to vehicle 100. In this example, a back side 1810 of a front bench seat 1820 includes a display 1830 configured to display information to a passenger seated in the rear bench seat 1840. The display 1830 may be an electronic display, projection screen, or other type of display. As shown in FIGS. 18B and 18C, the display 1830 is connected to the front bench seat 1820 via two slots 1812, 1814. These slots allow the position of the display 1830 to be adjustable relative to the front bench seat 1820. For instance, as can be seen in FIG. 18C, the display 1830 can be adjusted up and down as well as tilted between positions 1832 and 1834 and various other positions in between. This functionality may be controlled manually or automatically by the computing devices 110.

Figure 19A:
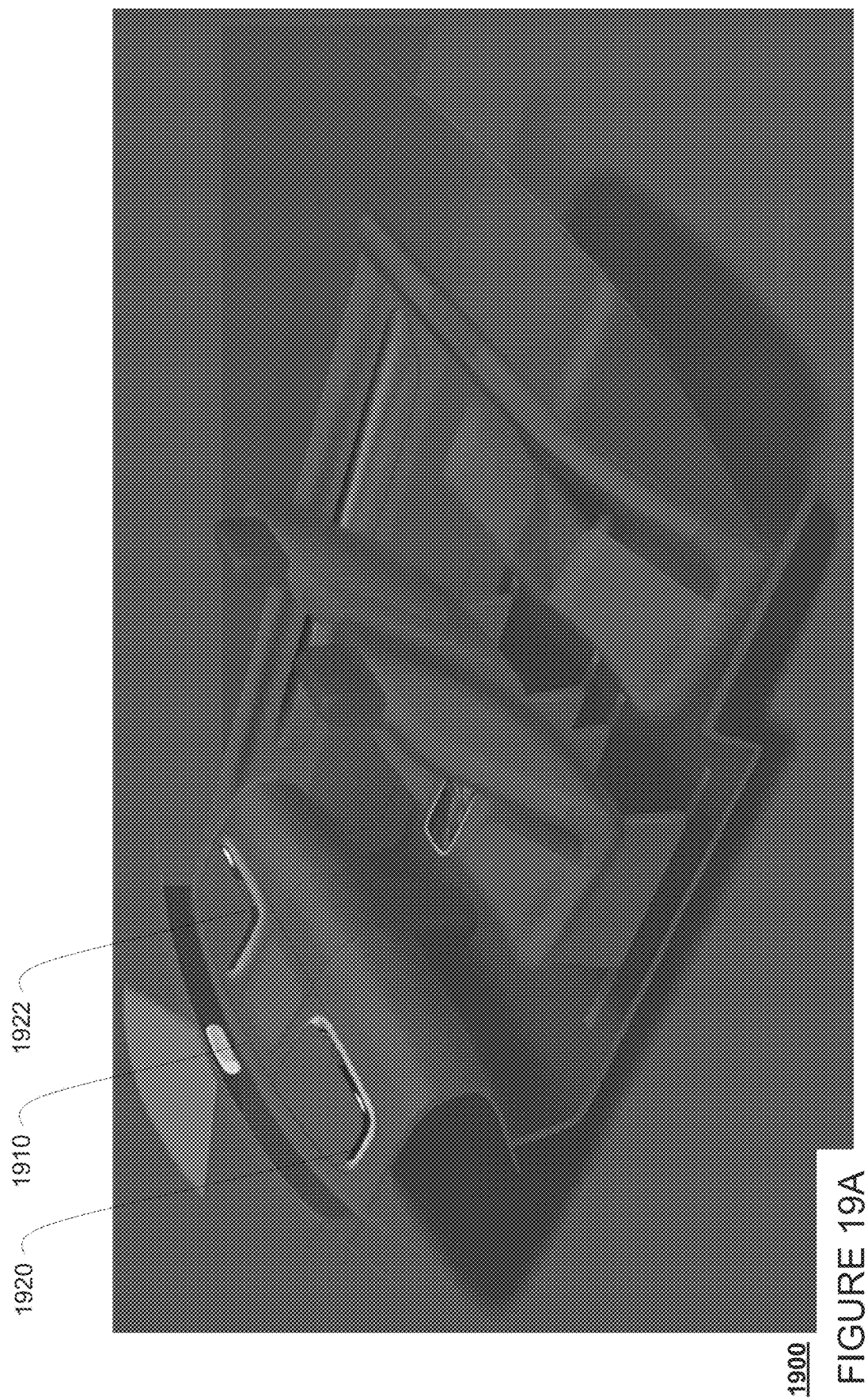
FIG. 19A is an example view of an interior of a vehicle in accordance with aspects of the disclosure.

FIG. 19A is an example view of an interior of a vehicle 1900 that may be configured similarly to vehicle 100. In this example, the dashboard 1910 includes pop-up air vents 1920, 1922. When not needed for heating or cooling, the vents may be "hidden" by dropping down into the dashboard 1910. Similarly, when needed for heating or cooling the vents may "pop-up" or extend up from the dashboard 1910, as shown in the view 1900. Alternatively or in addition, the vents 1920, 1922 may be or include pop-up speakers. FIGS. 19B and 19C are another example configuration of a hidden air vent (or speakers) 1930 depicted in an extended configuration in FIG. 19B and a dropped down or hidden configuration in FIG. 19C.

FIGS. 20A and 20B are an example seating configuration 2000 for a vehicle that may be configured similarly to vehicle 100. The seating configuration 2000 includes a headrest 2010 connected to an arm portion 2020 that is attached to a seat 2030. The arm portion includes an interior space configured to house a seatbelt 2040 for a passenger. As can be seen between FIGS. 20A and 20B, when the headrest 2010 is adjusted to accommodate a passenger, the arm portion 2020 moves with the headrest thereby changing the position of the seatbelt 2040. This allows the seatbelt to move to an appropriate location when a taller person who requires a higher headrest is in the vehicle, thereby increasing the effectiveness and comfort of the seatbelt as well as the safety of the vehicle. In this example, the seating configuration 2000 is a bench seat, though the aforementioned concepts may also be utilized with single-passenger seats.

FIG. 21A is an example view of an interior of a vehicle 2100 that may be configured similarly to vehicle 100. In this example, the dashboard 2110 includes a flip-up and flip-down display 2120 including a display surface 2122 for providing information an/or other media to a passenger of the vehicle. The display 2120 may be an electronic display, projection screen, or other type of display. The display may include a pivot joint that allows the display 2120 to pivot away and towards the dashboard 2110 as shown in FIG. 21B. When flipped completely down as shown in FIG. 21B, the display surface 2122 of the electronic display may appear integral to the dashboard 2110.

Figure 22B:
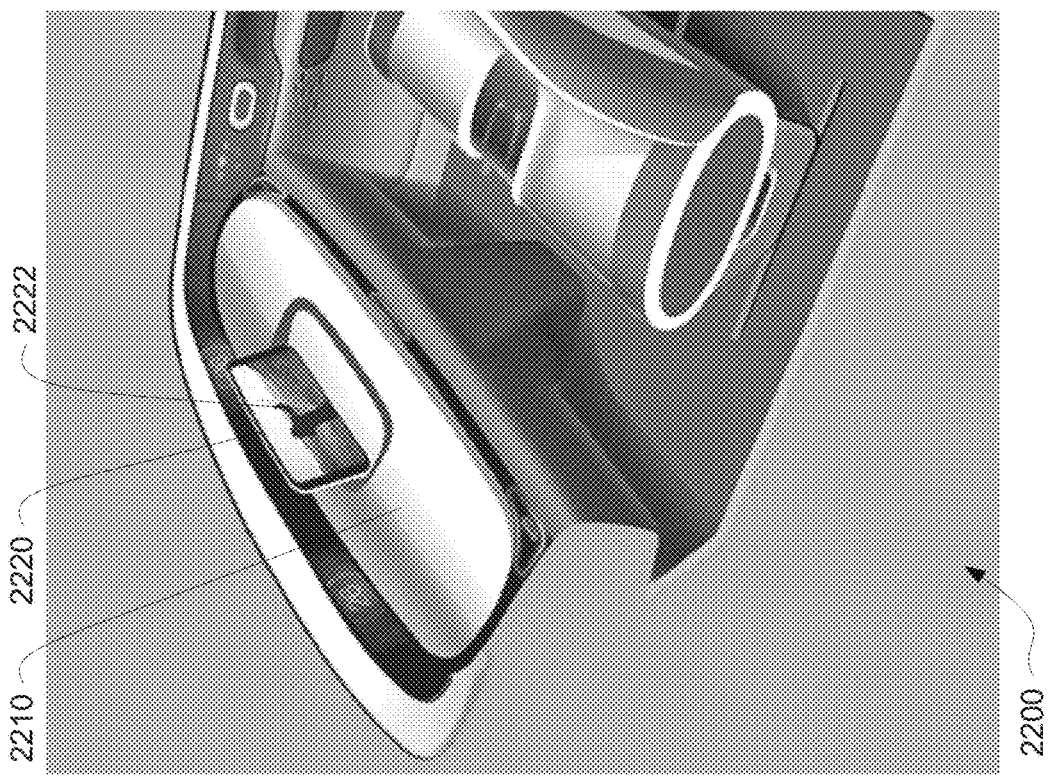
FIGS. 22A and 22B are example views of an interior of a vehicle in accordance with aspects of the disclosure.
Figure 22A:
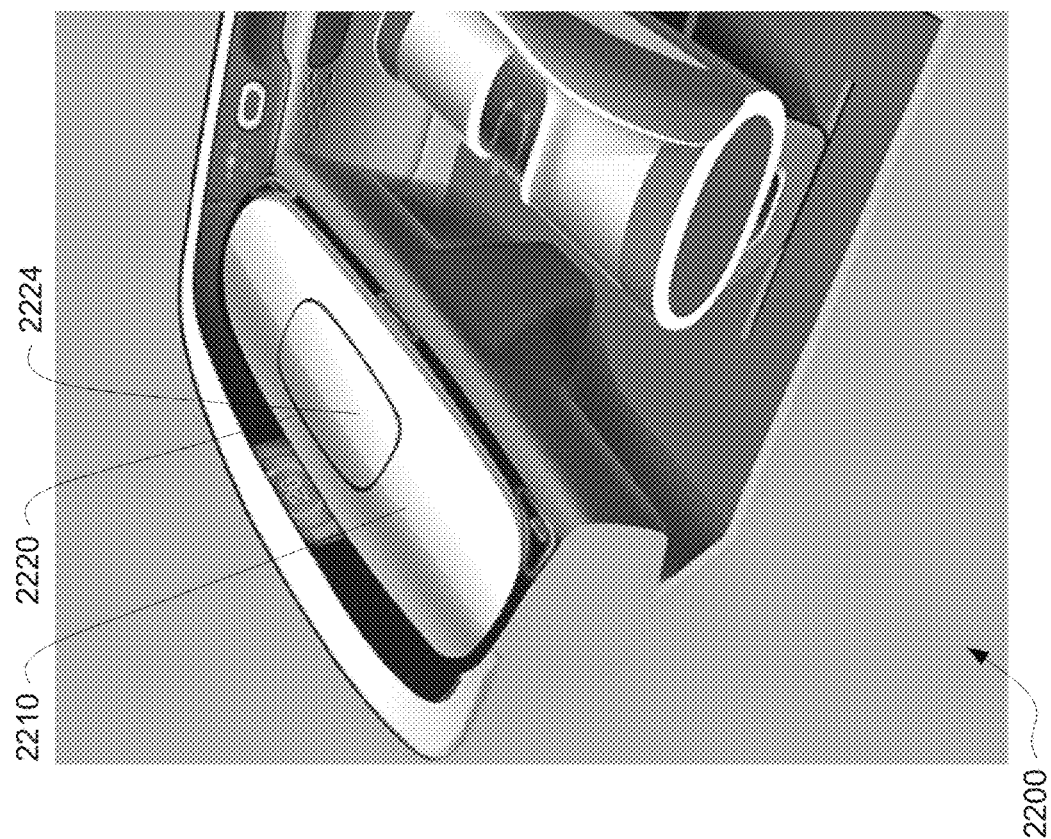

FIG. 22A is an example view of an interior of a vehicle 2200 that may be configured similarly to vehicle 100. In this example, the dashboard 2210 includes a pop-up and pop-down display 2220 including a display surface 2222 for providing information and/or other media to a passenger of the vehicle. The display 2220 may be an electronic display, projection screen, or other type of display. The display 2220 may include a pivot joint that allows the screen 2220 to pivot towards and away from the dashboard 2210 as shown in FIG. 22B. When flipped completely down as shown in FIG. 22B, a back side 2224 (as opposed to the display surface 2222) of the electronic display may appear integral to the dashboard 2210.

Figure 23B:
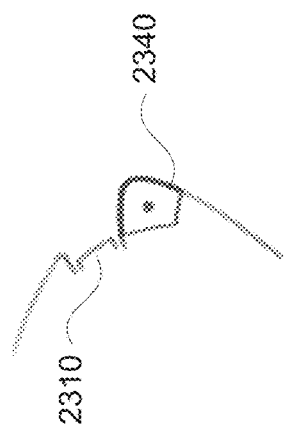
FIG. 23B is an example side sectional view of a connector panel in a closed state in accordance with aspects of the disclosure.
Figure 23D:
FIG. 23D is an example side sectional view of a connector panel in an open state in accordance with aspects of the disclosure.
Figure 23A:
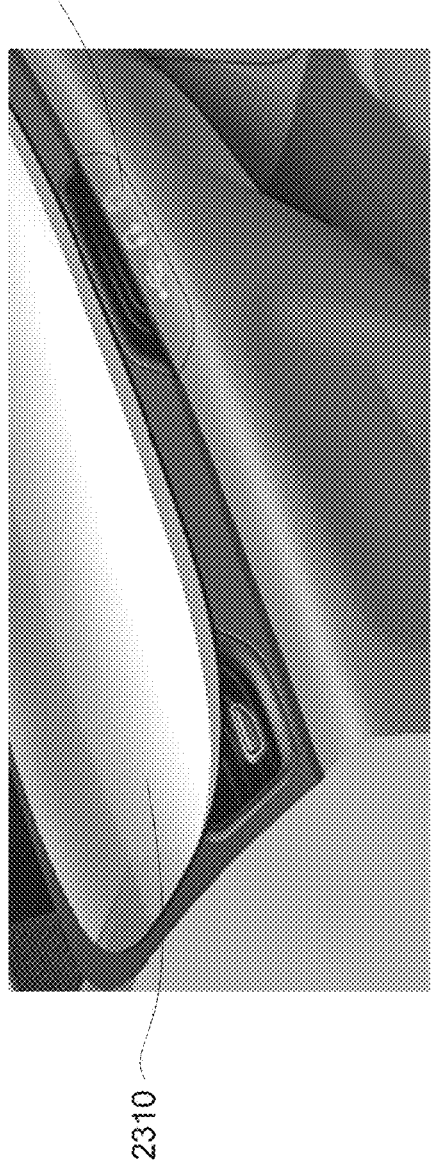
FIG. 23A is an example view of an interior of a vehicle in accordance with aspects of the disclosure.
Figure 23C:
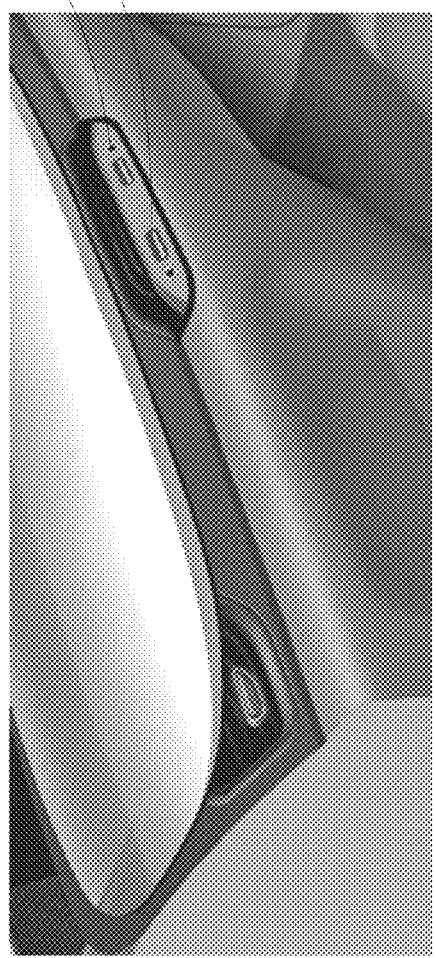
FIG. 23C is an example view of an interior of a vehicle in accordance with aspects of the disclosure.

FIGS. 23A and 23C are example views of an interior of a vehicle 2300 that may be configured similarly to vehicle 100. In this example, the dashboard 2310 includes a connector panel 2320 including a plurality of connectors 2330, such as audio jacks, USB, and/or other types of connectors, for connecting various devices or wires, for instance for charging or data exchange. FIG. 23B is a side sectional view of the connector panel in a closed state as shown in FIG. 23A, and FIG. 23D is a side sectional view of the connector panel in an open state as shown in FIG. 23C. The connectors are arranged within a rotating housing 2340 that rotates as indicated by arrow 2350 in order to change the configuration from the open to the closed state and back again.

Figure 24:
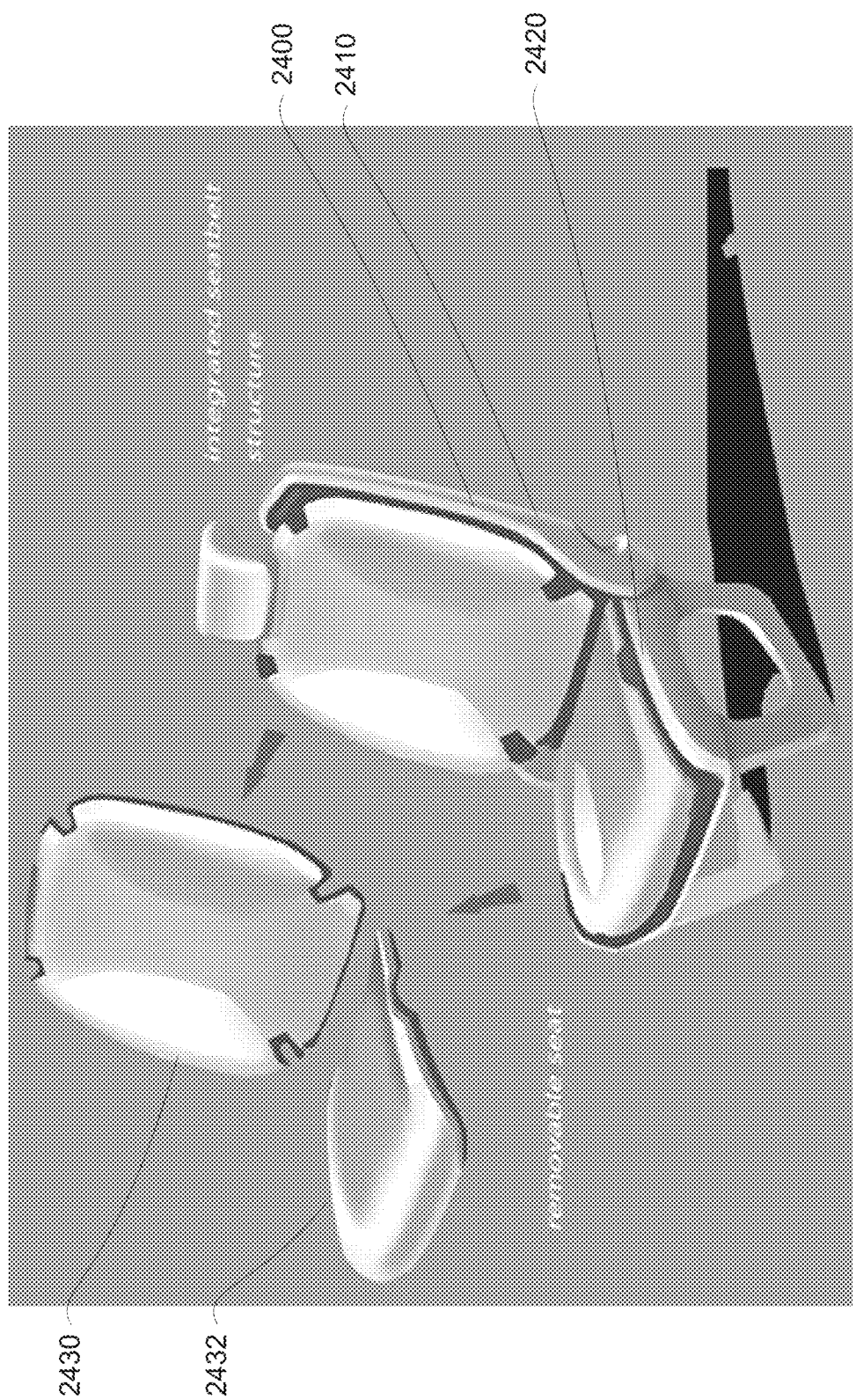
FIG. 24 is an example view of a seat in accordance with aspects of the disclosure.

FIG. 24 is an example view of a seat 2400 that may be used in a vehicle such as vehicle 100. In this example, the seat includes a seat back 2410 for supporting the back of a passenger and a seat cushion 2420 for supporting a lower portion of the passenger. The seat back and seat cushion are each configured with a removable cushion 2130 and 2132, respectively. These removable cushions may be attached and secured to the seat back and seat base for instance using four snaps or magnets. The snaps and removable cushions allow for easy replacement of worn, damaged or dirty seat cushions.

Figure 25:
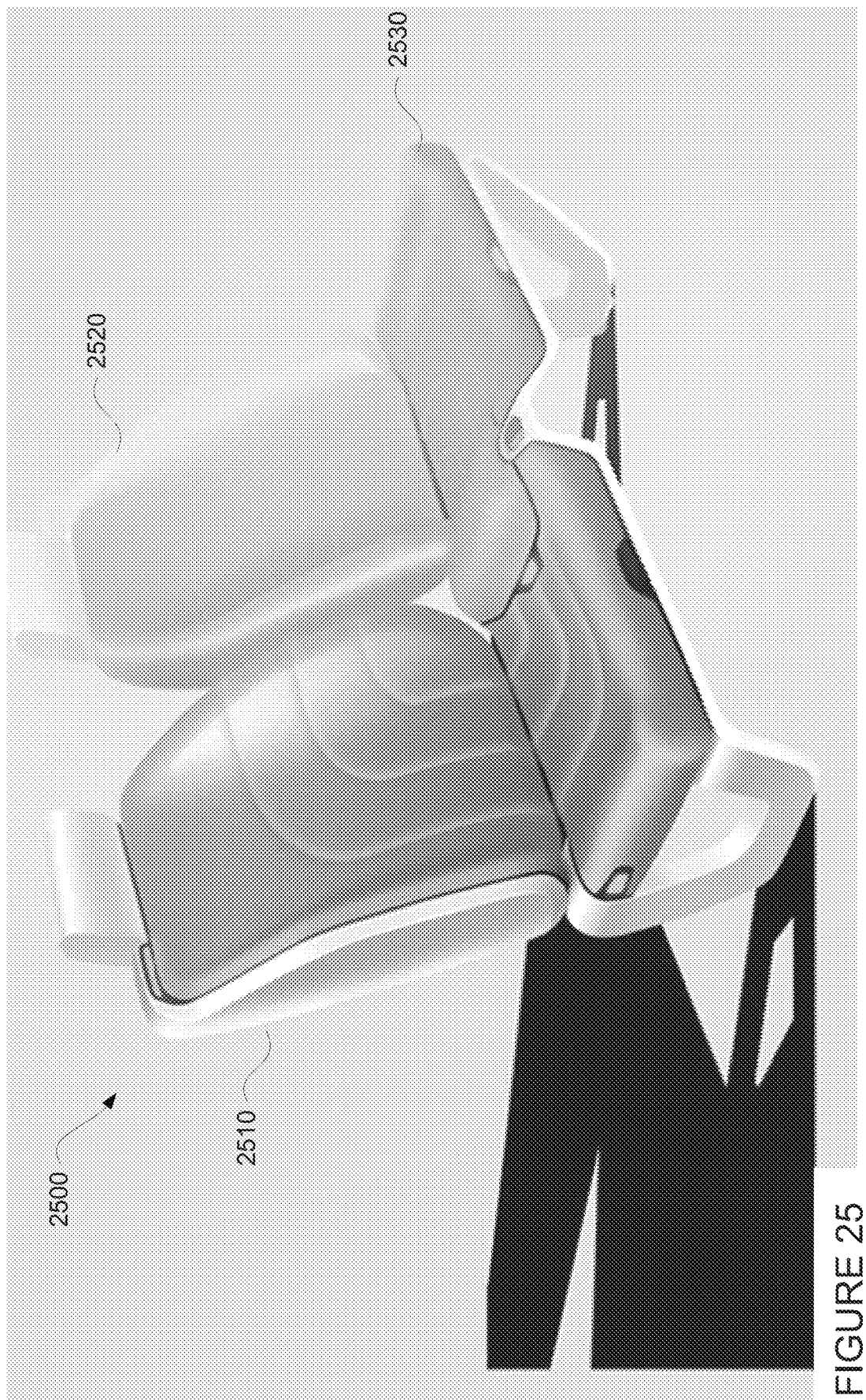
FIG. 25 is an example view of a hybrid bench seat in accordance with aspects of the disclosure.

FIG. 25 is an example view of a hybrid bench seat 2500 that may be used in a vehicle such as vehicle 100. In this example, the hybrid bench seat 2500 includes first and second seat backs 2510, 2520 for supporting the backs of two different passengers. Each of these seat backs are connected to a single seat cushion 2530. The seat cushion 2530 is configured as a bench seat so as to support the lower portions of both of the two different passengers. However, because of the hybrid nature of the hybrid bench seat 2500, the seat backs 2510 and 2520 can each be independently adjusted (pivoted) relative to the single seat cushion 2530.

Figure 26:
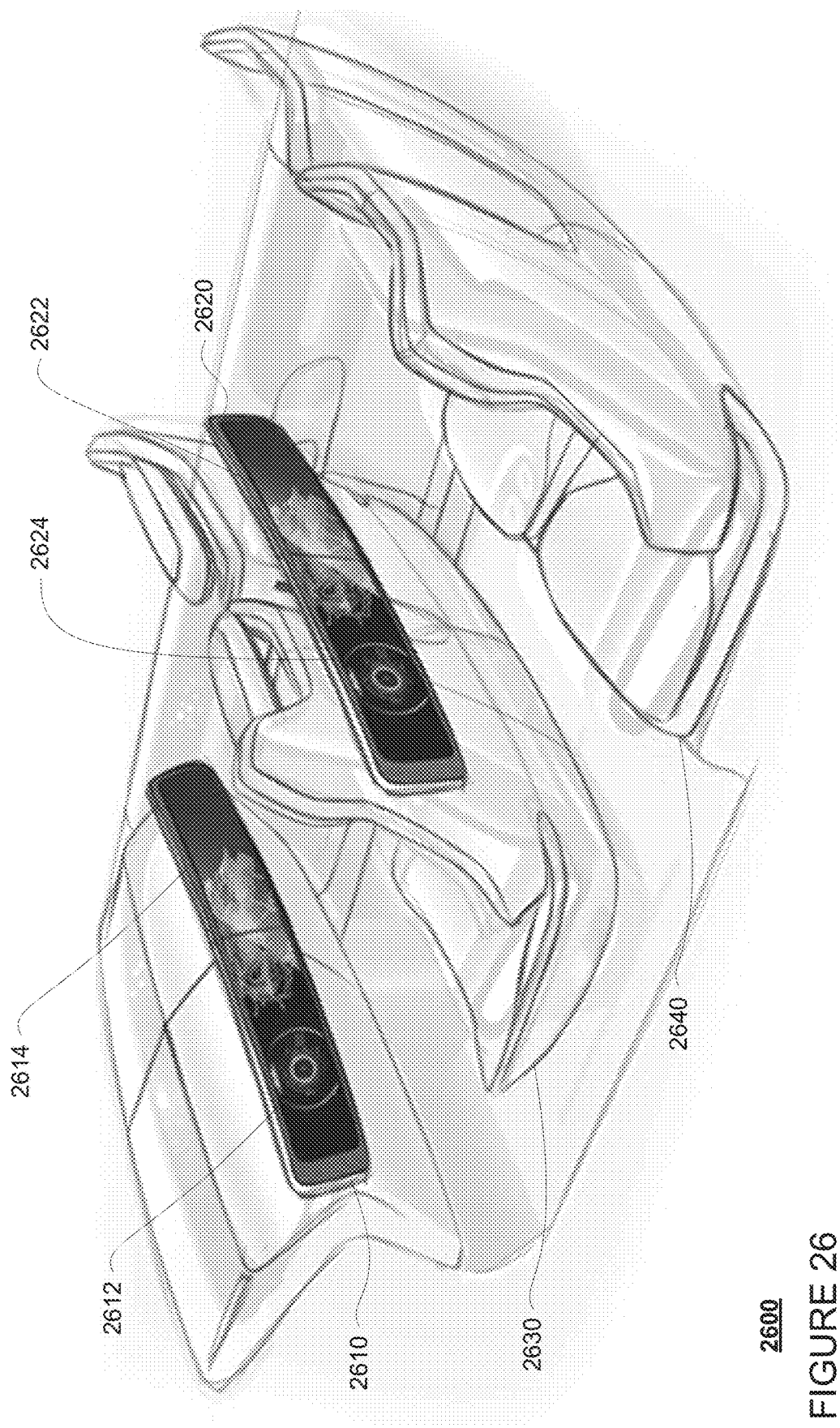
FIG. 26 is an example view of an interior of a vehicle in accordance with aspects of the disclosure.

FIG. 26 is an example view of an interior of a vehicle 2600 that may be configured similarly to vehicle 100. In this example, the vehicle 2600 includes front and rear panoramic displays 2610, 2620. Each of the panoramic display is a modular display in that it is actually formed from two smaller displays 2612, 2614, 2622, 2624. These smaller displays may be electronic displays, projection screens, or other type of displays. For instance, panoramic display 2610 is comprised of displays 2612 and 2614, while panoramic display 2610 is comprised of displays 2622 and 2624. In this regard, panoramic display 2610 may present a unified image to one or more passengers sitting in front row of seating 2630 or individual images on display 2612 and 2614 to each of the passengers sitting in the front row. Thus, the passengers in the front row can view the same image in a panoramic view, the same image on each of the displays 2612 and 2614, or different images on displays 2612 and 2614. Similarly, panoramic display 2610 may present a unified image to one or more passengers sitting in second row of seating 2640 or individual images on display 2622 and 2624 to each of the passengers sitting in the second row. Thus, the passengers in the front row can view the same image in a panoramic view, the same image on each of the displays 2622 and 2624, or different images on 2612 and 2624.

Figure 27:
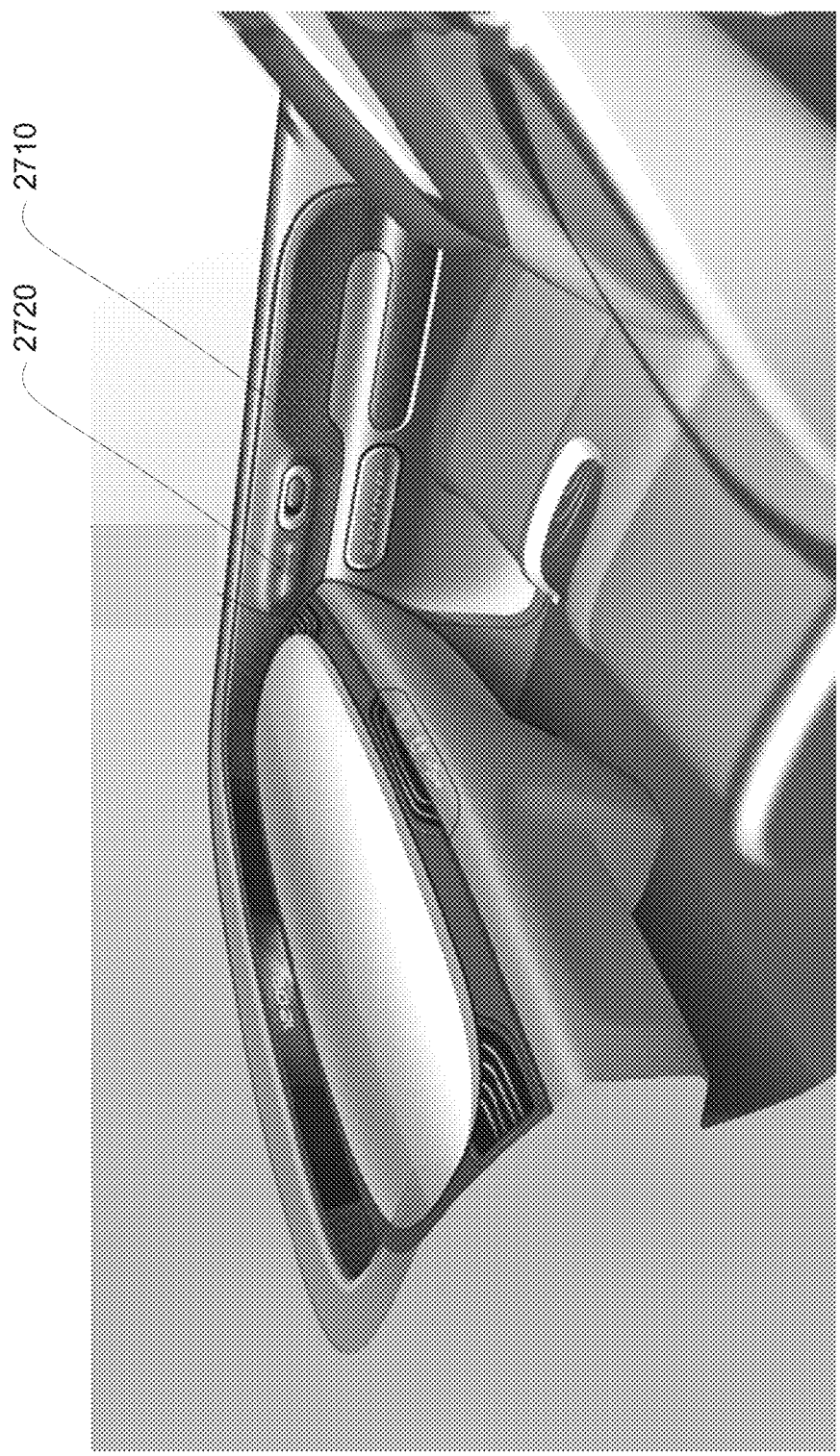
FIG. 27 is an example view of an interior of a vehicle in accordance with aspects of the disclosure.

FIG. 27 is an example view of an interior of a vehicle 2700 that may be configured similarly to vehicle 100. In this example, the interior door panel 2710 of a door of vehicle 2700 includes a light up indicator 2720. The light up indicator may indicate the state of the door, such as locked or unlocked, for instance using one or more lighted icons, text, etc. The light up indicator may simply indicate the state of the door, but in some instances, may also be a touch sensitive input, such as a pressure sensitive surface or hidden switch, that allows the passenger to change the state of the door from locked to unlocked and back. However, using an indicator without allowing the passenger to actually change the state of the door increases the safety of the vehicle while also giving the passenger a sense of security and understanding about the state of the door. For instance, the passenger may want to know whether the door is locked or not when in the vehicle when the vehicle is in a quiet or dark area, stopped, waiting for someone to join the passenger, etc.

Figure 28:
FIG. 28 is an example view of an interior of a vehicle in accordance with aspects of the disclosure.

FIG. 28 is an example view of an interior of a vehicle 2800 that may be configured similarly to vehicle 100. In this example, the dashboard 2810 may include one or more cup holders 2820. Each of cup holders 2820 includes a recess 2822 and a strap 2824. The strap may be comprised of an elastic or stretchable material that can stretch around a beverage container, such as a water bottle or soda can 2830, but is also strong enough to secure the cup within the recess. This allows for an inexpensive cup holder configuration that can accommodate an infinite number of cup configurations.

Figure 29B:
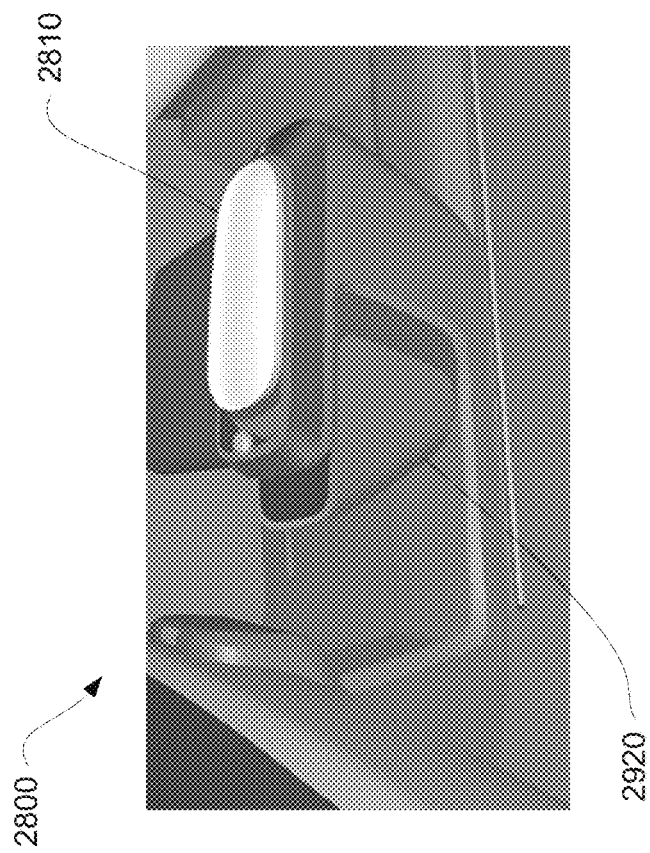
FIGS. 29A and 29B are example views of an interior of a vehicle in accordance with aspects of the disclosure.
Figure 29A:
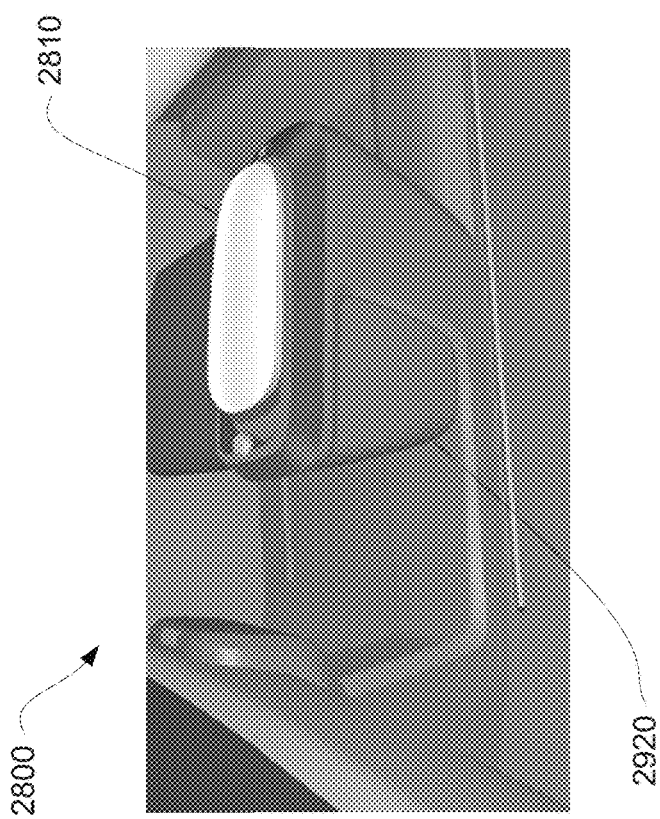

FIGS. 29A and 29B are example views of an interior of a vehicle 2900 that may be configured similarly to vehicle 100. In this example, the vehicle includes a center console 2910 that may be arranged between two seats (not shown) in a row of seating of the vehicle 2900. The center console may include a receptacle 2920 integrated into a lower portion of the center console configured to slide from a closed configuration as shown in FIG. 29A to an open configuration as shown in FIG. 29B. The receptacle may be used for storage or as a trash container.

Figure 30:
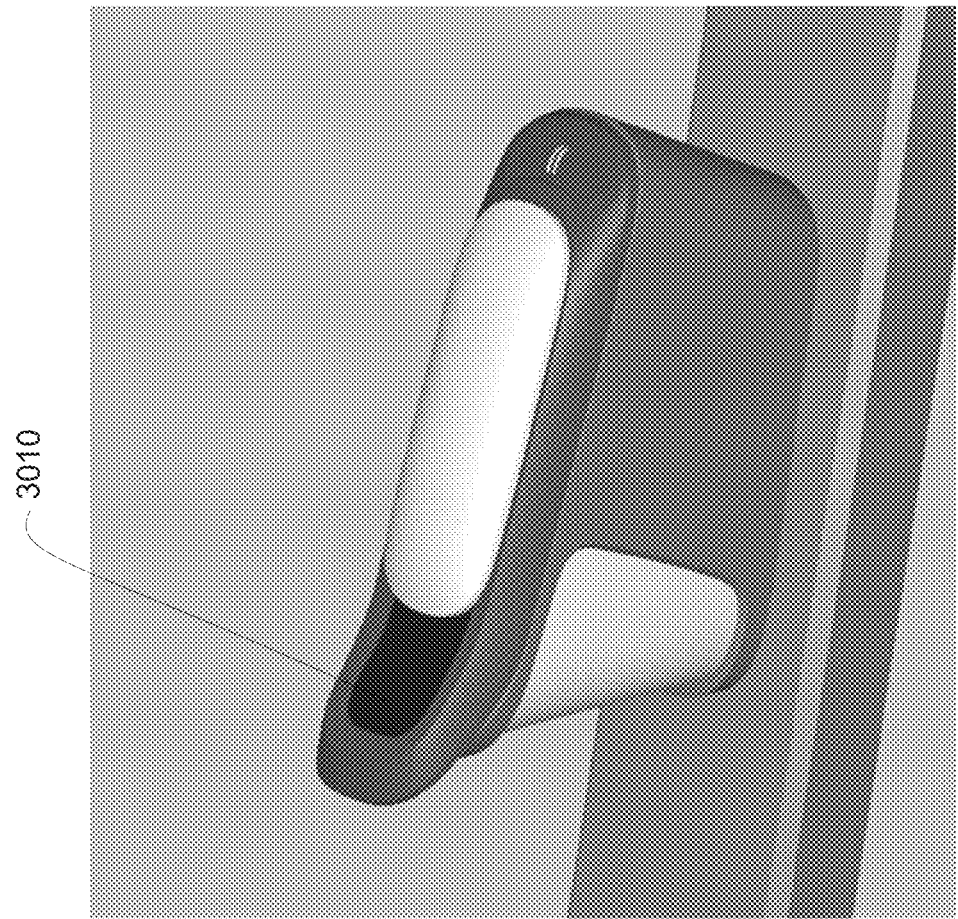
FIG. 30 is an example view of a center console in accordance with aspects of the disclosure.

FIG. 30 is an example view of a center console 3000 for a vehicle such as vehicle 100. The center console 3000 may be arranged between two seats (not shown) in a row of seating of the vehicle and may include a display 3010 for providing information and/or media to a passenger of the vehicle as provided by the computing devices 110. The display 3010 may be an electronic display, projection screen, or other type of display. In some examples, the display may be a touch-sensitive display that allows the passenger to make selections and provide user input to the vehicle to via the touch-sensitive display.

Figure 31:
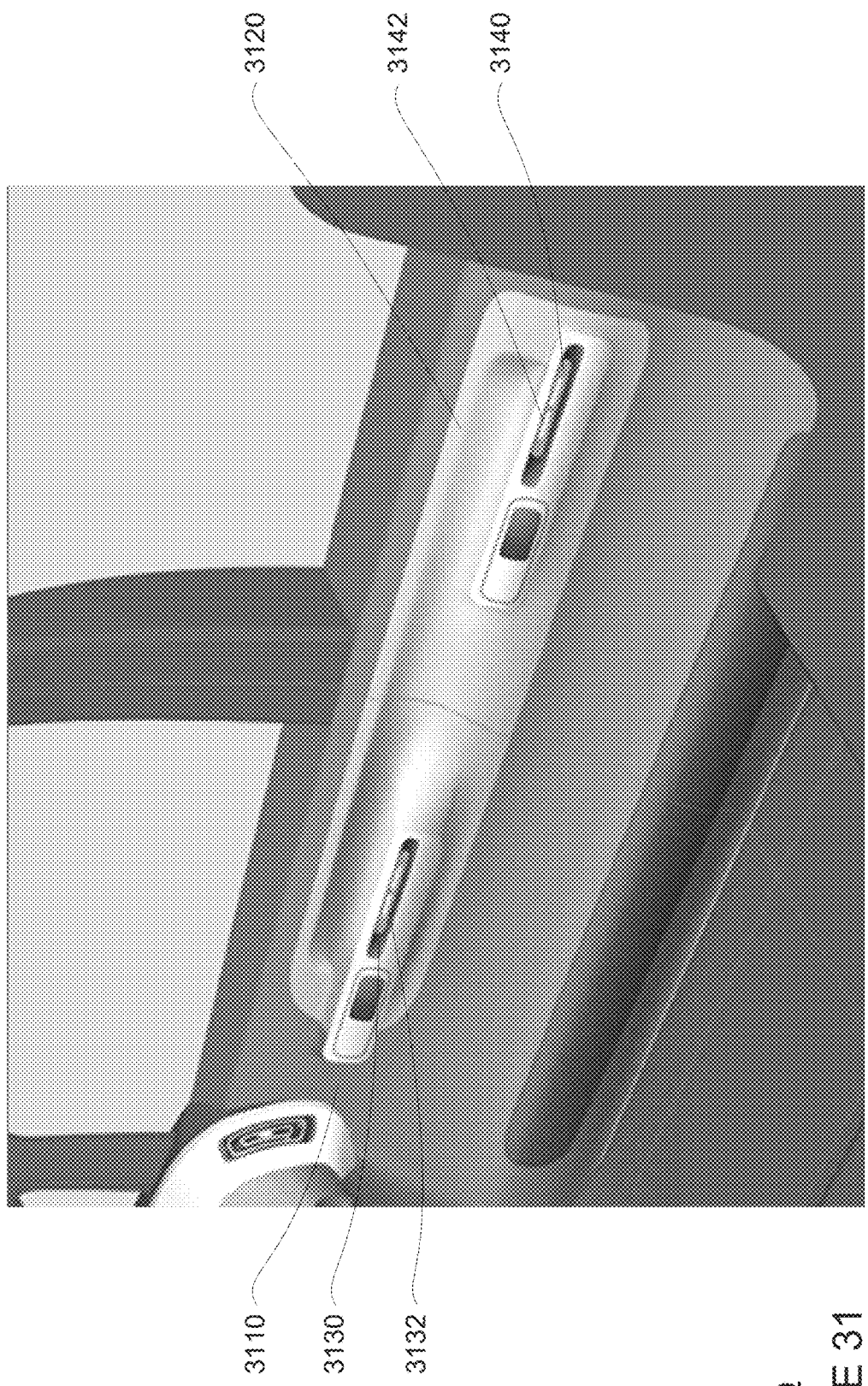
FIG. 31 is an example view of an interior of a vehicle in accordance with aspects of the disclosure.

FIG. 31 is an example view of an interior of a vehicle 3100 that may be configured similarly to vehicle 100. In this example, the door panels 3110, 3120 each include a connector panel 3130, 3140. The connector panels may include a plurality of connectors 3132, 3142, such as audio jacks, USB, and/or other types of connectors, for connecting various devices or wires, for instance for charging or data exchange. Because of the positioning of these connectors within the door panel, a passenger is less likely to forget or leave behind a device that was connected to the vehicle via the connector panel.

Figure 32B:
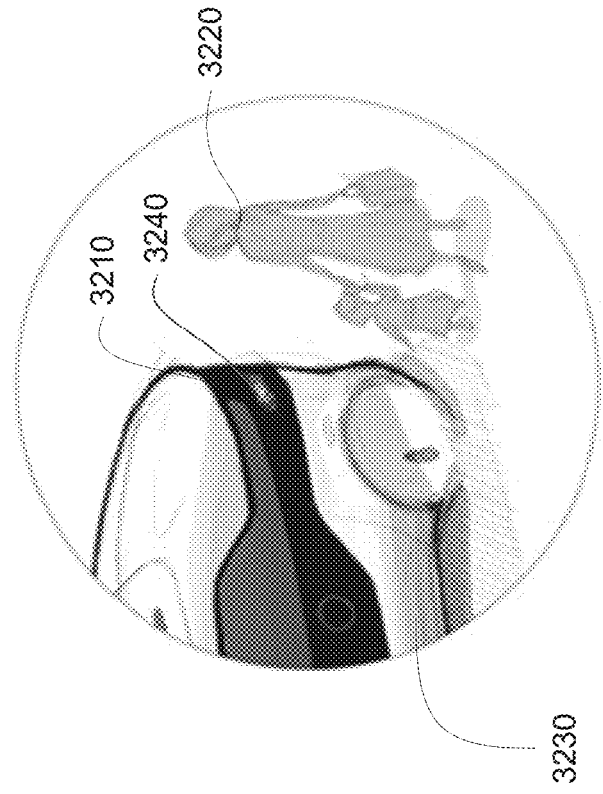
FIGS. 32A and 32B are example external views of a vehicle in accordance with aspects of the disclosure.
Figure 32A:
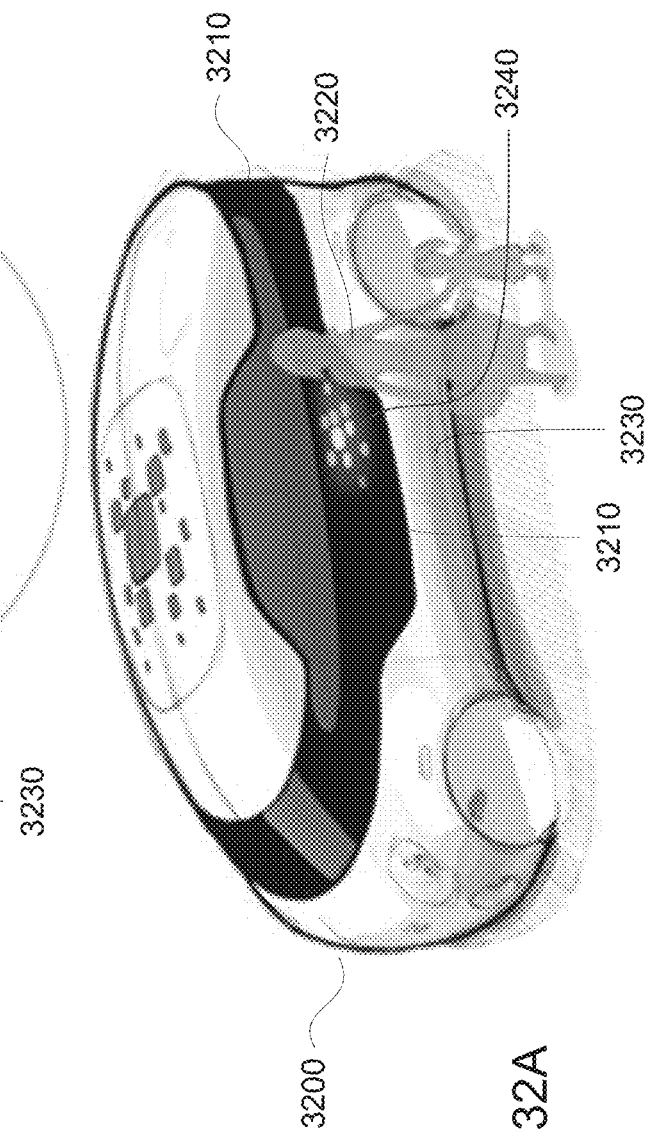

FIGS. 32A and 32B are example external views of a vehicle 3200 that may be configured similarly to vehicle 100. In this example, vehicle 3200 includes a display 3210 integrated into one or more of the door panels and/or windows of the vehicle. The display 3210 may be an electronic display, projection screen, or other type of display. The display 3210 may be used to communicate information about the vehicle (i.e. model number or name) or the state of the vehicle (as discussed further below) to an object, such as a person 3220, external to the vehicle by displaying information provided by the computing devices 110. In this example, the display may actually wrap around a portion of the vehicle as shown in FIG. 32A and cover multiple vehicle panels including a plurality of adjacent panels as shown in the example of display 3210 which wrap around the sides and rear end of the vehicle and the example of display 3310a and 3310b of FIGS. 33A and 33B on adjacent door panels of the vehicle.

The person 3320 may be detected in the vehicle's environment using information received by the computing devices 110 from the perception system 172. If the vehicle is otherwise unoccupied or not fully occupied (seats are available as discussed below), the person may be identified as a potential passenger to use the vehicle. Alternatively, the person 3320 may be identified as a potential passenger based on information provided to the computing devices 110 (directly or indirectly) from a client computing device, such as client computing devices 120, of the person indicating that the vehicle has been assigned to the person and information (such as GPS coordinates or a BLUETOOTH®, near field communication, or other wireless connection between the computing devices 110 and the client computing device) that the person is in the vicinity of the vehicle.

The examples of FIGS. 32A and 32B demonstrate how the display 3210 can be used to guide person 3220, identified as a potential passenger, around the vehicle and towards door 3230 by moving an image 3240 (or displaying an animation) across the display (and across one or more panels of the vehicle) and towards the door 3230. In addition or alternatively, the display may be used to provide advertising or other information to objects external to the vehicle as provided by the computing devices 110. The door and/or display may also include one or more user input surfaces, such as a light, heat or touch-sensitive input surface that can allow the person 3220 to open the door. For instance, the person 3220 may swipe a hand along input surface in order to open the door 3230. The input surface may provide a signal to the computing devices 110 to indicate that the input surface has been contacted. In response, the computing devices 110 may open the door (an in some cases also unlock the door prior to opening). This may thus eliminate the need for external door handles for opening the door.

Figure 33A:
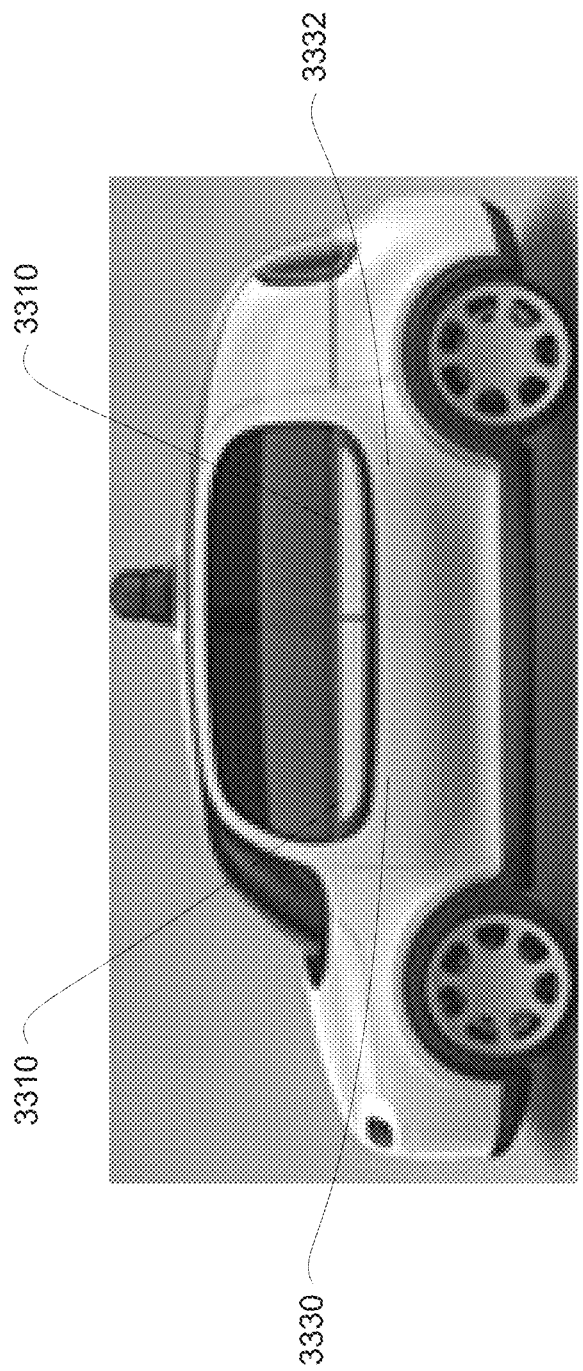
FIG. 33A is an example external view of a vehicle in accordance with aspects of the disclosure.

FIG. 33A is an example view of an exterior of a vehicle 3300 that may be configured similarly to vehicle 100. In this example, vehicle includes a display 3310a and 3310b (collectively 3310) integrated into one or more of the door panels and/or windows of the vehicle. The display may be an electronic display, projection screen, or other type of display. The display 3310 may be used to communicate information to an object, such as a person (not shown), external to the vehicle by displaying information provided by the computing devices 110. In this example, the display may be confined to the doors 3330, 3332 of the vehicle. Again, the door and/or display may also include one or more user input surfaces, such as a light, heat or touch-sensitive input surface that can allow the person to open the door. The input surface may provide a signal to the computing devices 110 to indicate that the input surface has been contacted. In response, the computing devices 110 may open the door (an in some cases also unlock the door prior to opening). For instance, the person may swipe a hand along input surface in order to open the door 3330 or 3332. This may thus eliminate the need for external door handles for opening the door.

Figure 33B:
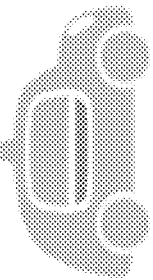
FIG. 33B is a table of example display configurations in accordance with aspects of the disclosure.

FIG. 33A depicts the display 3310 as a solid light bar, however the display may change according to the state of the vehicle or use of the display. In this regard, FIG. 33B is an example table 3340 depicting various example display configurations according to the status of the vehicle. For instance, when the vehicle is driving itself or otherwise in use, the display 3310 may be displayed as the solid light bar as shown in Row A of the table.

As shown in Row B of the table, when the vehicle is arriving at a location, such as a pickup location or a destination location, the display may display an image indicating whether and how many of the vehicle's seats are occupied and/or available for passengers. As an example, data 134 may store information regarding the number of seats in the vehicle. In some instances, the number of seats may be changed, for instance by adding, removing or stowing seats. Accordingly, the computing devices 110 may track a value corresponding to the number of seats in the vehicle. When the seats are occupied, feedback from seat sensors, such as force sensitive strips, switches, internal video or cameras, which can detect whether a person is currently occupying the seats, may be used by the computing devices 110 to determine the total number of occupied and/or available seats within the vehicle. This information may then be displayed on the display 3310 in order to allow potential passengers to determine the number of available seats within the vehicle. For instance, the display may indicate that there are 2 available seats by depicting 2 dully lit circles to represent occupied seats and 3 brightly lit circles to represent available seats. Of course, the reverse may also be true: the display may indicate that there are 3 available seats by depicting 2 dully lit circles to represent available seats and 3 brightly lit circles to represent occupied seats. This information may then be updated by computing devices 110 as the occupation or availability and/or number of seats within the vehicle changes.

Figure 33C:
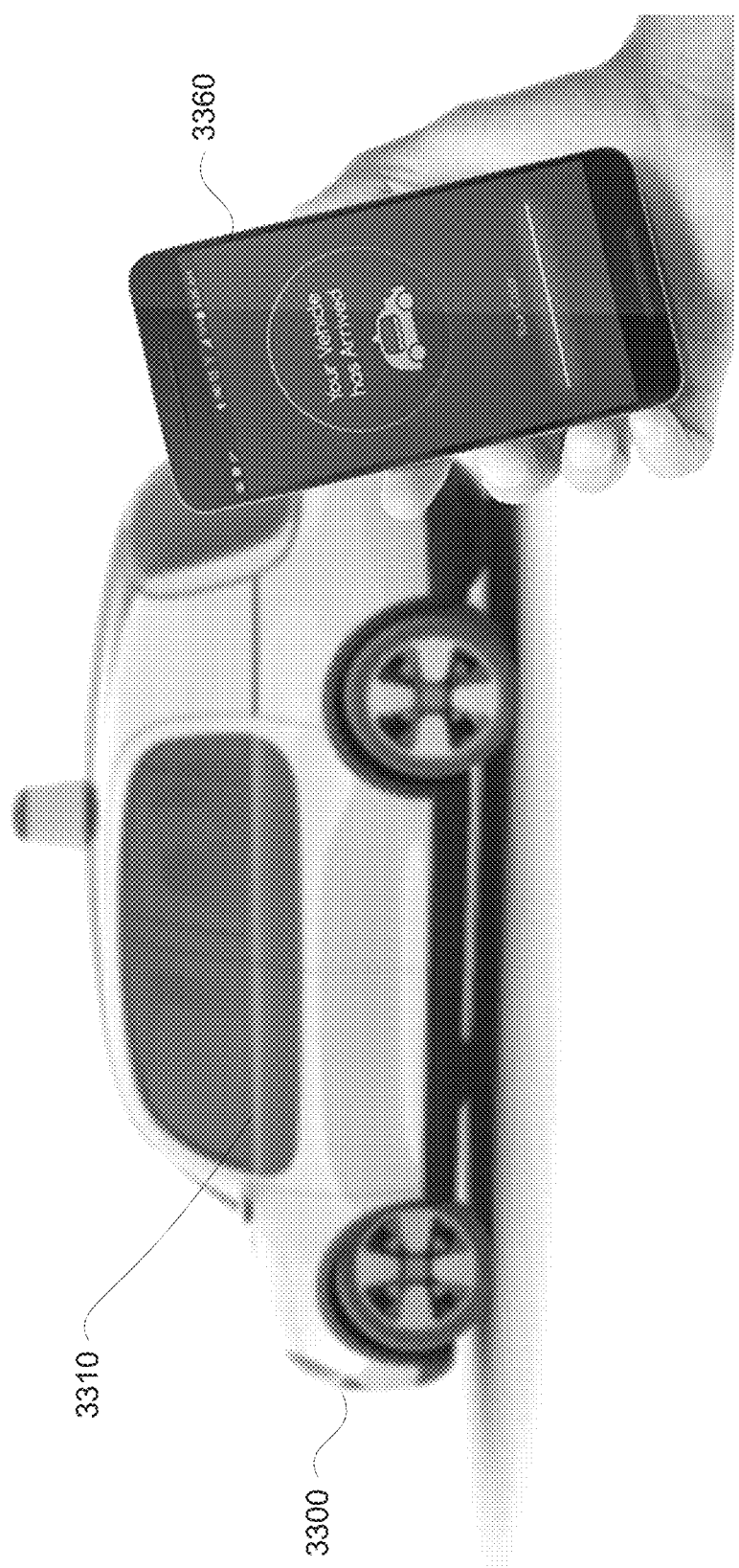
FIG. 33C is an example view of a vehicle and client computing device in accordance with aspects of the disclosure.

As shown in Row C of the table, when the vehicle has arrived at a location, such as a pickup location or a destination location, the display 3310 may display an image welcoming a passenger and/or providing identifying information (such as numerical identifier 37) to identify the vehicle to the passenger. FIG. 33C provides another example of this identification, where the display 3310 is lit up in a particular color that corresponds to a color displayed at a display 3350 at a passenger's client computing device 3360 (which may correspond to client device 220, for instance). Thus, for the example of Row C in FIG. 33B, the passenger's client computing device may display the number "37" to indicate to the passenger the vehicle for which the passenger should be looking.

Again, referring to FIG. 33B, as shown in Row D of the table, when the vehicle idling, parked, for instance waiting for a passenger, or otherwise not in active operation or not in use, the display may display an image indicating to the passenger how to open the vehicle's door.

Figure 34:
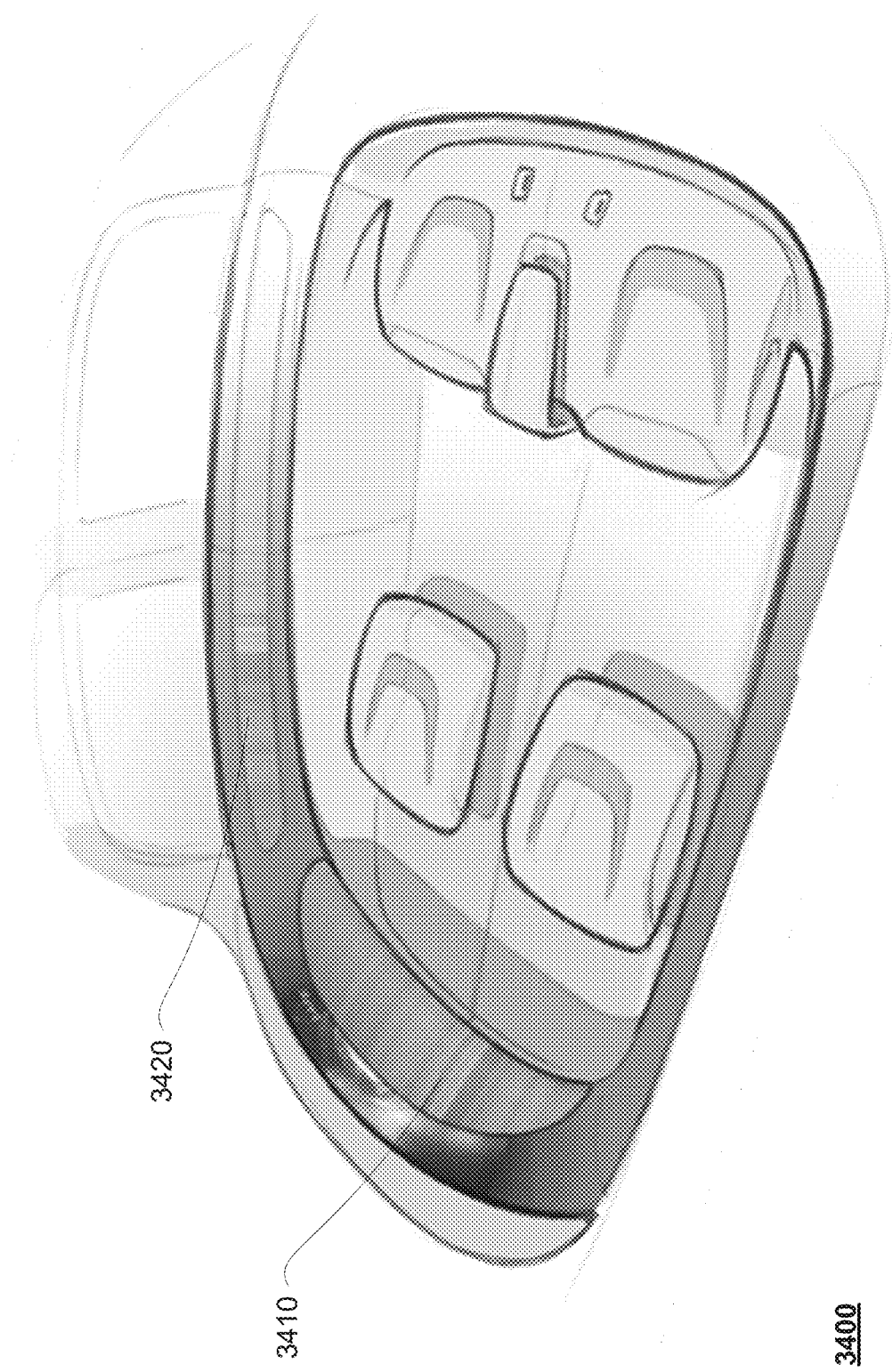
FIG. 34 is an example view of an interior of a vehicle in accordance with aspects of the disclosure.

FIG. 34 is an example view of an interior of a vehicle 3400 that may be configured similarly to vehicle 100. In this example, several of the surfaces of the interior of the vehicle, for instance the dashboard 3410 and door trim 3420 may be covered in a conductive fabric. The conductive fabric may be used to allow one or more user inputs in order to control various aspects of the vehicle, such as the locking and unlocking of doors, raising and lowering of windows, media controls (volume, channel, color, etc.), etc. The fabric may also include icons printed on the fabric in order to indicate to the passenger the location of the inputs for controlling the various aspects.

FIG. 35 is an example interior view of a vehicle 3500 that may be configured similarly to vehicle 100. In this example, one or both of the seats 3510, 3520 of the front row of vehicle 3500 may include a movable seat back 3512, 3522. As can be seen, seat back 3512 is in a folded down position allowing a passenger to store items, such as items 3530, on the seat back 3512 when the seat 3510 is otherwise not needed for a passenger. Seat back supports 3514, 3524 may provide additional support and security for such items. Seat back 3522 is in the upright position, allowing the seat 3520 to be used for passenger seating. As can be seen, when in a seat back is in the folded position, this provides additional surface area for storing items than then the seat back is in the upright position. Thus, by folding the seat backs 3512, 3522 into the folded down position, the seats 3510, 3520 can be used for more safe and efficient storage of items, and by moving the seat backs into the upright position, the seats 3510, 3520 can be used for passenger seating.

FIGS. 36A-36C are example external views of a vehicle 3600 that may be configured similarly to vehicle 100. The headlights 3610, 3612 of vehicle 3600 may be rotatable or may simply include a rotatable cover that can be used to change the appearance of the headlights. Here, each of the headlights 3610 and 3612 (or the covers) includes a striped section 3614, 3616 which may not be illuminated (or may not be illuminated with the same brightness as other portions of the headlights 3610, 3612), and which can be used to indicate an orientation of the headlights. In this regard, the headlights (or covers) may be rotated, for instance using a belt drive or electric motor, into different orientations in order to indicate a status of the vehicle. For instance, each of the orientations of FIG. 36A-36C may indicate a different status of the vehicle: FIG. 36A may represent a typical orientation which indicates that the vehicle is moving autonomously, FIG. 36B may represent orientation which indicates that the vehicle is currently charging, and FIG. 36C may represent an orientation which indicates that the vehicle is currently "sleeping", idling, parked, for instance waiting for a passenger, or otherwise not in active operation or not in use. Of course, the current status of the vehicle may be determined by the computing devices 110, for instance, based upon how the computing devices are currently operating the vehicle and or feedback from various systems of the vehicle. Depending upon the status of the vehicle, the computing devices 110 may thus change the orientation of the headlights (or headlight covers) into different orientations in order to express the current state of the vehicle. In such examples, the headlights and/or covers may be selected such that changing the orientation of the headlights or headlight covers does not reduce or degrade the functionality of the headlights to unacceptable levels for safe and lawful operation. In this regard, as well as being rotated, the headlights may also be tilted or otherwise manipulated in order to maintain sufficient lighting of the vehicle's surroundings for safety. Of course various other configurations and statuses may also be represented by these and other orientations of the headlights.

FIGS. 37A and 37B are example views of an interior of a vehicle 3700 that may be configured similarly to vehicle 100. In this example, the dashboard 3710 includes a display 3720 including a display surface 3722 for providing information and/or other media to a passenger of the vehicle. The display 3720 may be an electronic display, projection screen, or other type of display. The display may be attached to a lifting device or motor located below the dashboard 3710 that can move the display up and down relative to the dashboard. The display 3720 may have multiple display positions each with a different display purpose. For instance, when positioned as shown in FIG. 37A, the display 3720 may be configured for multi-media use, for instance for gaming, watching videos, etc. When positioned as shown in FIG. 37B, the display may be configured for informational use, such as providing information about the status of the vehicle (as opposed to the multi-media use). In this regard, when being used for informational purposes, the amount of the windshield view that is blocked by the display is minimized as opposed to when being used for multi-media purposes, the amount of the windshield view that is blocked by the display can be significantly larger.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A vehicle comprising:
a first display arranged at a first door of a vehicle, the first display being configured to provide information to a person in an external environment of the vehicle;
a second display that is arranged on the vehicle but that is not arranged at the first door of the vehicle, the second display being configured to provide information to the person in the external environment; and
one or more processors configured to:
identify a potential passenger in the environment of the vehicle from sensor information captured in the external environment; and
use both the first display and the second display to display an animation to the potential passenger in order to guide the potential passenger towards the first door so that the potential passenger is able to locate the first door and gain entry to the vehicle, wherein the animation is displayed first on one of the first display and the second display and subsequently on the other one of the first display and the second display.

2. The vehicle of claim 1, wherein at least the first display or the second display includes a touch sensitive input and the first door does not include a door handle, and wherein the one or more processors are further configured to:
receive, from the touch sensitive input, information indicating that an area of at least the first display or the second display has been contacted; and
in response to the received information, unlocking the first door.

3. The vehicle of claim 1, wherein the animation is displayed first on the second display and subsequently on the first display.

4. The vehicle of claim 1, wherein the first display is adjacent to the second display.

5. The vehicle of claim 1, wherein the one or more processors are further configured to:
- determine a number of seats within the vehicle;
- determine a number of occupied seats within the vehicle; and
- display, on one or both of the first display and the second display, information identifying a number of available seats within the vehicle based on the number of seats and the number of occupied seats.

6. The vehicle of claim 5, wherein the one or more processors are further configured to:
- determine an updated number of occupied seats within the vehicle based on a change in a number of passengers within the vehicle; and
- display, on one or both of the first display and the second display, updated information identifying an updated number of available seats within the vehicle based on the number of seats and the updated number of occupied seats.

7. The vehicle of claim 5, wherein the one or more processors are further configured to display the information identifying the number of available seats as the vehicle approaches a pickup or drop off location for one or more passengers.

8. The vehicle of claim 5, wherein displaying the information identifying the number of available seats includes displaying a representative object for each seat of the number of seats and highlighting one or more of the representative objects according to the number of occupied seats.

9. The vehicle of claim 8, wherein the one or more processors are further configured to display the information identifying the number of occupied seats.

10. The vehicle of claim 1, wherein the one or more processors are further configured to display, on one or both of the first display and the second display, instructions for opening the first door.

11. The vehicle of claim 1, wherein the second display is arranged at a second door of the vehicle.

12. The vehicle of claim 11, wherein the second door of the vehicle is adjacent to the first door.

13. The vehicle of claim 1, further comprising a pop up sensor box configured to extend above and retract into a roof panel of the vehicle, the pop up sensor box housing one or more sensors configured to provide the sensor information.

14. A method of operating a vehicle, comprising:
- identifying, by one or more processors, a person in an external environment of the vehicle from sensor information captured in the external environment;
- identifying, by the one or more processors, the person as a potential passenger of the vehicle;
- determining, by the one or more processors, a first door of the vehicle through which the potential passenger will be permitted to enter the vehicle;
- guiding the potential passenger around the vehicle to the first door using an animation, wherein the animation is displayed using both a first display arranged at the first door of the vehicle, and a second display that is arranged on the vehicle but that is not arranged at the first door of the vehicle.

15. The method of claim 14, wherein the animation is displayed first on the second display and subsequently on the first display.

16. The method of claim 14, wherein the animation involves moving an image from the second display to the first display.

17. The method of claim 14, further comprising:
- receiving, by the one or more processors, information indicating that an area of at least the first display or the second display has been contacted; and
- in response to the received information, unlocking the first door.

18. The method of claim 14, further comprising:
- determining, by the one or more processors, a number of seats within the vehicle;
- determining, by the one or more processors, a number of occupied seats within the vehicle; and
- displaying, on one or both of the first display and the second display, information identifying a number of available seats within the vehicle based on the number of seats and the number of occupied seats.

19. The method of claim 18, further comprising:
- determining, by the one or more processors, an updated number of occupied seats within the vehicle based on a change in a number of passengers within the vehicle; and
- displaying, on one or both of the first display and the second display, updated information identifying an updated number of available seats within the vehicle based on the number of seats and the updated number of occupied seats.

* * * * *